US012354697B2

(12) United States Patent
Masuda et al.

(10) Patent No.: US 12,354,697 B2
(45) Date of Patent: Jul. 8, 2025

(54) SEMICONDUCTOR MEMORY DEVICE

(71) Applicant: Kioxia Corporation, Tokyo (JP)

(72) Inventors: Takafumi Masuda, Kawasaki Kanagawa (JP); Mutsumi Okajima, Yokkaichi Mie (JP); Nobuyoshi Saito, Tokyo (JP); Keiji Ikeda, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 314 days.

(21) Appl. No.: 18/184,792

(22) Filed: Mar. 16, 2023

(65) Prior Publication Data

US 2024/0038280 A1 Feb. 1, 2024

(30) Foreign Application Priority Data

Jul. 28, 2022 (JP) .................. 2022-120669

(51) Int. Cl.
*G11C 11/00* (2006.01)
*G11C 5/10* (2006.01)
*G11C 11/4096* (2006.01)
*G11C 11/4097* (2006.01)

(52) U.S. Cl.
CPC ............ *G11C 5/10* (2013.01); *G11C 11/4096* (2013.01); *G11C 11/4097* (2013.01)

(58) Field of Classification Search
CPC .... G11C 5/10; G11C 11/4096; G11C 11/4097
See application file for complete search history.

(56) References Cited

U.S. PATENT DOCUMENTS

| 6,759,702 | B2 | 7/2004 | Radens et al. |
| 8,946,610 | B2* | 2/2015 | Iwabuchi ............... H01L 25/18 |
| | | | 257/443 |
| 9,514,792 | B2 | 12/2016 | Kajigaya |
| 10,707,210 | B2 | 7/2020 | Fishburn |
| 10,784,312 | B1* | 9/2020 | Kabuyanagi ......... G11C 13/003 |
| 2020/0211631 | A1 | 7/2020 | Karda et al. |
| 2020/0227416 | A1 | 7/2020 | Lilak et al. |
| 2020/0227418 | A1 | 7/2020 | Kim et al. |
| 2020/0251151 | A1 | 8/2020 | Kang et al. |

(Continued)

FOREIGN PATENT DOCUMENTS

| JP | 2017-120833 A | 7/2017 |
| JP | 2022-147872 A | 10/2022 |

*Primary Examiner* — Pho M Luu
(74) *Attorney, Agent, or Firm* — Foley & Lardner LLP

(57) ABSTRACT

A semiconductor memory device comprises: memory layers arranged in a first direction; and a first wiring extending in the first direction. The memory layers each comprise: a memory portion; a transistor; and a second wiring. The transistor comprises: a semiconductor layer electrically connected between the memory portion and the first wiring; a gate electrode facing the semiconductor layer and electrically connected to the second wiring; and a gate insulating film provided between the semiconductor layer and the gate electrode. The semiconductor layer faces surfaces of the gate electrode on one side and the other side in the first direction. In a cross section perpendicular to the first direction and including a part of the transistor corresponding to one of the memory layers, the first wiring comprises: a first surface in contact with the transistor; and a second surface not in contact with the transistor.

27 Claims, 85 Drawing Sheets

(56) References Cited

U.S. PATENT DOCUMENTS

| | | |
|---|---|---|
| 2020/0303418 A1 | 9/2020 | Sakuma et al. |
| 2020/0343246 A1 | 10/2020 | Wang et al. |
| 2022/0310612 A1 | 9/2022 | Okajima |
| 2024/0268125 A1* | 8/2024 | Wei .................. H10B 61/22 |

* cited by examiner

SEMICONDUCTOR MEMORY DEVICE

CROSS-REFERENCE TO RELATED APPLICATIONS

This application is based upon and claims the benefit of Japanese Patent Application No. 2022-120669, filed on Jul. 28, 2022, the entire contents of which are incorporated herein by reference.

BACKGROUND

Field

Embodiments relate to a semiconductor memory device.

Description of the Related Art

As degree-of-integration of semiconductor memory devices continues to rise, study is underway into how three-dimensionality of the semiconductor memory devices may be further promoted.

DETAILED DESCRIPTION

Figure 1:
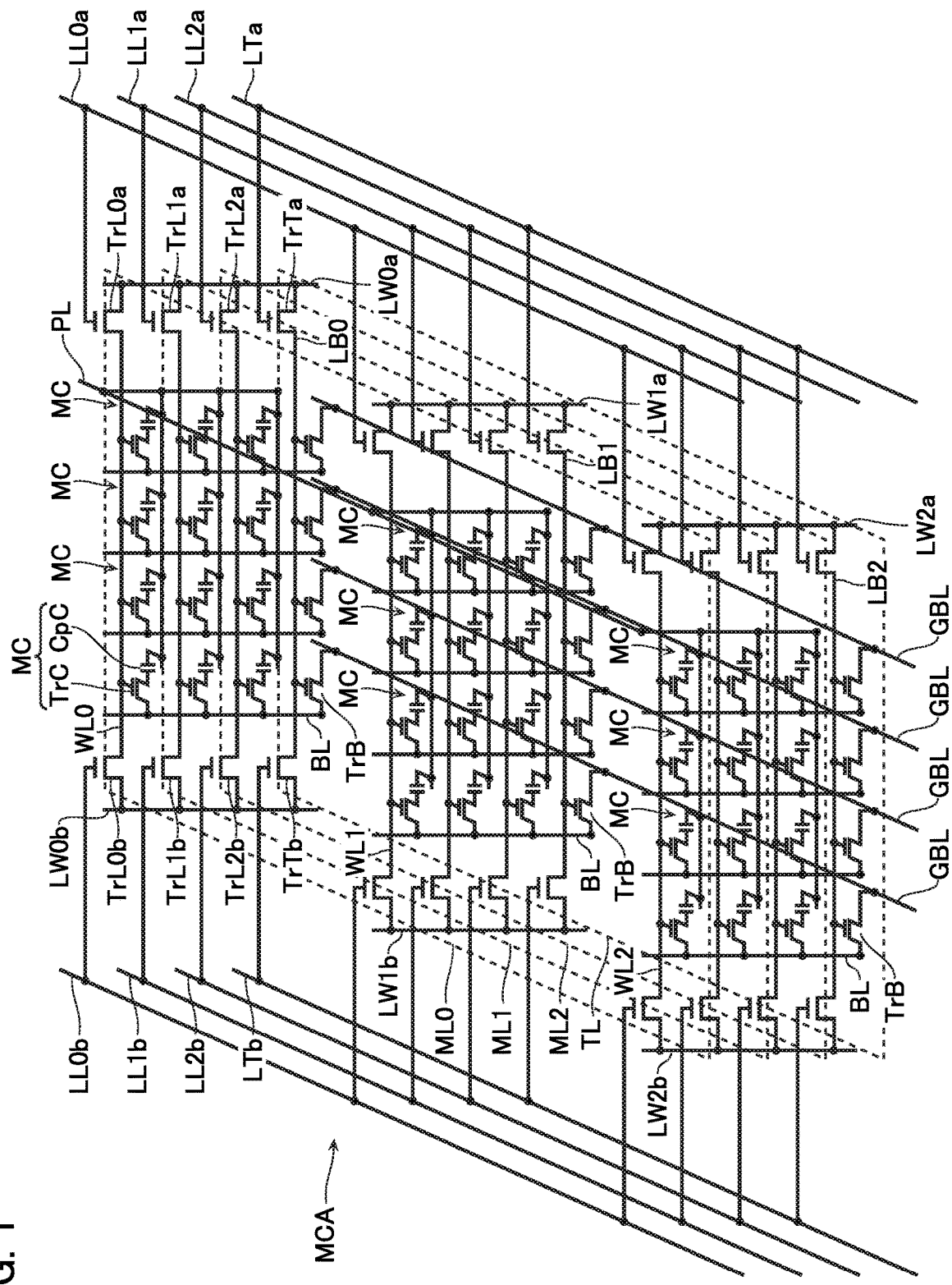
FIG. 1 is a schematic circuit diagram showing some of configurations of a semiconductor memory device according to a first embodiment.

A semiconductor memory device according to an embodiment comprises: a substrate; a plurality of memory layers arranged in a first direction, the first direction intersecting a surface of the substrate; and a first wiring extending in the first direction. The plurality of memory layers each comprise: a memory portion; a first transistor which is electrically connected to the memory portion and the first wiring; and a second wiring which extends in a second direction intersecting the first direction, and is electrically connected to the first transistor. The first transistor comprises: a first semiconductor layer which is electrically connected between the memory portion and the first wiring; a first gate electrode which faces the first semiconductor layer and is electrically connected to the second wiring; and a first gate insulating film which is provided between the first semiconductor layer and the first gate electrode. The first semiconductor layer faces surfaces of the first gate electrode on one side and the other side in the first direction. In a cross section which is perpendicular to the first direction and which includes a part of the first transistor corresponding to one of the plurality of memory layers, the first wiring comprises: a first surface which is in contact with the first transistor; and a second surface which is not in contact with the first transistor.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, some of configurations, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even if the second transistor is in an OFF state.

In this specification, when referring to that the first configuration "is connected between" the second configuration and a third configuration, it may mean that the first configuration, the second configuration, and the third configuration are connected in series and the second configuration is connected to the third configuration via the first configuration.

Moreover, in the present specification, a certain direction parallel to an upper surface of a substrate will be called an X direction, a direction parallel to the upper surface of the substrate and perpendicular to the X direction will be called a Y direction, and a direction perpendicular to the upper surface of the substrate will be called a Z direction.

Moreover, in the present specification, sometimes, a direction lying along a certain plane will be called a first direction, a direction intersecting the first direction along this certain plane will be called a second direction, and a direction intersecting this certain plane will be called a third direction. These first direction, second direction, and third direction may correspond to any of the X direction, the Y direction, and the Z direction, but need not do so.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X direction or the Y direction will be called a side surface, and so on.

First Embodiment

[Circuit Configuration]

FIG. 1 is a schematic circuit diagram showing some of configurations of a semiconductor memory device according to a first embodiment. As shown in FIG. 1, the semiconductor memory device according to the present embodiment comprises a memory cell array MCA. The memory cell array MCA comprises: a plurality of memory layers ML0-ML2; a transistor layer TL; a plurality of bit lines BL connected to these plurality of memory layers ML0-ML2 and transistor layer TL; a plurality of global bit lines GBL electrically connected to the plurality of bit lines BL via the transistor layer TL; and a plate line PL connected to the plurality of memory layers ML0-ML2.

The memory layers ML0-ML2 each comprise: a plurality of word lines WL0-WL2; and pluralities of memory cells MC connected to these plurality of word lines WL0-WL2. The memory cells MC each comprise a transistor TrC and a capacitor CpC. A source electrode of the transistor TrC is connected to the bit line BL. A drain electrode of the transistor TrC is connected to the capacitor CpC. A gate electrode of the transistor TrC is connected to one of the word lines WL0-WL2. One electrode of the capacitor CpC is connected to the drain electrode of the transistor TrC. The other electrode of the capacitor CpC is connected to the plate line PL.

Note that each bit line BL is connected to a plurality of the memory cells MC corresponding to the plurality of memory layers ML0-ML2.

In addition, the memory layers ML0-ML2 respectively comprise pluralities of transistors TrL0a, TrL0b, TrL1a, TrL1b, TrL2a, TrL2b (hereafter, sometimes called "transistors TrL") provided correspondingly to the plurality of word lines WL0-WL2. Drain electrodes of the transistors TrL are each connected to one of the word lines WL0-WL2. Source electrodes of the transistors TrL are respectively connected to word line selection lines LW0a, LW0b, LW1a, LW1b, LW2a, LW2b (hereafter, sometimes called "word line selection lines LW"). Gate electrodes of the transistors TrL are respectively connected to layer selection lines LL0a, LL0b, LL1a, LL1b, LL2a, LL2b (hereafter, sometimes called "layer selection lines LL").

Note that the word line selection lines LW are connected to a plurality of the transistors TrL corresponding to the plurality of memory layers ML0-ML2. Moreover, the layer selection lines LL0a, LL1a, LL2a are respectively commonly connected to all of the transistors TrL0a, TrL1a, TrL2a corresponding to the memory layers ML0-ML2. Similarly, the layer selection lines LL0b, LL1b, LL2b are respectively commonly connected to all of the transistors TrL0b, TrL1b, TrL2b corresponding to the memory layers ML0-ML2.

The transistor layer TL comprises: a plurality of bit line selection lines LB0-LB2; and pluralities of transistors TrB connected to the plurality of bit line selection lines LB0-LB2. A source electrode of the transistor TrB is connected to the global bit line GBL. A drain electrode of the transistor TrB is connected to the bit line BL. A gate electrode of the transistor TrB is connected to one of the bit line selection lines LB0-LB2.

In addition, the transistor layer TL comprises pluralities of transistors TrTa, TrTb (hereafter, sometimes called "transistors TrT") respectively provided correspondingly to the plurality of bit line selection lines LB0-LB2. Drain electrodes of the transistors TrT are each connected to one of the bit line selection lines LB0-LB2. Source electrodes of the transistors TrT are respectively connected to the word line selection lines LW. Gate electrodes of the transistors TrT are respectively connected to wirings LTa, LTb (hereafter, sometimes called "wirings LT").

Note that the wiring LTa is commonly connected to all of the transistors TrTa. Similarly, the wiring LTb is commonly connected to all of the transistors TrTb.

Figure 2:
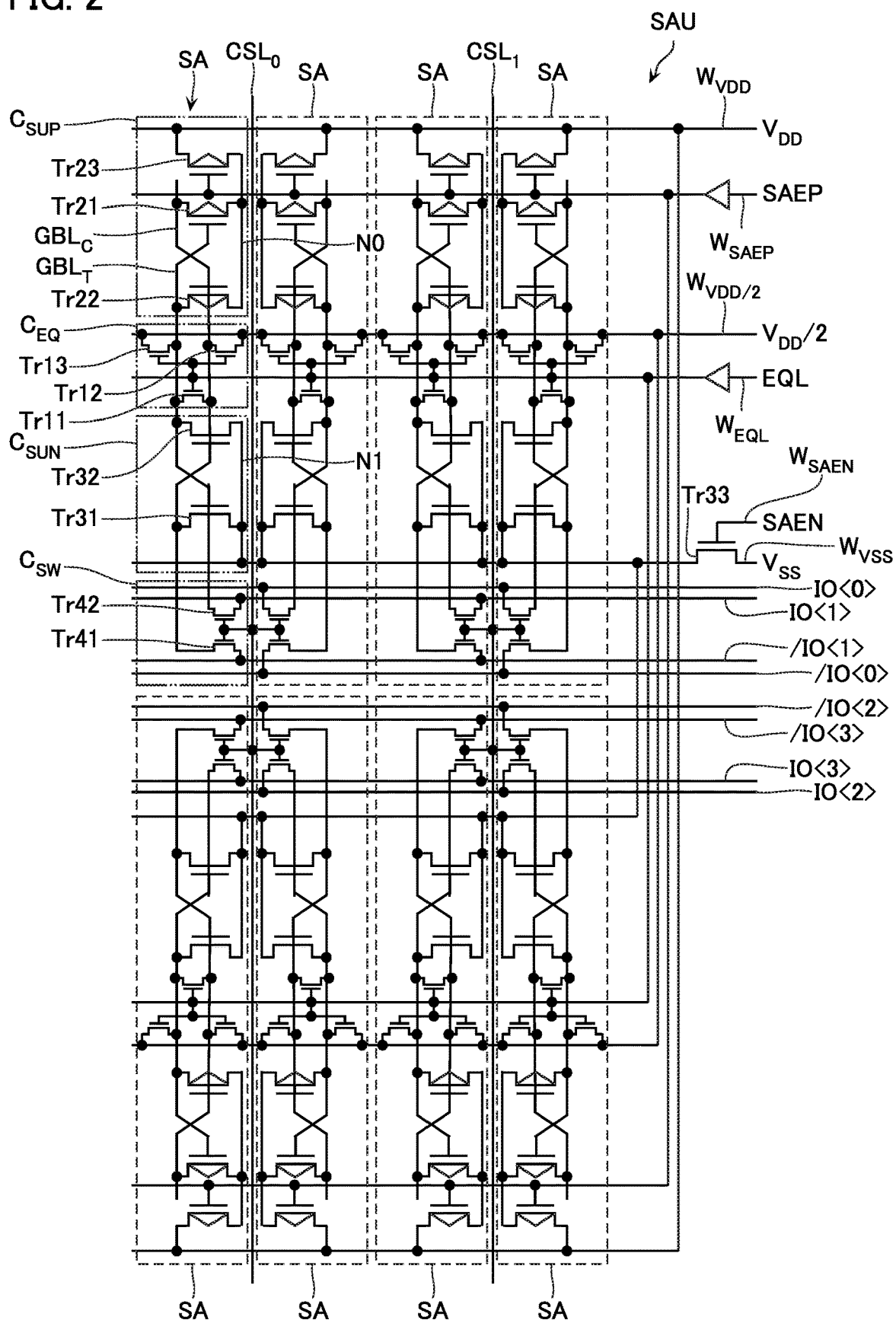
FIG. 2 is a schematic circuit diagram showing some of configurations of same semiconductor memory device.

FIG. 2 is a schematic circuit diagram showing some of configurations of the semiconductor memory device according to the first embodiment. As shown in FIG. 2, the semiconductor memory device according to the present embodiment comprises a sense amplifier unit SAU.

In FIG. 2, the above-mentioned plurality of global bit lines GBL are illustrated as global bit lines $GBL_C$, $GBL_T$.

Moreover, in FIG. 2, there are illustrated: a voltage supply line $W_{VDD}$ supplying a voltage $V_{DD}$; a voltage supply line $W_{VDD}/2$ supplying a voltage $V_{DD}/2$ of half the magnitude of the voltage $V_{DD}$; and a voltage supply line $W_{VSS}$ supplying a ground voltage $V_{SS}$. These voltage supply lines $W_{VDD}$, $W_{VDD}/2$, $W_{VSS}$ are commonly connected to all of sense amplifiers SA included in the sense amplifier unit SAU.

Moreover, in FIG. 2, there are illustrated: signal supply lines $W_{SAEP}$, $W_{SAEN}$ supplying enable signals SAEP, SAEN of the sense amplifier SA; and a signal supply line $W_{EQL}$ supplying an equalize signal EQL of the sense amplifier SA. These signal supply lines $W_{SAEP}$, $W_{SAEN}$, $W_{EQL}$ are commonly connected to all of the sense amplifiers SA included in the sense amplifier unit SAU.

Moreover, in FIG. 2, there are illustrated a plurality of column selection lines CSL (CSL$_0$, CSL$_1$). Although illustration of the following is omitted, the sense amplifier unit SAU according to the present embodiment comprises a plurality of the sense amplifiers SA arranged in the X direction and the Y direction on a substrate surface. For example, the 2n+1$^{th}$ (where n is an integer of 0 or more) plurality of sense amplifiers SA counting from a negative side in the X direction and 2n+2$^{th}$ plurality of sense amplifiers SA counting from a negative side in the X direction, are assumed to be one group. In such a case, the sense amplifier unit SAU comprises a plurality of such groups. The plurality of column selection lines CSL are provided correspondingly to such a plurality of groups. These plurality of column selection lines CSL are each commonly connected to the plurality of sense amplifiers SA included in their corresponding group.

Moreover, in FIG. 2, there are illustrated a plurality of data input/output signal lines IO, /IO (IO<0>-IO<3>, /IO<0>-/IO<3>). The plurality of data input/output signal lines IO, /IO are each commonly connected to all of the groups arranged in the X direction.

The sense amplifier unit SAU comprises: an equalizer circuit C$_{EQ}$ that equalizes voltages of the global bit lines GBL$_C$, GBL$_T$ during standby; amplifier circuits C$_{SUP}$, C$_{SUN}$ that differentially amplify signals of the global bit lines GBL$_C$, GBL$_T$ in a read operation, or the like; and a switch circuit C$_{SW}$ by which the global bit lines GBL$_C$, GBL$_T$ are made electrically continuous with the data input/output signal lines IO, /IO in a read operation, or the like.

In the case where voltage of the signal supply line W$_{EQL}$ is "H", the equalizer circuit C$_{EQ}$ equalizes voltages of the global bit lines GBL$_C$, GBL$_T$. That is, it makes the global bit lines GBL$_C$, GBL$_T$ electrically continuous with each other. Moreover, it makes the global bit lines GBL$_C$, GBL$_T$ electrically continuous with the voltage supply line W$_{VDD/2}$.

Moreover, in the case where voltage of the signal supply line W$_{EQL}$ is "L", the equalizer circuit C$_{EQ}$ releases equalization of voltages of the global bit lines GBL$_C$, GBL$_T$. That is, it electrically isolates the global bit lines GBL$_C$, GBL$_T$ from each other. Moreover, it electrically isolates the global bit lines GBL$_C$, GBL$_T$ from the voltage supply line W$_{VDD/2}$.

The equalizer circuit C$_{EQ}$ comprises: a transistor Tr11 provided between the global bit lines GBL$_C$, GBL$_T$; a transistor Tr12 provided between the global bit line GBL$_C$ and the voltage supply line W$_{VDD/2}$; and a transistor Tr13 provided between the global bit line GBL$_T$ and the voltage supply line W$_{VDD/2}$. The transistors Tr11, Tr12, Tr13 are NMOS type field effect transistors, for example. Gate electrodes of the transistors Tr11, Tr12, Tr13 are connected to the signal supply line W$_{EQL}$.

In the case where voltage of the signal supply line W$_{SAEP}$ is "L" and voltage of the signal supply line W$_{SAEN}$ is "H", the amplifier circuits C$_{SUP}$, C$_{SUN}$ Differentially Amplify signals of the global bit lines GBL$_C$, GBL$_T$.

The amplifier circuit C$_{SUP}$ comprises: a transistor Tr21 provided between the global bit line GBL$_C$ and a node N0; a transistor Tr22 provided between the global bit line GBL$_T$ and the node N0; and a transistor Tr23 provided between the node N0 and the voltage supply line W$_{VDD}$. The transistors Tr21, Tr22, Tr23 are PMOS type field effect transistors, for example. A gate electrode of the transistor Tr21 is connected to the global bit line GBL$_T$. A gate electrode of the transistor Tr22 is connected to the global bit line GBL$_C$. A gate electrode of the transistor Tr23 is connected to the signal supply line W$_{SAEP}$.

The amplifier circuit C$_{SUN}$ comprises: a transistor Tr31 provided between the global bit line GBL$_C$ and a node N1; and a transistor Tr32 provided between the global bit line GBL$_T$ and the node N1. The node N1 is electrically connected to the voltage supply line W$_{VSS}$ via a transistor Tr33. The transistors Tr31, Tr32, Tr33 are NMOS type field effect transistors, for example. A gate electrode of the transistor Tr31 is connected to the global bit line GBL$_T$. A gate electrode of the transistor Tr32 is connected to the global bit line GBL$_C$. A gate electrode of the transistor Tr33 is connected to the signal supply line W$_{SAEN}$.

The switch circuit C$_{SW}$ comprises: a transistor Tr41 provided between the global bit line GBL$_C$ and the data input/output signal line /IO; and a transistor Tr42 provided between the global bit line GBL$_T$ and the data input/output signal line IO. The transistors Tr41, Tr42 are NMOS type field effect transistors, for example. Gate electrodes of the transistor Tr41, Tr42 are connected to the plurality of column selection lines CSL.

[Read Operation]

Figure 3:
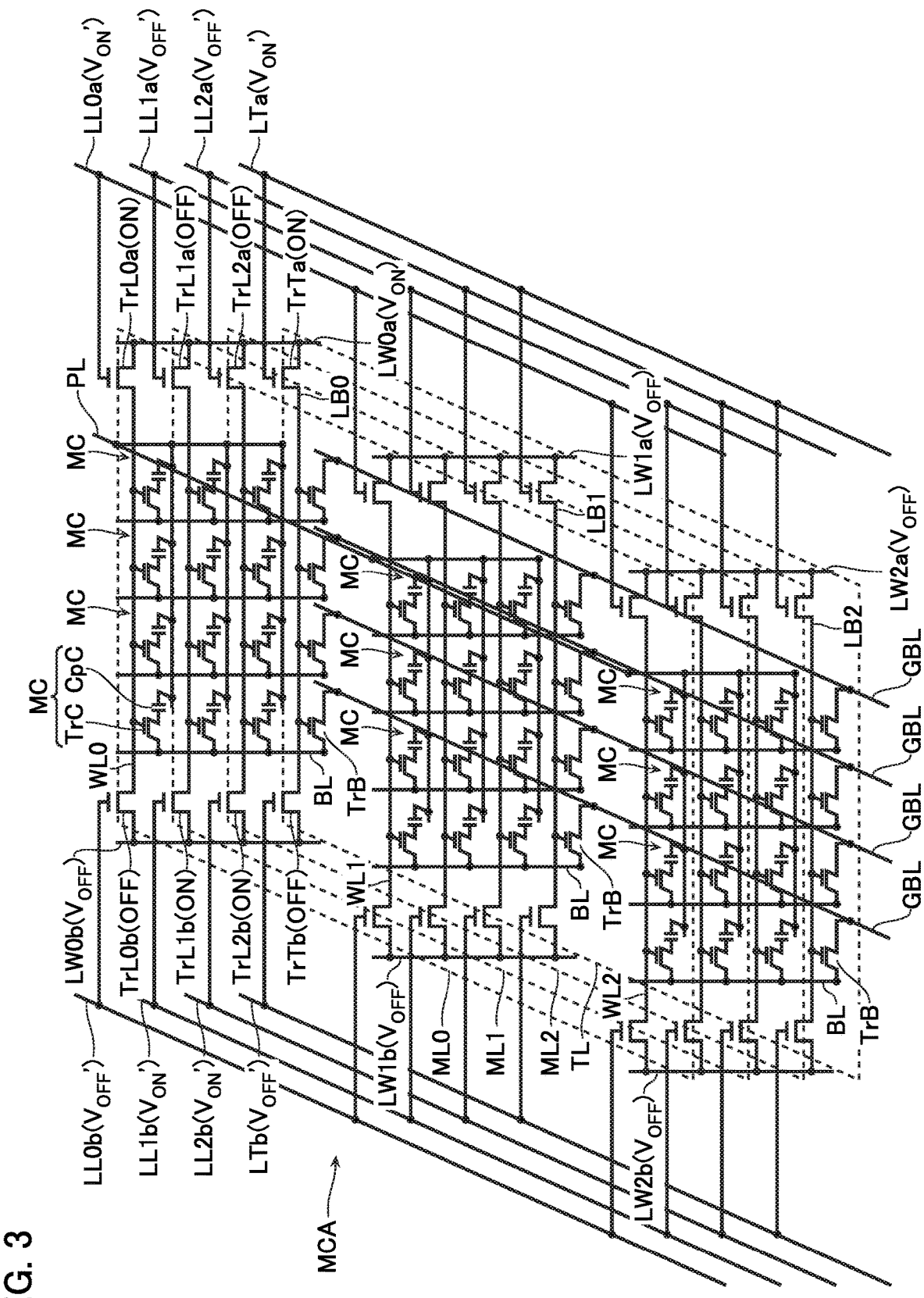
FIG. 3 is a schematic circuit diagram for explaining a read operation of the semiconductor memory device according to the first embodiment.

FIG. 3 is a schematic circuit diagram for explaining operation of the memory cell array MCA in a read operation of the semiconductor memory device according to the first embodiment.

During the read operation, one of the plurality of memory layers ML0-ML2 is selected. In the example illustrated, the memory layer ML0 is selected. During selection of the memory layers ML0-ML2, the layer selection line LL0a corresponding to the memory layer ML0 that is to be a target of the read operation, of the plurality of layer selection lines LL0a, LL1a, LL2a is supplied with a voltage V$_{ON}$', and the other layer selection lines LL1a, LL2a are supplied with a voltage V$_{OFF}$', for example. Moreover, the layer selection line LL0b corresponding to the memory layer ML0 that is to be a target of the read operation, of the plurality of layer selection lines LL0b, LL1b, LL2b is supplied with the voltage V$_{OFF}$', and the other layer selection lines LL1b, LL2b are supplied with the voltage V$_{ON}$', for example. Moreover, the wiring LTa is supplied with the voltage V$_{ON}$', and the wiring LTb is supplied with the voltage V$_{OFF}$'.

The voltage V$_{ON}$' has a magnitude sufficient to set the transistors TrL, TrT to an ON state, for example. The voltage V$_{OFF}$' has a magnitude sufficient to set the transistor TrL, TrT to an OFF state, for example. When the transistors TrL, TrT are NMOS transistors, for example, the voltage V$_{ON}$' is larger than the voltage V$_{OFF}$'. Moreover, when the transistors TrL, TrT are PMOS transistors, for example, the voltage V$_{ON}$' is smaller than the voltage V$_{OFF}$'. Note that hereafter, there will be described an example where the transistors TrL, TrT are NMOS transistors.

Moreover, during the read operation, one of the plurality of word lines WL0-WL2 is selected. In the example illustrated, the word line WL0 is selected. During selection of the word lines WL0-WL2, the word line selection line LW0a corresponding to the word line WL0 that is to be a target of the read operation, of the plurality of word line selection lines LW0a, LW1a, LW2a is supplied with a voltage V$_{ON}$, and the other word line selection lines LW1a, LW2a are supplied with a voltage V$_{OFF}$, for example. Moreover, the plurality of word line selection lines LW0b, LW1b, LW2b are supplied with the voltage V$_{OFF}$, for example.

The voltage V$_{ON}$ has a magnitude sufficient to set the transistors TrC, TrB to an ON state, for example. The voltage V$_{OFF}$ has a magnitude sufficient to set the transistors TrC, TrB to an OFF state, for example. When the transistors TrC, TrB are NMOS transistors, for example, the voltage $V_{ON}$ is larger than the voltage $V_{OFF}$. Moreover, when the transistors TrC, TrB are PMOS transistors, for example, the voltage $V_{ON}$ is smaller than the voltage $V_{OFF}$. Note that hereafter, there will be described an example where the transistors TrC, TrB are NMOS transistors.

Now, the word line WL0 (hereafter, called "selected word line WL0") connected to the memory cells MC that are targets of the read operation (hereafter, called "selected memory cells MC") is supplied with the voltage $V_{ON}$ via the transistor TrL0a. As a result, the transistors TrC in the selected memory cells MC attain an ON state. Moreover, the bit line selection line LB0 connected to the transistors TrB corresponding to the selected memory cells MC is supplied with the voltage $V_{ON}$ via the transistor TrTa. As a result, the transistors TrB corresponding to the selected memory cell MC attain an ON state. Accordingly, voltage of the global bit line GBL changes. By detecting this change in voltage, it is possible for data stored in the selected memory cell MC to be read.

Moreover, the word lines WL1, WL2 other than the selected word line WL0 in the same memory layer ML0 as the selected word line WL0 (hereafter, called "non-selected word lines WL1, WL2") are supplied with the voltage $V_{OFF}$ via the transistors TrL0a. As a result, the transistors TrC in the memory cells MC attain an OFF state. Similarly, the bit line selection lines LB1, LB2 other than the bit line selection line LB0 corresponding to the selected memory cell MC are supplied with the voltage $V_{OFF}$ via the transistors TrTa. As a result, the transistors TrB attain an OFF state.

Moreover, non-selected word lines WL0, WL1, WL2 corresponding to different memory layers ML1, ML2 from that of the selected memory cells MC are supplied with the voltage $V_{OFF}$ via the transistors TrL1b, TrL2b. As a result, the transistors TrC in the memory cells MC attain an OFF state.

FIGS. 4 to 8 are schematic circuit diagrams for explaining operation of the sense amplifier unit SAU in the read operation of the semiconductor memory device according to the first embodiment.

Figure 4:
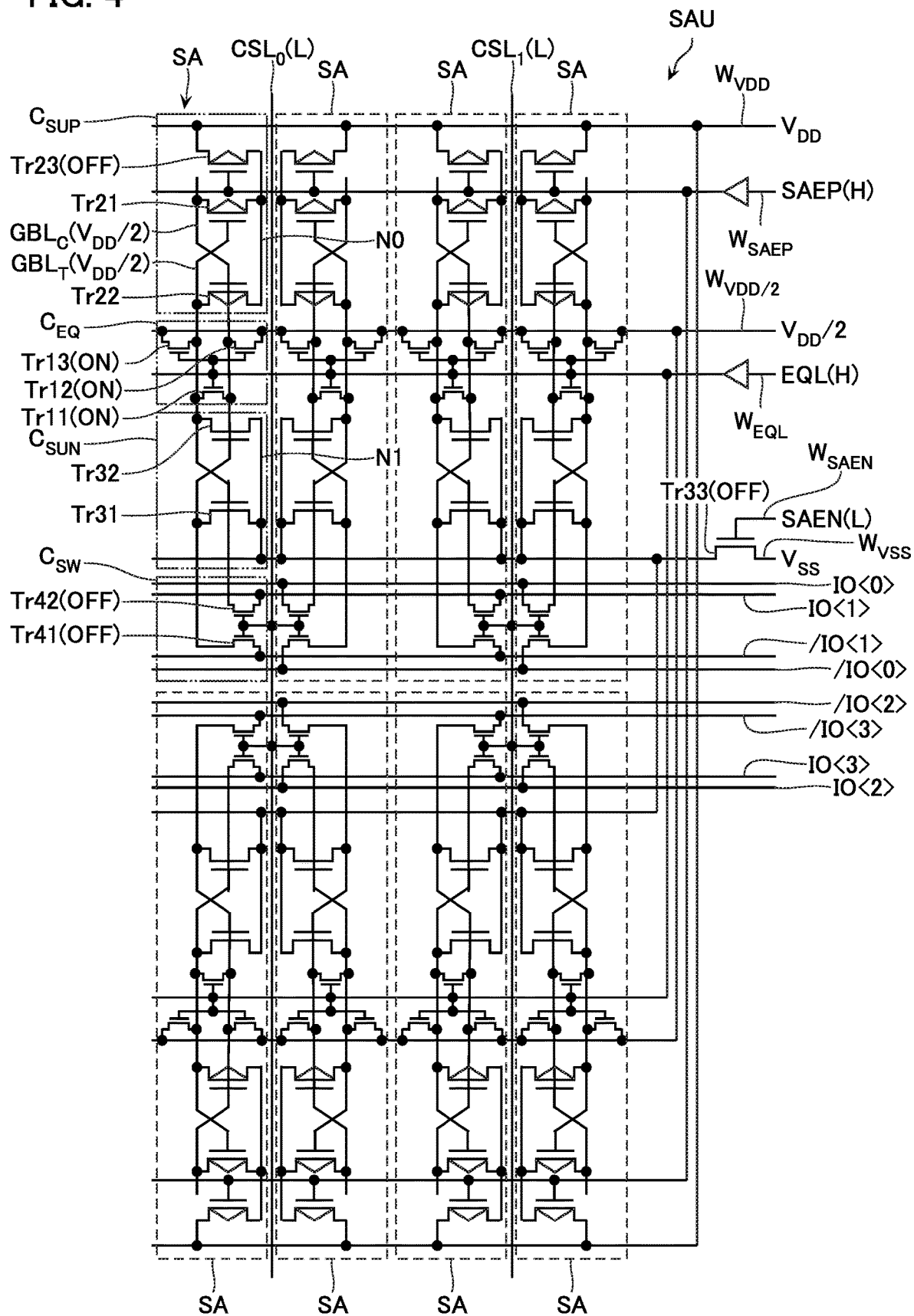
FIG. 4 is a schematic circuit diagram for explaining same read operation.

As shown in FIG. 4, in a standby state prior to read operation execution, voltages of the column selection line CSL and signal supply lines $W_{SAEP}$, $W_{SAEN}$, $W_{EQL}$ are respectively "L, H, L, H". In this state, the transistors Tr1l, Tr12, Tr13 are in an ON state, and voltages of the global bit lines $GBL_C$, $GBL_T$ are equalized to voltage $V_{DD}/2$.

Figure 5:
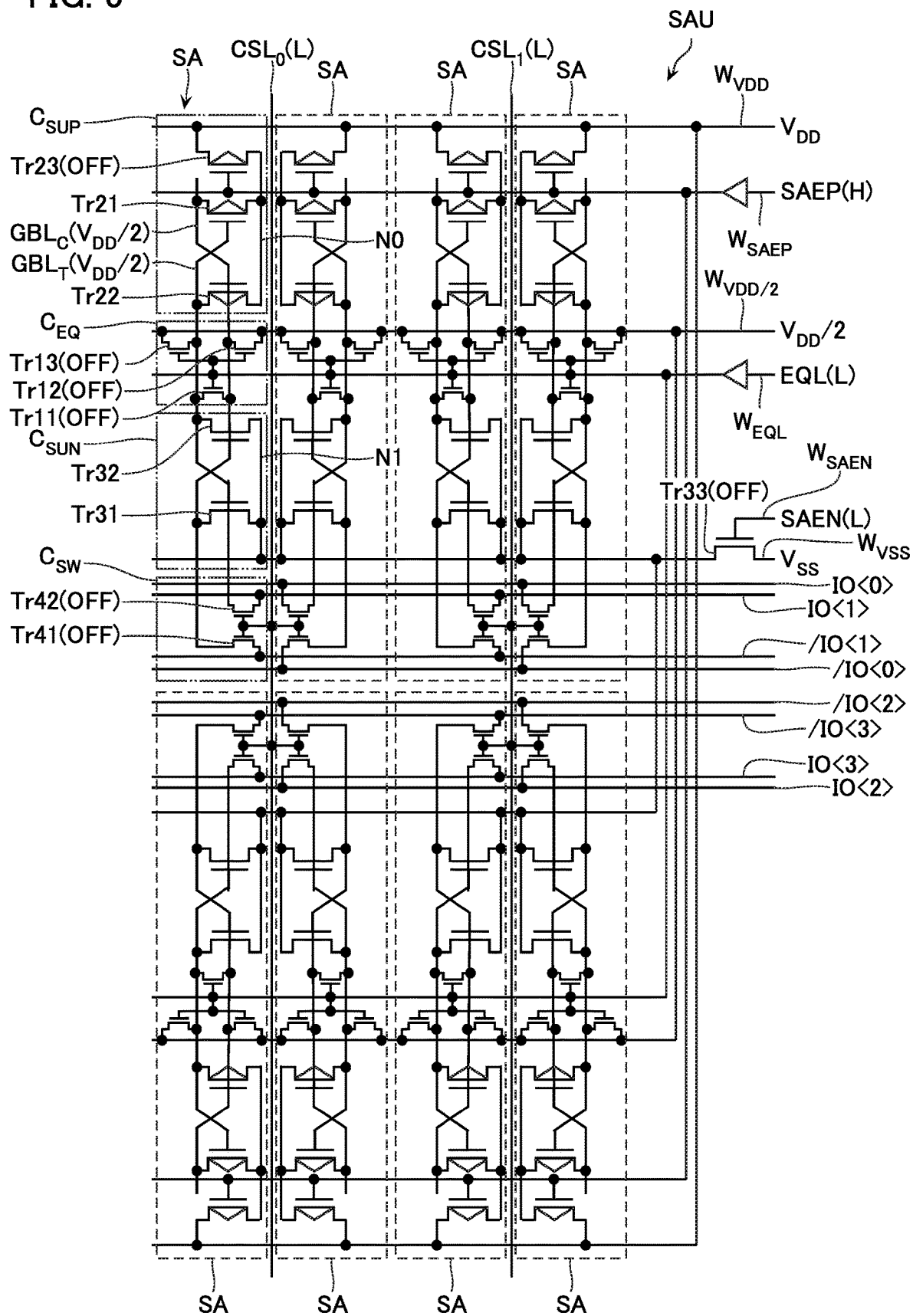
FIG. 5 is a schematic circuit diagram for explaining same read operation.

During the read operation, as shown in FIG. 5, equalization of voltages of the global bit lines $GBL_C$, $GBL_T$ is released. For example, voltage of the signal supply line $W_{EQL}$ is set to "L". Accordingly, the transistors Tr11, Tr12, Tr13 attain an OFF state.

Figure 6:
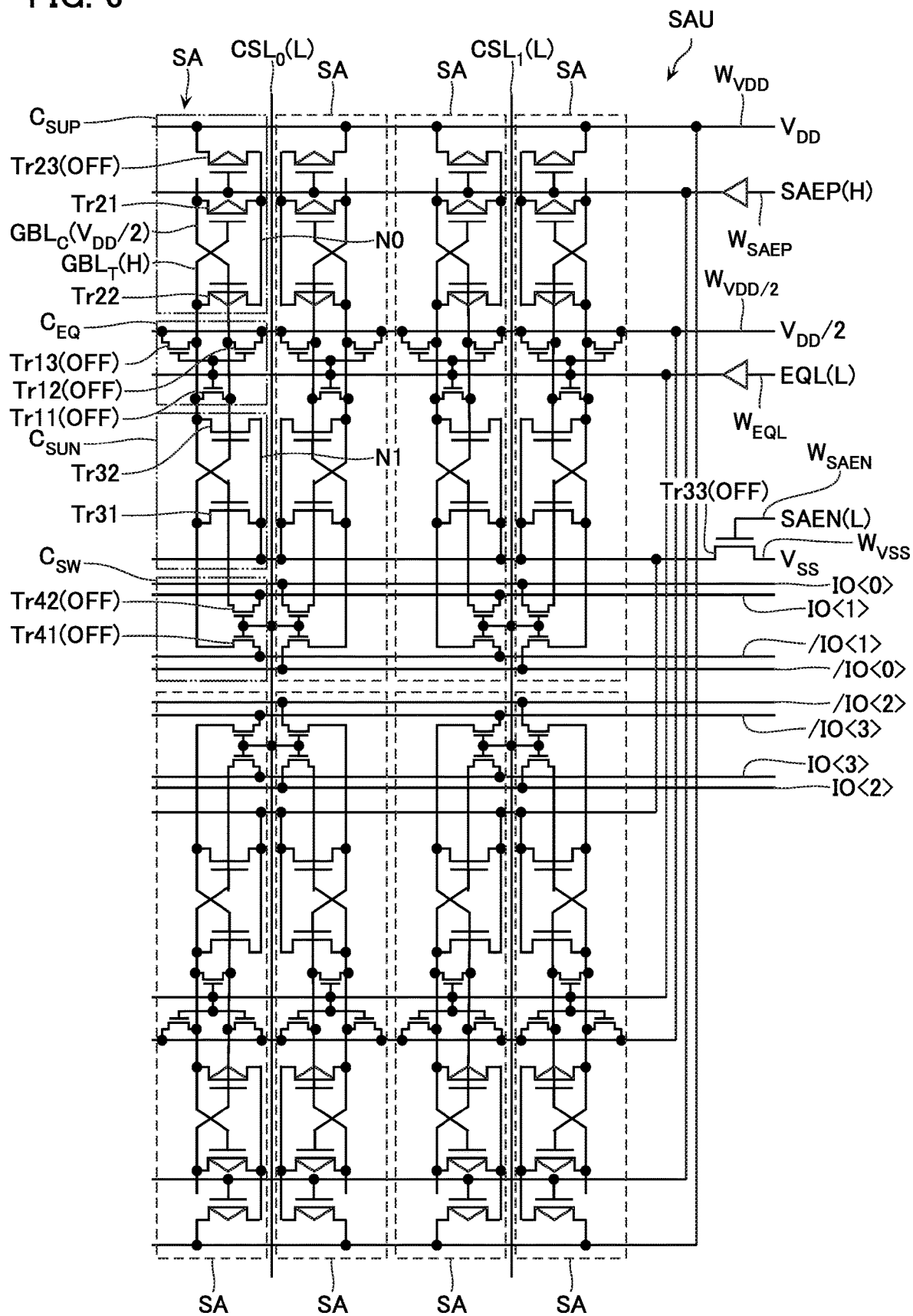
FIG. 6 is a schematic circuit diagram for explaining same read operation.

Moreover, during the read operation, as shown in FIG. 6, data in the memory cell MC is read to the global bit line GBL. For example, as has been described with reference to FIG. 3, one of the plurality of memory layers ML0-ML2 is selected, one of the plurality of word lines WL0-WL2 is selected, and in all of the corresponding memory cells MC, the transistor TrC is set to an ON state.

Note that in FIG. 6, there is shown an example where the global bit line $GBL_T$, of the two global bit lines $GBL_C$, $GBL_T$ corresponding to the sense amplifier unit SAU, is selected. Hence, in the example of FIG. 6, voltage of the global bit line $GBL_C$ is maintained at voltage $V_{DD}/2$, and voltage of the global bit line $GBL_T$ changes. However, the global bit line $GBL_C$ may be selected. In this case, voltage of the global bit line $GBL_C$ changes, and voltage of the global bit line $GBL_T$ is maintained at voltage $V_{DD}/2$.

Note that in FIG. 6, there is shown an example where the capacitor CpC of the selected memory cell MC is charged by voltage $V_{DD}$. In this case, voltage of the global bit line GBL becomes larger than voltage $V_{DD}/2$. However, the capacitor CpC of the selected memory cell MC may be discharged to the ground voltage $V_{SS}$. In this case, voltage of the global bit line GBL becomes smaller than voltage $V_{DD}/2$.

Figure 7:
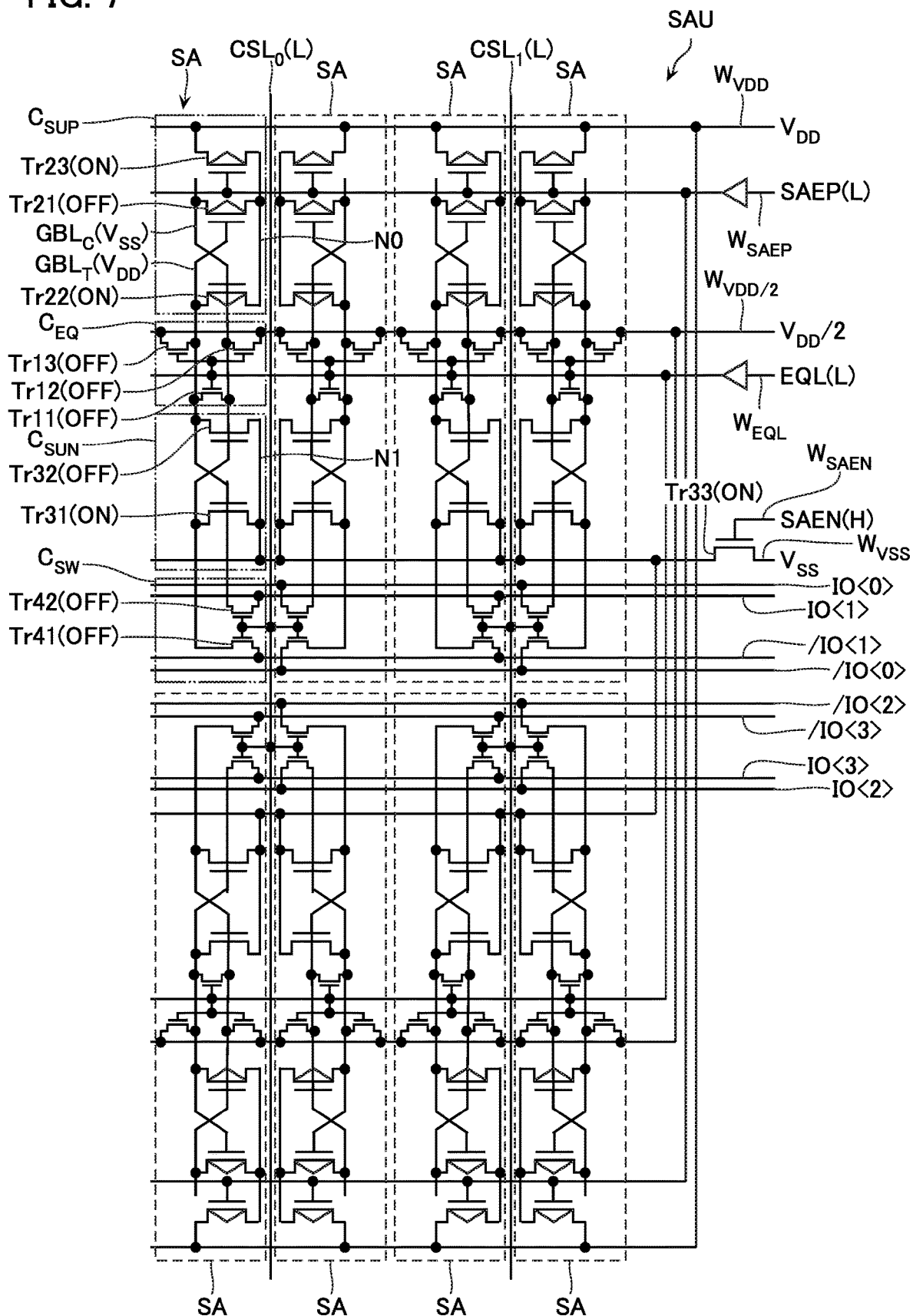
FIG. 7 is a schematic circuit diagram for explaining same read operation.

Moreover, during the read operation, as shown in FIG. 7, signals of the global bit lines $GBL_C$, $GBL_T$ are differentially amplified. For example, voltage of the signal supply line $W_{SAEP}$ is set to "L", and voltage of the signal supply line $W_{SAEN}$ is set to "H". Accordingly, the transistors Tr23, Tr33 attain an ON state.

Now, in the example of FIG. 7, voltage of the global bit line $GBL_T$ is larger than voltage $V_{DD}/2$. Hence, upon the transistors Tr23, Tr33 attaining an ON state, the transistors Tr22, Tr31 attain an ON state, and the transistors Tr21, Tr32 attain an OFF state. Accordingly, voltage of the global bit line $GBL_T$ increases to voltage $V_{DD}$. Moreover, voltage of the global bit line $GBL_C$ decreases to the ground voltage $V_{SS}$.

Figure 8:
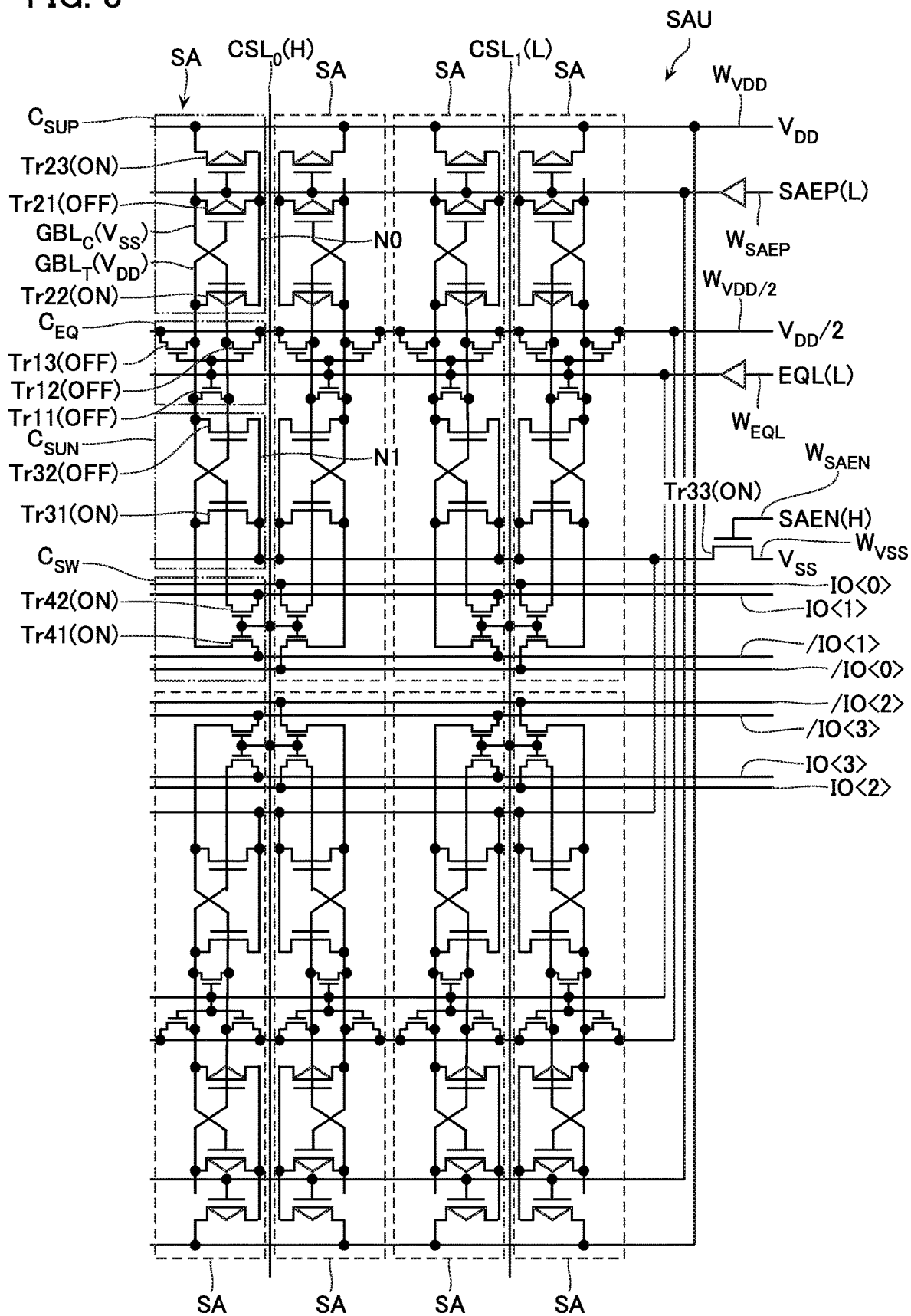
FIG. 8 is a schematic circuit diagram for explaining same read operation.

Moreover, during the read operation, as shown in FIG. 8, the global bit lines $GBL_C$, $GBL_T$ are made electrically continuous with the data input/output signal lines IO, /IO. For example, voltage of one of the plurality of column selection lines CSL (in the example of FIG. 8, the column selection line $CSL_0$) is set to "H". Accordingly, the transistor Tr41 attains an ON state, and the global bit line $GBL_C$ and data input/output signal line /IO are electrically continuous. Moreover, the transistor Tr42 attains an ON state, and the global bit line $GBL_T$ and data input/output signal line IO are electrically continuous.

[Parasitic Capacitance of Bit Line BL and Word Line WL]

As has been described with reference to FIG. 3, during the read operation, the transistor TrC in the selected memory cell MC is set to an ON state, and capacitor CpC in the selected memory cell MC made electrically continuous with the bit line BL and global bit line GBL, whereby voltage of the global bit line GBL is caused to change. Moreover, as has been described with reference to FIGS. 4 to 8, a difference between voltage of the global bit line GBL and voltage $V_{DD}/2$ is amplified by the sense amplifier unit SAU, and data in the memory cell MC thereby read.

Now, electrostatic capacitance of the capacitor CpC is assumed to be $C_S$, and parasitic capacitance of the bit line BL and global bit line GBL is assumed to be $C_{BL}$. Moreover, voltage between the bit line BL and plate line PL in a write operation is assumed to be $V_d$, and amount of change in voltage of the bit line BL and global bit line GBL in the operation described with reference to FIG. 6, of the read operation, is assumed to be $\Delta V_{BL}$. In this case, $\Delta V_{BL}$ can be estimated as $(C_S \times V_d)/(C_S + C_{BL})$. That is, the larger the parasitic capacitance ($C_{BL}$) of the bit line BL and global bit line GBL is, the smaller the amount of change in voltage of the global bit line GBL is in the operation described with reference to FIG. 6 of the read operation. In the operation described with reference to FIG. 6, if voltage of the global bit line GBL does not change sufficiently, then sometimes, the difference between the voltage of the global bit line GBL and voltage $V_{DD}/2$ cannot be amplified by the sense amplifier unit SAU, and the read operation cannot be suitably executed. For such reasons, reduction in parasitic capacitance of the bit line BL is desired.

Moreover, as has been described with reference to FIG. 3, during the read operation, the word line WL is charged via the transistor TrL, whereby the transistors TrC in the selected memory cells MC are set to an ON state. Hence, the smaller a parasitic capacitance of the word line WL is, the higher a speed of charging the word line WL is, and the higher a speed of the read operation is. Moreover, in the case of attempting to keep execution time of the read operation within a certain time, the smaller the parasitic capacitance of the word line WL per single memory cell MC is, the larger it will be possible for the number of memory cells MC connected to a single word line WL to be made, and the higher the achievable degree-of-integration of the semiconductor memory device will thereby be. For such reasons, reduction in parasitic capacitance of the word line WL is desired.

Accordingly, the inventors carried out a study regarding a structure of the memory cell array MCA that will enable parasitic capacitance of the bit line BL and word line WL to be reduced. Such a structure will be described below.

[Structure of Memory Cell Array MCA]

Figure 9:
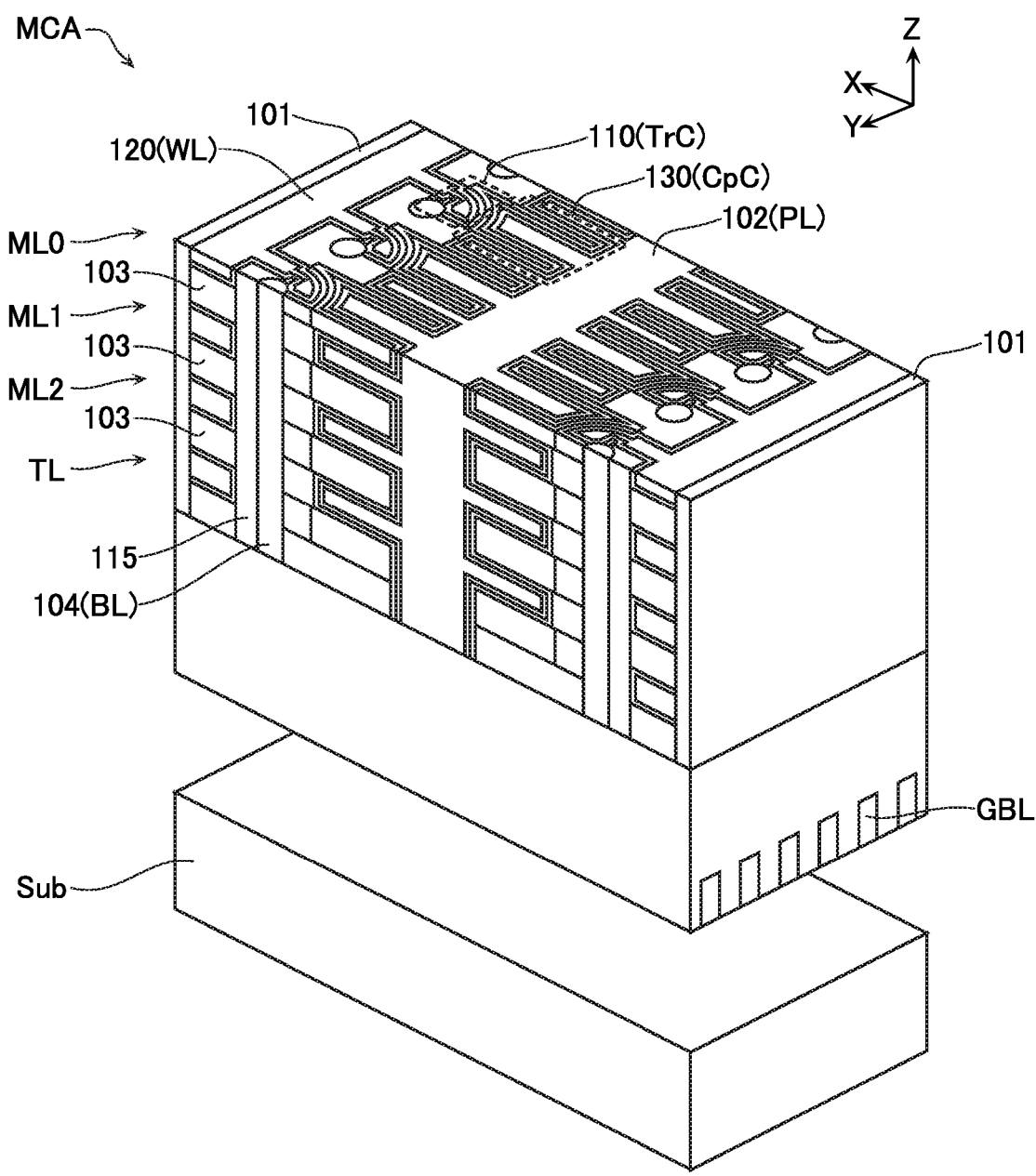
FIG. 9 is a schematic perspective view showing some of configurations of the semiconductor memory device according to the first embodiment.
Figure 10:
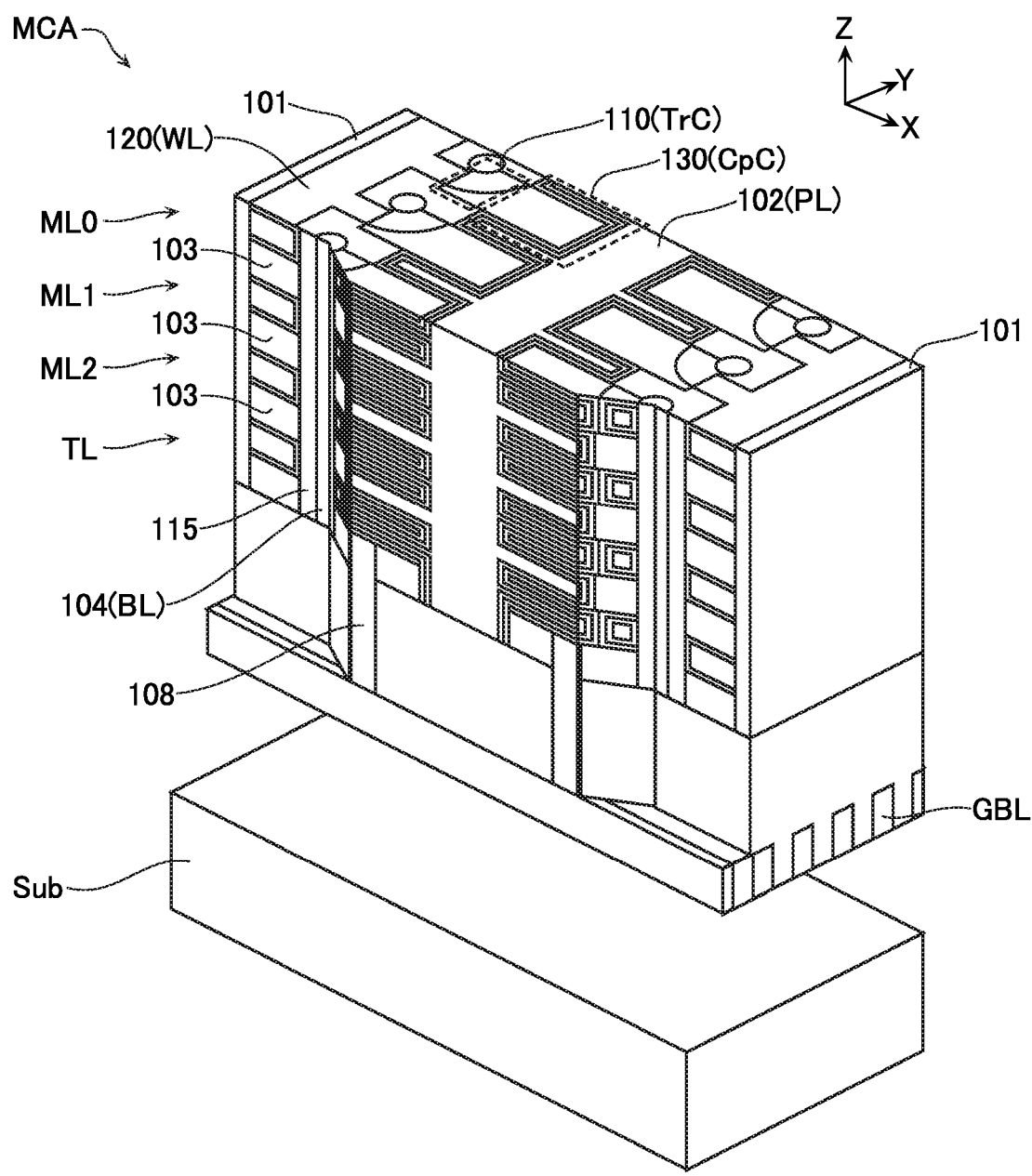
FIG. 10 is a schematic perspective view showing some of configurations of same semiconductor memory device.
Figure 11:
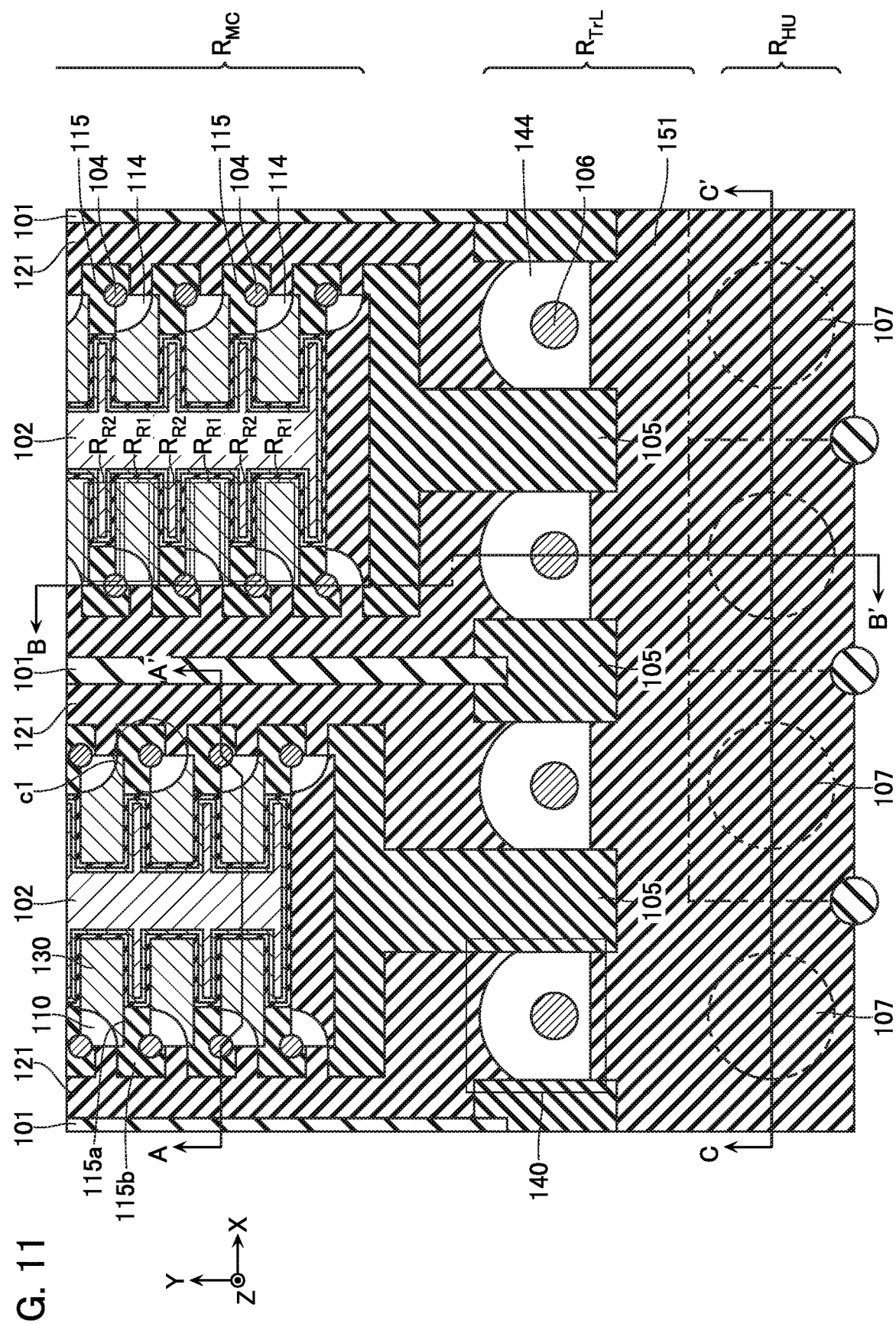
FIG. 11 is a schematic XY cross-sectional view showing some of configurations of same semiconductor memory device.
Figure 12:
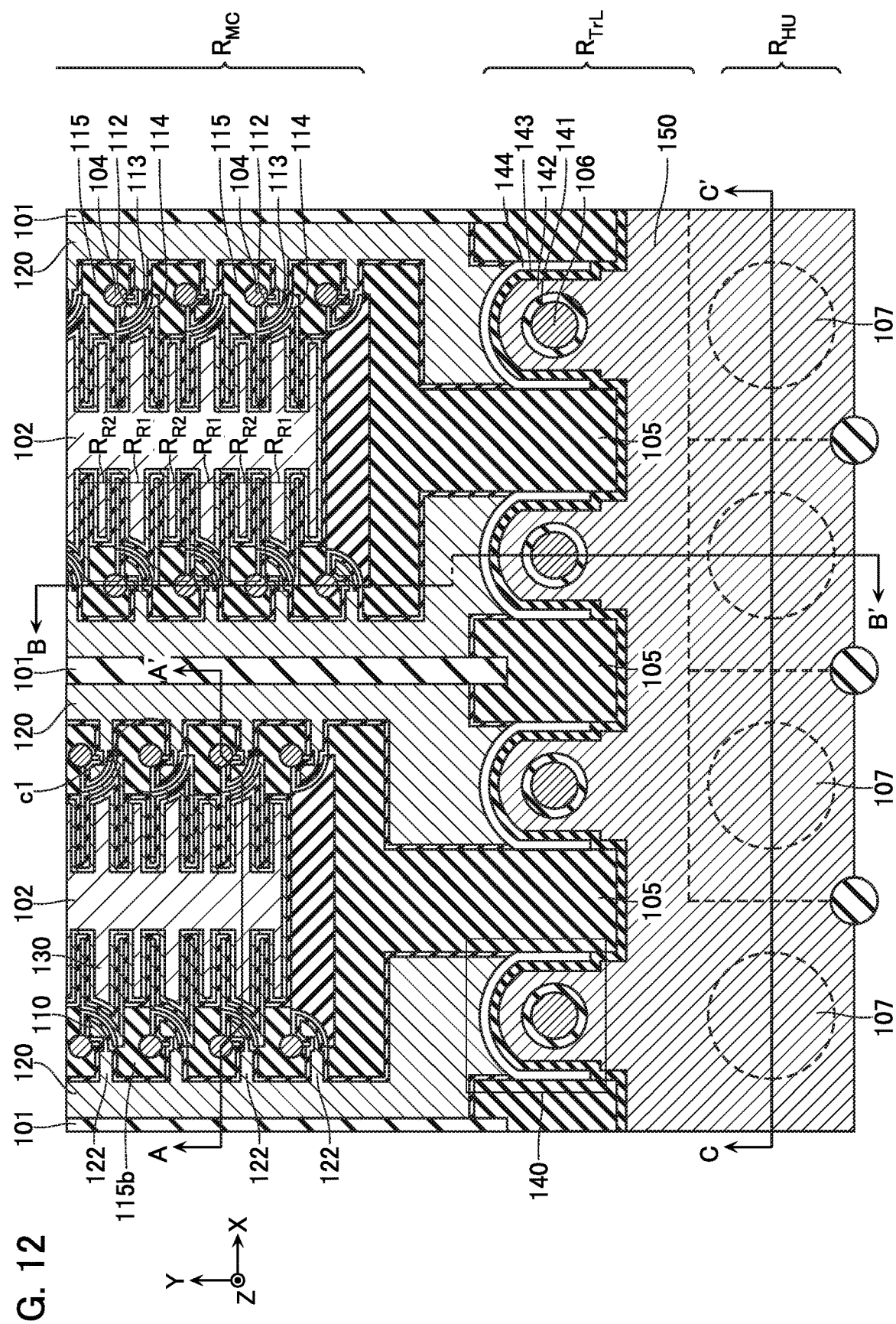
FIG. 12 is a schematic XY cross-sectional view showing some of configurations of same semiconductor memory device.
Figure 13:
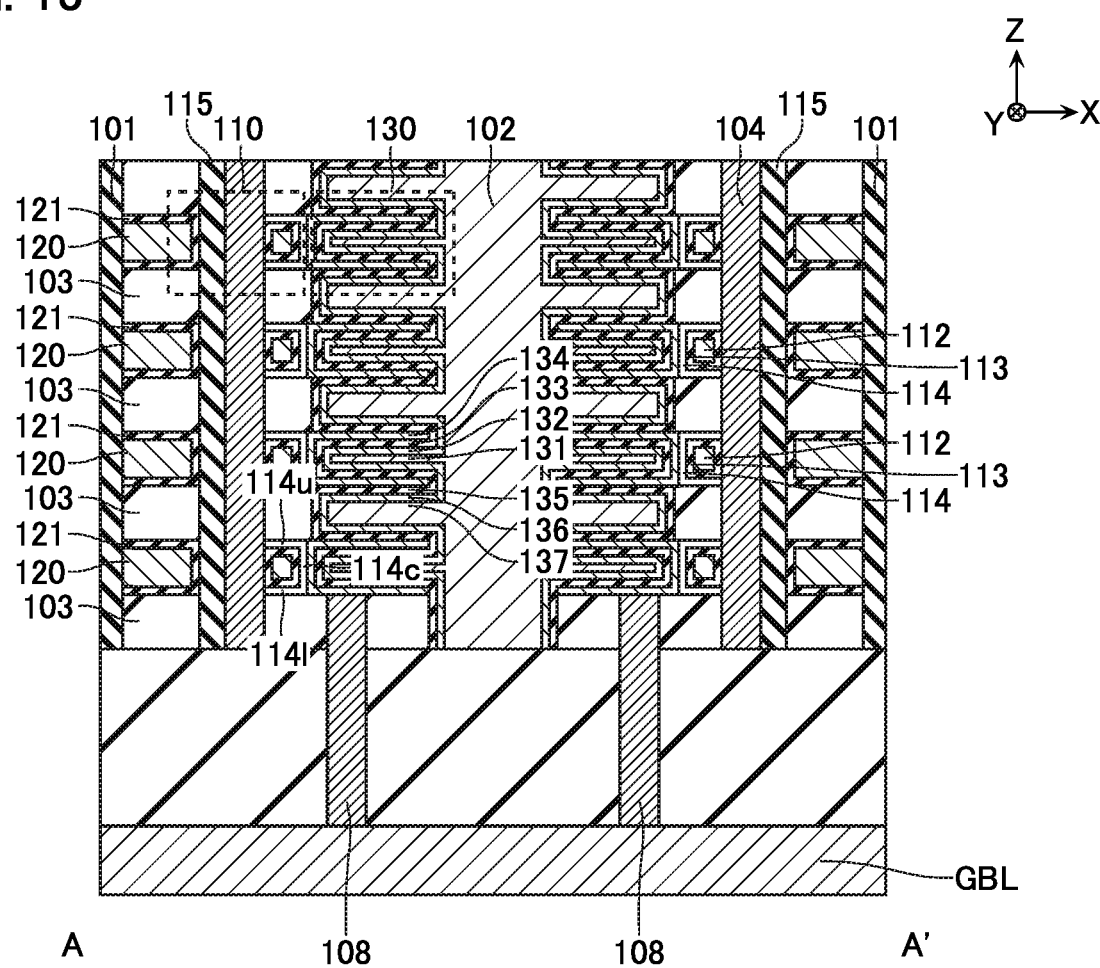
FIG. 13 is a schematic cross-sectional view in which the configurations shown in FIGS. 11 and 12 have been cut along the line A-A' and viewed along a direction of the arrows.
Figure 14:
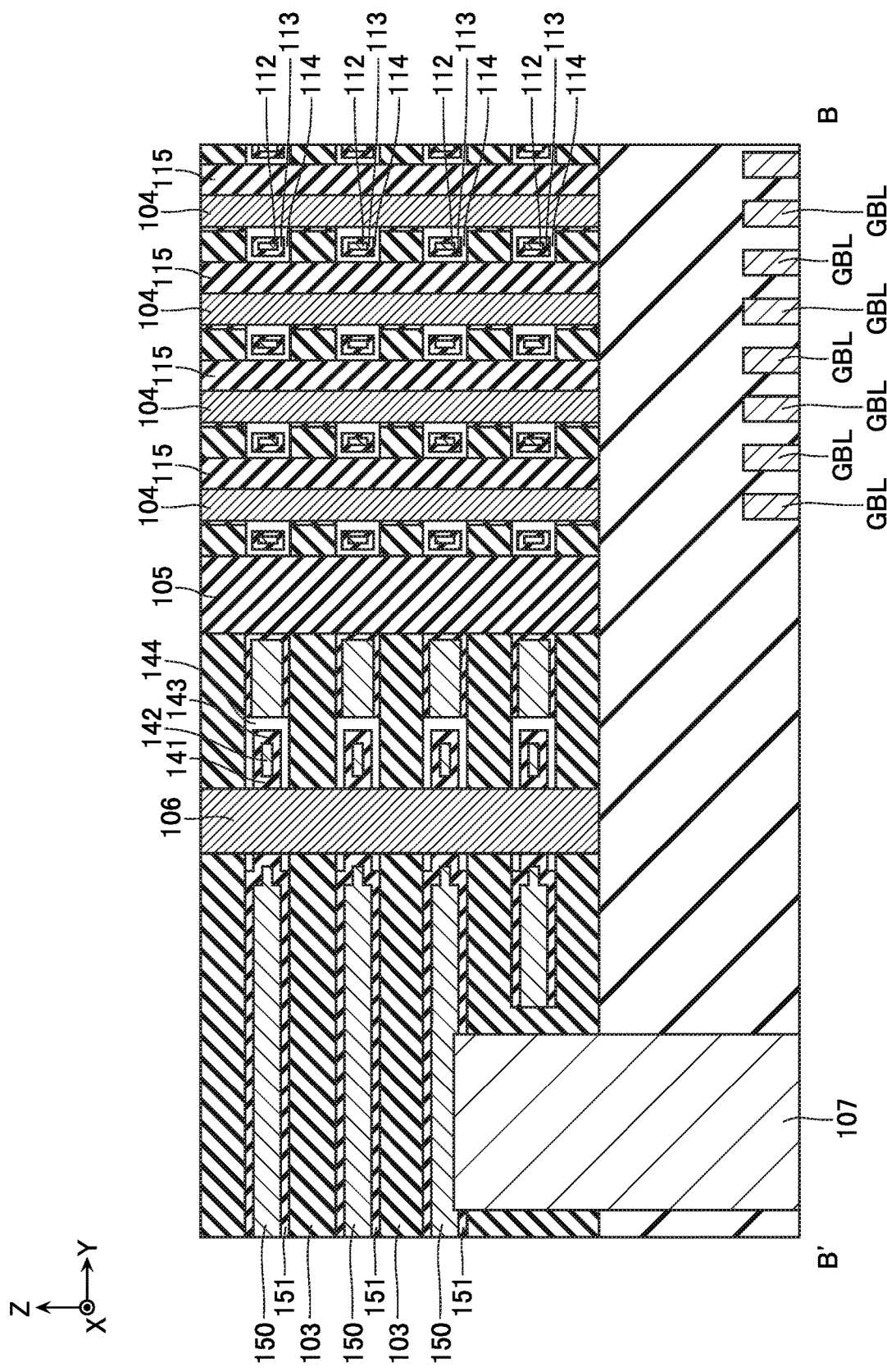
FIG. 14 is a schematic YZ cross-sectional view in which the configurations shown in FIGS. 11 and 12 have been cut along the line B-B' and viewed along a direction of the arrows.
Figure 15:
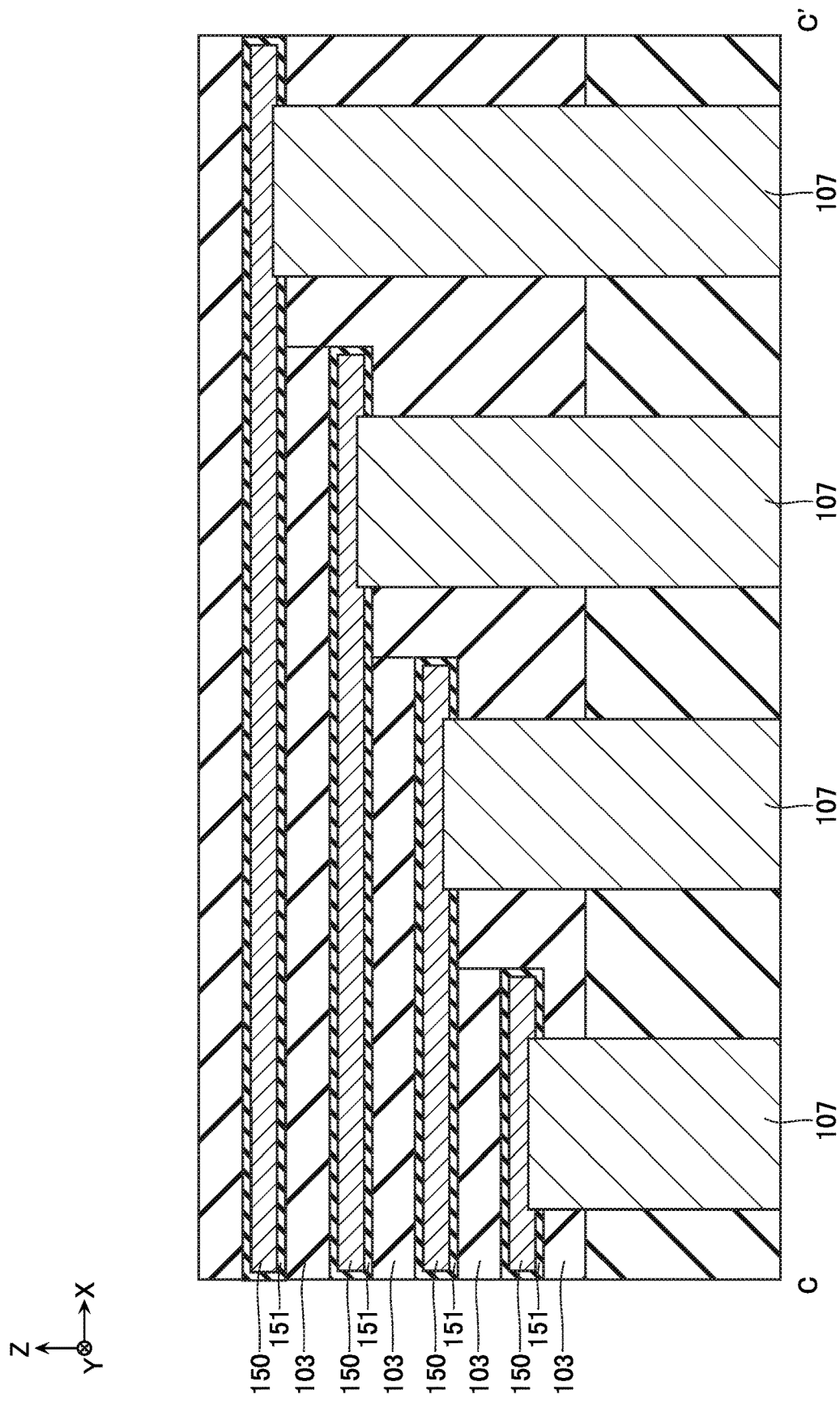
FIG. 15 is a schematic XZ cross-sectional view in which the configurations shown in FIGS. 11 and 12 have been cut along the line C-C' and viewed along a direction of the arrows.

FIGS. 9 and 10 are schematic perspective views showing some of configurations of the semiconductor memory device according to the first embodiment. FIGS. 11 and 12 are schematic XY cross-sectional views showing some of configurations of same semiconductor memory device. Note that FIGS. 11 and 12 show XY cross sections at differing height positions. FIG. 13 is a schematic cross-sectional view in which the configurations shown in FIGS. 11 and 12 have been cut along the line A-A' and viewed along a direction of the arrows. As shown in FIGS. 11 and 12, the line A-A' comprises: portions extending in the X direction; and portions extending in oblique directions. Hence, FIG. 13 includes: XZ cross sections; and cross sections extending in the oblique directions in FIGS. 11 and 12 and Z direction. Note that the cross section shown in FIG. 13 corresponds to a cross section in which the structure shown in FIG. 10 has been viewed from a negative side in the Y direction. FIG. 14 is a schematic YZ cross-sectional view in which the configurations shown in FIGS. 11 and 12 have been cut along the line B-B' and viewed along a direction of the arrows. FIG. 15 is a schematic XZ cross-sectional view in which the configurations shown in FIGS. 11 and 12 have been cut along the line C-C' and viewed along a direction of the arrows.

FIGS. 9 and 10 show: a part of a semiconductor substrate Sub; and the memory cell array MCA which is provided above the semiconductor substrate Sub.

The semiconductor substrate Sub is a semiconductor substrate of the likes of silicon (Si) including a P type impurity such as boron (B), for example. An unillustrated insulating layer and unillustrated electrode layer are provided on an upper surface of the semiconductor substrate Sub. The upper surface of the semiconductor substrate Sub and unillustrated insulating layer and electrode layer configure a control circuit for controlling the semiconductor memory device according to the first embodiment. For example, a region directly below the memory cell array MCA is provided with the sense amplifier unit SAU described with reference to FIG. 2.

The memory cell array MCA comprises: the plurality of memory layers ML0-ML2 which are arranged in the Z direction; the transistor layer TL which is provided below these memory layers ML0-ML2; and the plurality of global bit lines GBL which are provided below the transistor layer TL. Moreover, insulating layers 103 of the likes of silicon oxide ($SiO_2$) are respectively provided between the plurality of memory layers ML0-ML2 and between the memory layer ML2 and transistor layer TL.

[Configuration of Memory Layers ML0-ML2]

The memory layers ML0-ML2 comprise a memory cell region $R_{MC}$, a transistor region $R_{TrL}$, and a hookup region $R_{HU}$ that are arranged in the Y direction, as shown in FIG. 11. Note that although FIG. 11 illustrates a transistor region $R_{TrL}$ and hookup region $R_{HU}$ that are provided on a negative side in the Y direction with respect to the memory cell region $R_{MC}$, the transistor region $R_{TrL}$ and hookup region $R_{HU}$ are provided also on a positive side in the Y direction with respect to the memory cell region $R_{MC}$.

[Configuration of Memory Cell Region $R_{MC}$]

The memory cell region $R_{MC}$ is provided with a plurality of insulating layers 101 and a plurality of conductive layers 102 arranged alternately in the X direction. As shown in FIG. 9, these plurality of insulating layers 101 and plurality of conductive layers 102 extend in the Y direction and Z direction, and divide the memory layers ML0-ML2 and transistor layer TL in the X direction.

The insulating layer 101 includes the likes of silicon oxide ($SiO_2$), for example.

The conductive layer 102 includes the likes of a laminated structure of titanium nitride (TiN) and tungsten (W), for example. The conductive layer 102 functions as the plate line PL (FIG. 1), for example.

In addition, the memory cell region $R_{MC}$ is provided with: a plurality of conductive layers 104 that are provided between the insulating layer 101 and the conductive layer 102; and a plurality of insulating layers 115 which are in contact with parts of outer peripheral surfaces of the plurality of conductive layers 104. The plurality of conductive layers 104 and the plurality of insulating layers 115 are arranged in the Y direction, and extend in the Z direction penetrating the plurality of memory layers ML0-ML2 and transistor layer TL.

The conductive layer 104 includes the likes of a laminated structure of indium tin oxide (ITO) or another conductive oxide, titanium nitride (TiN), and tungsten (W), for example. Note that the conductive layer 104 may include ruthenium (Ru), iridium (Ir), or another metal, instead of a conductive oxide. Moreover, the conductive layer 104 may include solely a conductive oxide, or may include solely ruthenium (Ru), iridium (Ir), or another metal. The conductive layer 104 functions as the bit line BL (FIG. 1), for example. A plurality of the bit lines BL are provided correspondingly to the plurality of transistors TrC included in the memory layers ML0-ML2.

Note that in the present specification, the conductive oxide is assumed to include indium tin oxide (ITO), indium zinc oxide (IZO), ruthenium oxide ($RuO_2$), iridium oxide ($IrO_2$), or another conductive material including oxygen, for example.

The insulating layer 115 includes the likes of silicon oxide ($SiO_2$), for example.

As shown in FIG. 11, for example, in the memory cell region $R_{MC}$, substantially rectangular-shaped regions $R_{R1}$, $R_{R2}$ arranged alternately in the Y direction correspondingly to the plurality of conductive layers 104, are provided in the memory layers ML0-ML2. The conductive layer 104 is in contact with each of end portions of the regions $R_{R1}$, $R_{R2}$ on an insulating layer 101 side. A region on an inner side of an imaginary circle c1 centered on a center point of the conductive layer 104, in the region $R_{R1}$ is provided with a transistor structure 110. Moreover, a region on an outer side of the circle c1, in the region $R_{R1}$ is provided with a part of a capacitor structure 130. The region $R_{R2}$ is provided with each of: parts of two of the capacitor structures 130 adjacent in the Y direction; and a part 115a of the insulating layer 115.

Moreover, as shown in FIG. 12, in the memory cell region $R_{MC}$, a conductive layer 120 is provided between these plurality of regions $R_{R1}$, $R_{R2}$ and the insulating layer 101 in each of the memory layers ML0-ML2.

Moreover, the memory cell region $R_{MC}$ is provided with a plurality of conductive layers 122 and parts 115b of the insulating layers 115, that are provided between the plurality of regions $R_{R1}$, $R_{R2}$ and the conductive layer 120, and are arranged alternately in the Y direction correspondingly to the plurality of regions $R_{R1}$, $R_{R2}$. The conductive layer 104 is separated from the conductive layer 122 in the Y direction.

Note that in the example illustrated, width of the above-described part 115b in the Y direction is larger than width of the above-described part 115a in the Y direction. A side surface of the above-described part 115b on a positive side in the Y direction is provided more to a positive side in the Y direction than a side surface of the above-described part 115a on a positive side in the Y direction is. Similarly, a side surface of the above-described part 115b on a negative side in the Y direction is provided more to a negative side in the Y direction than a side surface of the above-described part 115a on a negative side in the Y direction is. The outer peripheral surface of the conductive layer 104 is in contact with the above-described part 115a over an angular range of 90°, is in contact with the above-described part 115b over an angular range of 180°, and has the remaining 90° of its angular range connected to the above-described transistor structure 110.

[Configuration of Transistor Structure 110]

As shown in FIGS. 12 and 13, for example, the transistor structure 110 comprises: a conductive layer 112; an insulating layer 113 provided on an upper surface, a lower surface, and side surfaces of the conductive layer 112; and a semiconductor layer 114 provided on an upper surface, a lower surface, and side surfaces of the insulating layer 113. As shown in FIGS. 11 and 12, the conductive layer 112, insulating layer 113, and semiconductor layer 114 comprise a substantially circular-sector shape that comprises: an arc-like side surface extending along the outer peripheral surface of the conductive layer 104; a side surface in the Y direction extending in the X direction along a boundary in the Y direction with the region $R_{R1}$; and an arc-like side surface extending along the above-described circle c1.

The conductive layer 112 functions as the gate electrode of the transistor TrC (FIG. 1), for example. The conductive layer 112 includes the likes of a laminated structure of titanium nitride (TiN) and tungsten (W), for example. In the cross section shown in FIG. 12, the outer peripheral surface of the conductive layer 104 includes a portion in contact with the region $R_{R1}$ and at least a part of this portion faces the conductive layer 112, while the other portion does not face the conductive layer 112. As shown in FIG. 12, a plurality of the conductive layers 112 arranged in the Y direction are respectively continuous with the conductive layers 122, and, via the conductive layers 122, are continuous with the conductive layer 120 extending in the Y direction.

The insulating layer 113 functions as a gate insulating film of the transistor TrC (FIG. 1), for example. The insulating layer 113 includes the likes of silicon oxide ($SiO_2$), for example. In the cross section shown in FIG. 12, the outer peripheral surface of the conductive layer 104 includes a portion in contact with the region $R_{R1}$ and this portion is in contact with the insulating layer 113 or the semiconductor layer 114, and the other portion is in contact with the insulating layer 115.

The semiconductor layer 114 functions as a channel region of the transistor TrC (FIG. 1), for example. The semiconductor layer 114 may be, for example, a semiconductor including: indium (In); zinc (Zn); oxygen (O); and at least one of gallium (Ga) or aluminum (Al), or may be, for example, another oxide semiconductor. A portion of the semiconductor layer 114 covering the upper surface of the conductive layer 112 and a portion of the semiconductor layer 114 covering the lower surface of the conductive layer 112 comprise the substantially circular-sector shape shown in FIG. 11, as mentioned above. In the cross section shown in FIG. 11, a contact area of the semiconductor layer 114 with the capacitor structure 130 is larger than a contact area of the semiconductor layer 114 with the outer peripheral surface of the conductive layer 104. In the cross section shown in FIG. 11, the outer peripheral surface of the conductive layer 104 includes a portion in contact with the region $R_{R1}$ and this portion is in contact with the semiconductor layer 114, and the other portion is in contact with the insulating layer 115. As shown in FIG. 13, a plurality of the semiconductor layers 114 arranged in the Z direction are commonly connected to the conductive layer 104 extending in the Z direction.

Note that in FIG. 13, a portion of the semiconductor layer 114 covering the upper surface of the conductive layer 112 is written as a portion 114u, and a portion of the semiconductor layer 114 covering the lower surface of the conductive layer 112 is written as a portion 114l. Moreover, a portion of the semiconductor layer 114 provided between these portions 114u, 114l is written as a portion 114c. Contact portions with the conductive layer 104 of the portions 114u, 114l are separated in the Z direction. On the other hand, contact portions with the capacitor structure 130 of the portions 114u, 114l are continuous via the above-described portion 114c.

[Configuration of Conductive Layer 120]

The conductive layer 120 functions as the word line WL (FIG. 1), for example. The conductive layer 120 extends in the Y direction, as shown in FIG. 12, for example. The conductive layer 120 comprises the likes of a laminated structure of titanium nitride (TiN) and tungsten (W), for example. Note that an upper surface and a lower surface of the conductive layer 120 are covered by an insulating layer 121 of the likes of silicon oxide ($SiO_2$), as shown in FIG. 13. The insulating layer 121 is continuous with the insulating layer 113, as shown in FIG. 12.

[Configuration of Capacitor Structure 130]

As shown in FIG. 13, for example, the capacitor structure 130 comprises: a conductive layer 131; a conductive layer 132 provided on an upper surface, a lower surface, and a side surface in the X direction of the conductive layer 131; an insulating layer 133 provided on an upper surface, a lower surface, and a side surface in the X direction of the conductive layer 132; a conductive layer 134 provided on an upper surface, a lower surface, and a side surface in the X direction of the insulating layer 133; an insulating layer 135 provided on an upper surface, a lower surface, and a side surface of the conductive layer 134; a conductive layer 136 provided on an upper surface, a lower surface, and a side surface in the X direction of the insulating layer 135; and a conductive layer 137 provided on an upper surface, a lower surface, and a side surface of the conductive layer 136 in the X direction.

The conductive layers 131, 132, 136, 137 function as one electrode of the capacitor CpC (FIG. 1). The conductive layers 131, 137, which include the likes of tungsten (W), for example, are continuous with a portion of tungsten in the conductive layer 102. The conductive layers 132, 136, which include the likes of titanium nitride (TiN), for example, are continuous with a portion of titanium nitride in the conductive layer 102.

The insulating layers 133, 135 function as an insulating layer of the capacitor CpC (FIG. 1). The insulating layers 133, 135 may be alumina ($Al_2O_3$) or another insulative metal oxide, for example.

The conductive layer 134 functions as the other electrode of the capacitor CpC (FIG. 1), for example. The conductive layer 134 includes the likes of indium tin oxide (ITO), for example. The conductive layer 134 is insulated from the conductive layers 131, 132, 136, 137 via the insulating layers 133, 135. The conductive layer 134 is connected to a side surface of the semiconductor layer 114 in the X direction.

[Configuration of Transistor Region $R_{TrL}$]

As shown in FIG. 11, for example, the transistor region $R_{TrL}$ is provided with a plurality of insulating layers 105 arranged in the X direction. The plurality of insulating layers 105 extend in the Z direction penetrating the plurality of memory layers ML0-ML2 and transistor layer TL.

The insulating layer 105 includes the likes of silicon oxide ($SiO_2$), for example.

In addition, the transistor region $R_{TrL}$ is provided with a plurality of conductive layers 106 that are provided between the insulating layers 105. The plurality of conductive layers 106 are arranged in the X direction and extend in the Z direction penetrating the plurality of memory layers ML0-ML2 and transistor layer TL (refer to FIG. 14).

The conductive layer 106 includes the likes of a laminated structure of indium tin oxide (ITO) or another conductive oxide, titanium nitride (TiN), and tungsten (W), for example. Note that the conductive layer 106 may include ruthenium (Ru), iridium (Ir), or another metal, instead of a conductive oxide. Moreover, the conductive layer 106 may include solely a conductive oxide, or may include solely ruthenium (Ru), iridium (Ir), or another metal. The conductive layer 106 functions as the word line selection line LW (FIG. 1), for example. A plurality of the word line selection lines LW are provided correspondingly to the plurality of transistors TrL included in the memory layers ML0-ML2.

In the transistor region $R_{TrL}$, as shown in FIG. 12, for example, the memory layers ML0-ML2 comprise: a plurality of transistor structures 140 provided correspondingly to the plurality of conductive layers 106; and a conductive layer 150 extending in the X direction along these plurality of transistor structures 140.

As shown in FIGS. 12 and 14, for example, the transistor structure 140 comprises: an insulating layer 141 provided on an outer peripheral surface of the conductive layer 106; a conductive layer 142 provided on an outer peripheral surface of the insulating layer 141; an insulating layer 143 provided on an upper surface, a lower surface, and an outer peripheral surface of the conductive layer 142; and a semiconductor layer 144 provided on an upper surface, a lower surface, and an outer peripheral surface of the insulating layer 143.

Note that in an XY cross section of the kind exemplified in FIG. 12, the outer peripheral surface of the insulating layer 141 may be formed along a circle centering on a center position of the conductive layer 106, for example. Moreover, side surfaces on one side in the Y direction (a conductive layer 120 side) of the conductive layer 142, insulating layer 143, and semiconductor layer 144 may be formed along a circle centering on a center position of the conductive layer 106. Moreover, both side surfaces of the conductive layer 142 in the X direction, both side surfaces of insulating layer 143 in the X direction, and both side surfaces of semiconductor layer 144 in the X direction may be formed linearly along a side surface of the insulating layer 105.

The insulating layer 141 includes the likes of silicon oxide ($SiO_2$), for example. The insulating layer 141 surrounds the outer peripheral surface of the conductive layer 106 over its entire periphery.

The conductive layer 142 functions as the gate electrode of the transistor TrL (FIG. 1), for example. The conductive layer 142 includes the likes of a laminated structure of titanium nitride (TiN) and tungsten (W), for example. The conductive layer 142 surrounds the outer peripheral surface of the insulating layer 141 over its entire periphery. As shown in FIG. 12, a plurality of the conductive layers 142 arranged in the X direction are continuous with the conductive layer 150 extending in the X direction.

The insulating layer 143 functions as a gate insulating film of the transistor TrL (FIG. 1), for example. The insulating layer 143 includes the likes of silicon oxide ($SiO_2$), for example. The insulating layer 143 covers both side surfaces in the X direction and the side surface on one side in the Y direction (the conductive layer 120 side), of the conductive layer 142.

The semiconductor layer 144 functions as a channel region of the transistor TrL (FIG. 1), for example. The semiconductor layer 144 may be, for example, a semiconductor including: indium (In); zinc (Zn); oxygen (O); and at least one of gallium (Ga) or aluminum (Al), or may be, for example, another oxide semiconductor. The semiconductor layer 144 covers both side surfaces in the X direction and the side surface on one side in the Y direction (the conductive layer 120 side), of the conductive layer 142, via the insulating layer 143. As shown in FIG. 14, a plurality of the semiconductor layers 144 arranged in the Z direction are commonly connected to the conductive layer 106 extending in the Z direction. As shown in FIG. 11, the insulating layer 105 is provided between two of the semiconductor layers 144 adjacent in the X direction. Note that the semiconductor layer 144 is connected to an end portion of the conductive layer 120 in the Y direction, as shown in FIG. 12, for example.

The conductive layer 150 functions as the layer selection line LL (FIG. 1), for example. As shown in FIG. 12, for example, the conductive layer 150 extends in the X direction and is continuous with the plurality of conductive layers 142 arranged in the X direction. The conductive layer 150 comprises the likes of a laminated structure of titanium nitride (TiN) and tungsten (W), for example. Note that, as shown in FIG. 14, for example, an upper surface and a lower surface of the conductive layer 150 are covered by an insulating layer 151 of the likes of silicon oxide ($SiO_2$). The insulating layer 151 is connected to the insulating layer 141 and the insulating layer 143.

[Configuration of Hookup Region $R_{HU}$]

The hookup region $R_{HU}$ is provided with a plurality of contact electrodes 107 arranged in the X direction. As shown in FIG. 15, the contact electrode 107 extends in the Z direction and has its upper end connected to the conductive layer 150. Moreover, the plurality of contact electrodes 107 arranged in the X direction are respectively connected to conductive layers 150 provided at different height positions. The contact electrode 107 includes the likes of a laminated structure of titanium nitride (TiN) and tungsten (W), for example.

[Configuration of Transistor Layer TL and Below]

The transistor layer TL is configured similarly to the memory layers ML0-ML2.

However, the conductive layer 112, the insulating layer 113, and the semiconductor layer 114 in the transistor layer TL respectively function as the gate electrode, the gate insulating film, and the channel region of the transistor TrB. Moreover, the conductive layer 120 in the transistor layer TL functions as the bit line selection lines LB0-LB2. Moreover, the conductive layer 134 in the transistor layer TL functions as the source electrode of the transistor TrB.

Moreover, the conductive layer 142, the insulating layer 143, and the semiconductor layer 144 in the transistor layer TL respectively function as the gate electrode, the gate insulating film, and the channel region of the transistor TrT. Moreover, the conductive layer 150 in the transistor layer TL functions as the wiring LT.

Moreover, as shown in FIGS. 9 and 10, the plurality of global bit lines GBL are provided below the transistor layer TL. The global bit lines GBL extend in the X direction and are arranged in the Y direction. The global bit line GBL includes the likes of a laminated structure of titanium nitride (TiN) and tungsten (W), for example.

Moreover, a region between the transistor layer TL and the global bit line GBL is provided with a plurality of contact electrodes 108 arranged in the X direction along the global bit line GBL, as shown in FIG. 10. These plurality of contact electrodes 108 extend in the Z direction and have their lower ends connected to an upper surface of the global bit line GBL. Moreover, their upper ends are connected to the lower surfaces of the conductive layers 134 in the transistor layer TL. The contact electrode 108 includes the likes of a laminated structure of titanium nitride (TiN) and tungsten (W), for example.

[Method of Manufacturing]

Figure 16:
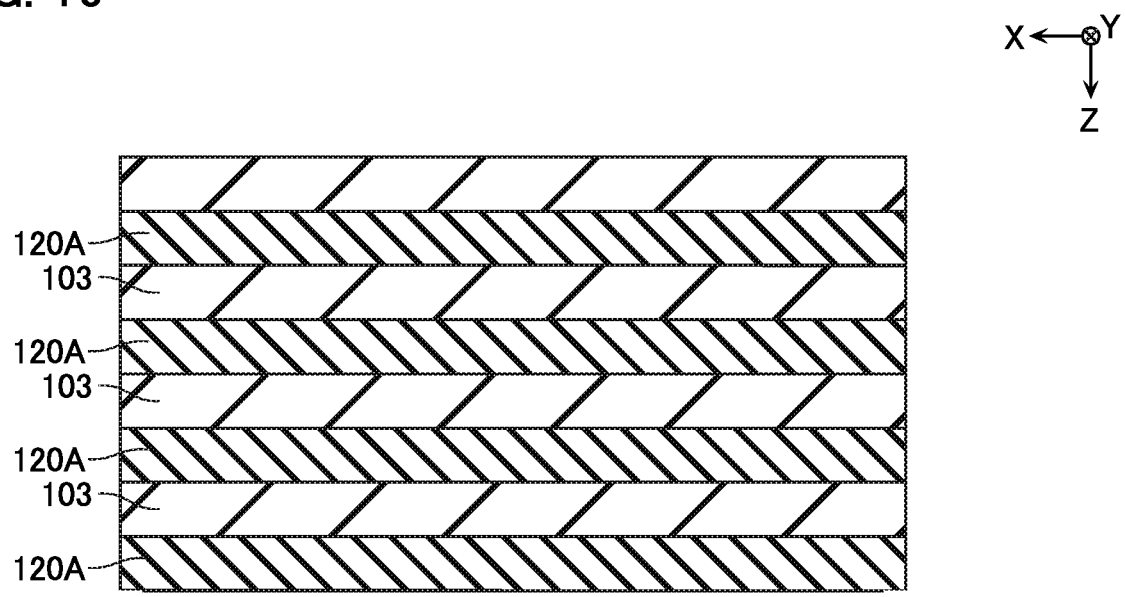
FIG. 16 is a schematic cross-sectional view for explaining a method of manufacturing the semiconductor memory device according to the first embodiment.
Figure 71:
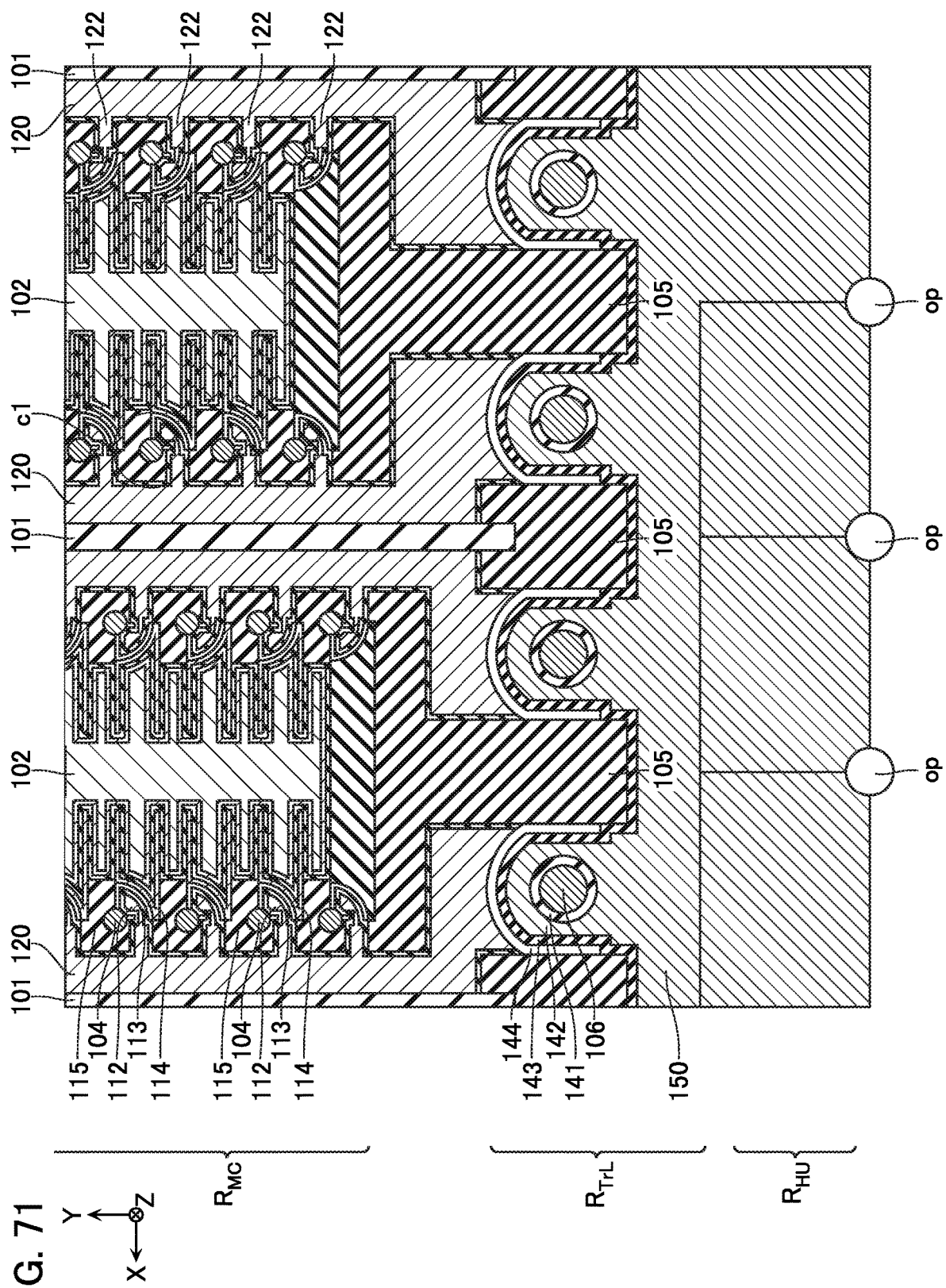
FIG. 71 is a schematic cross-sectional view for explaining same method of manufacturing.
Figure 72:
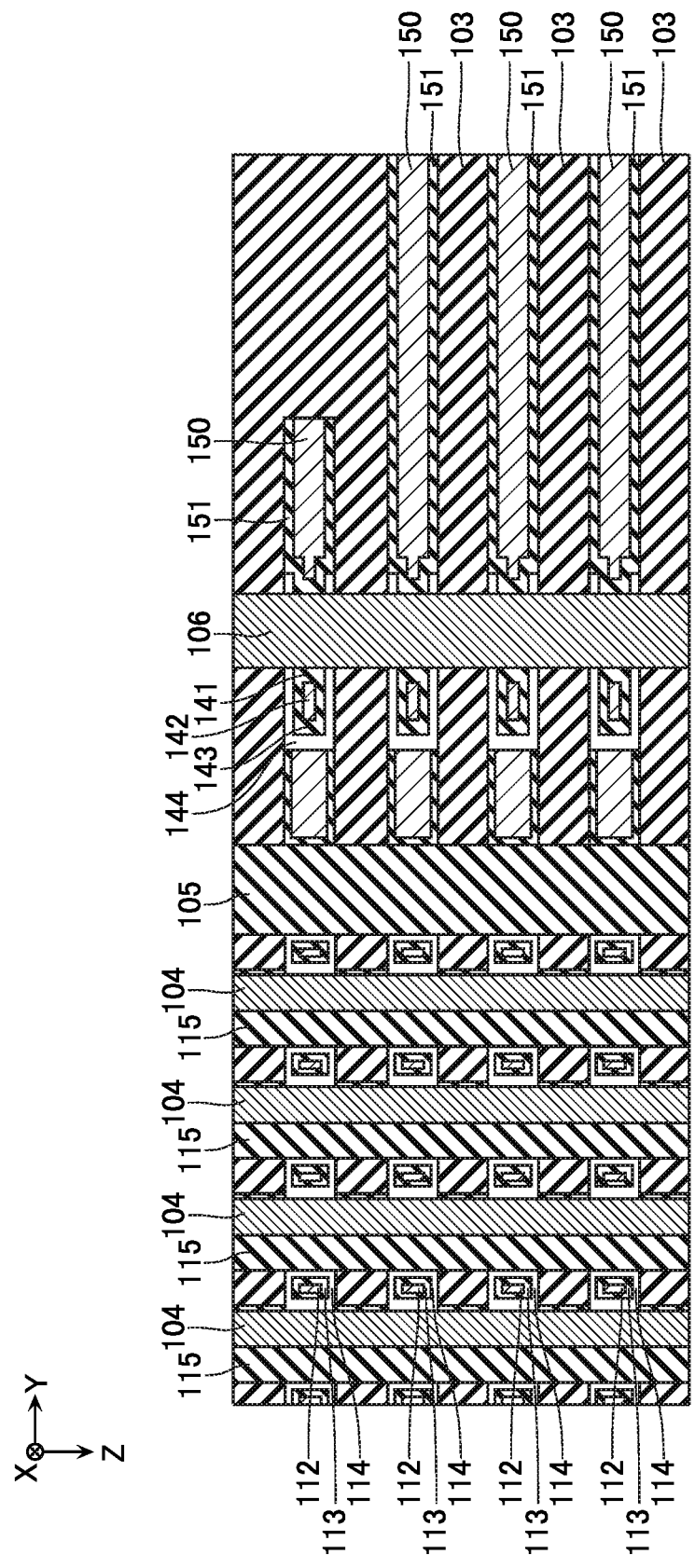
FIG. 72 is a schematic cross-sectional view for explaining same method of manufacturing.

FIGS. 16 to 72 are schematic cross-sectional views for explaining a method of manufacturing the semiconductor memory device according to the first embodiment. FIGS. 17, 18, 21, 24, 26, 29, 31, 34, 36, 38, 40, 42, 44, 49, 51, 53, 55, 56, 58, 60, 64, 66, 67, 69, and 71 show cross sections corresponding to FIG. 12. FIGS. 16, 19, 22, 25, 27, 28, 35, 37, 39, 41, 43, 45 to 48, 50, 52, 54, and 57 show cross sections corresponding to FIG. 13. FIGS. 20, 23, 30, 32, 33, 59, 61 to 63, 65, 68, 70, and 72 show cross sections corresponding to FIG. 14.

Note that the semiconductor memory device according to the first embodiment is formed by having its memory cell array MCA and its peripheral circuit, such as, sense amplifier unit SAU, which is connected to the memory cell array MCA, manufactured on separate wafers, and by having these wafers bonded. In this connection, a vertical relationship of configurations in the memory cell array MCA is sometimes reversed between the case where the semiconductor substrate Sub shown in FIG. 9, and so on, is taken as reference, and the case where the wafer having the memory cell array MCA formed therein is taken as reference. In FIGS. 16 to 72, the X direction, Y direction, and Z direction are illustrated matching the configurations in the memory cell array MCA.

In same method of manufacturing, as shown in FIG. 16, for example, the plurality of insulating layers 103 and a plurality of sacrifice layers 120A are alternately formed. The sacrifice layer 120A includes the likes of silicon nitride ($Si_3N_4$), for example. This step is performed by the likes of CVD (Chemical Vapor Deposition), for example.

Figure 17:
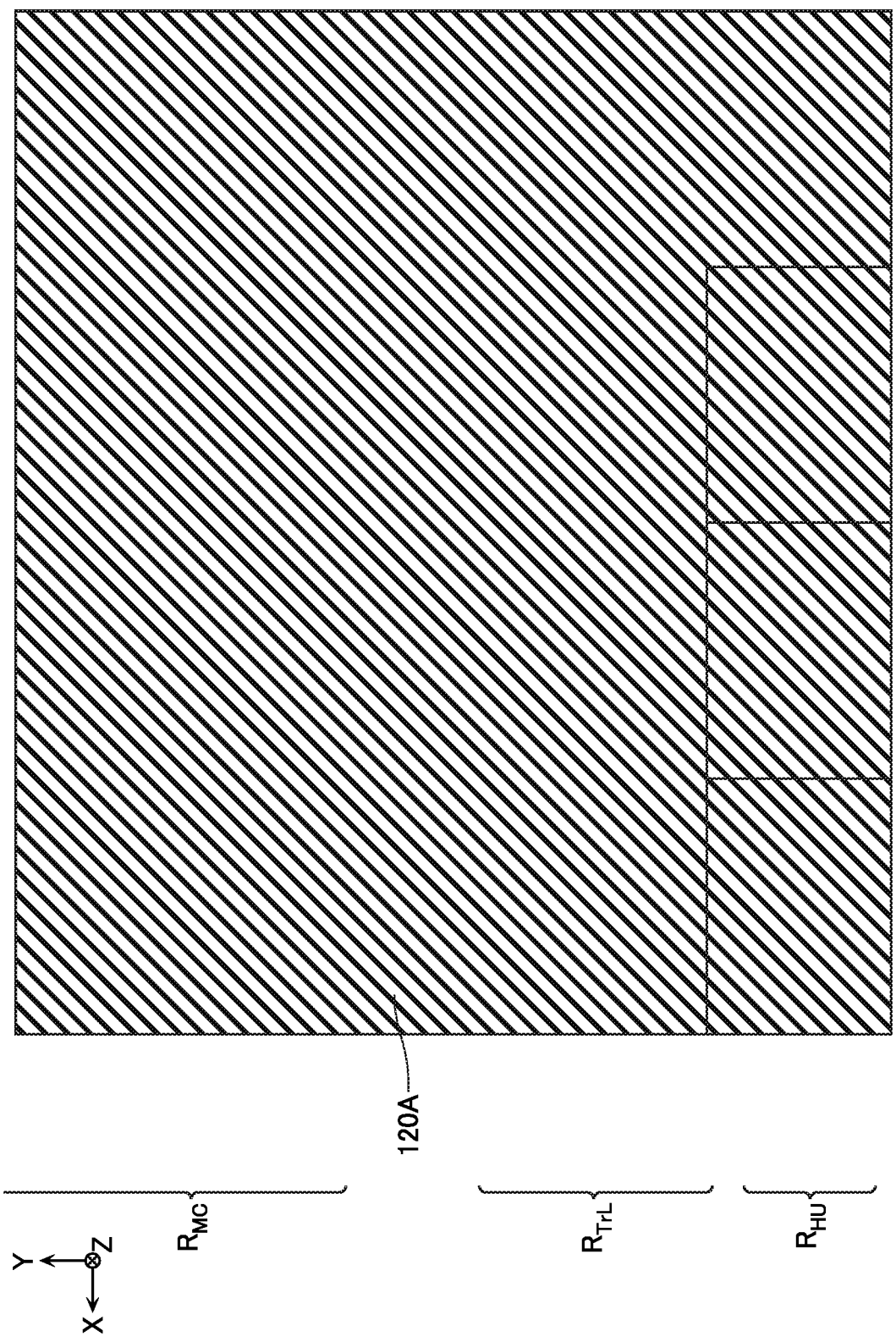
FIG. 17 is a schematic cross-sectional view for explaining same method of manufacturing.

Next, as shown in FIG. 17, for example, in the hookup region $R_{HU}$, parts of the plurality of insulating layers 103 and plurality of sacrifice layers 120A are removed to form a step-like structure.

Figure 18:
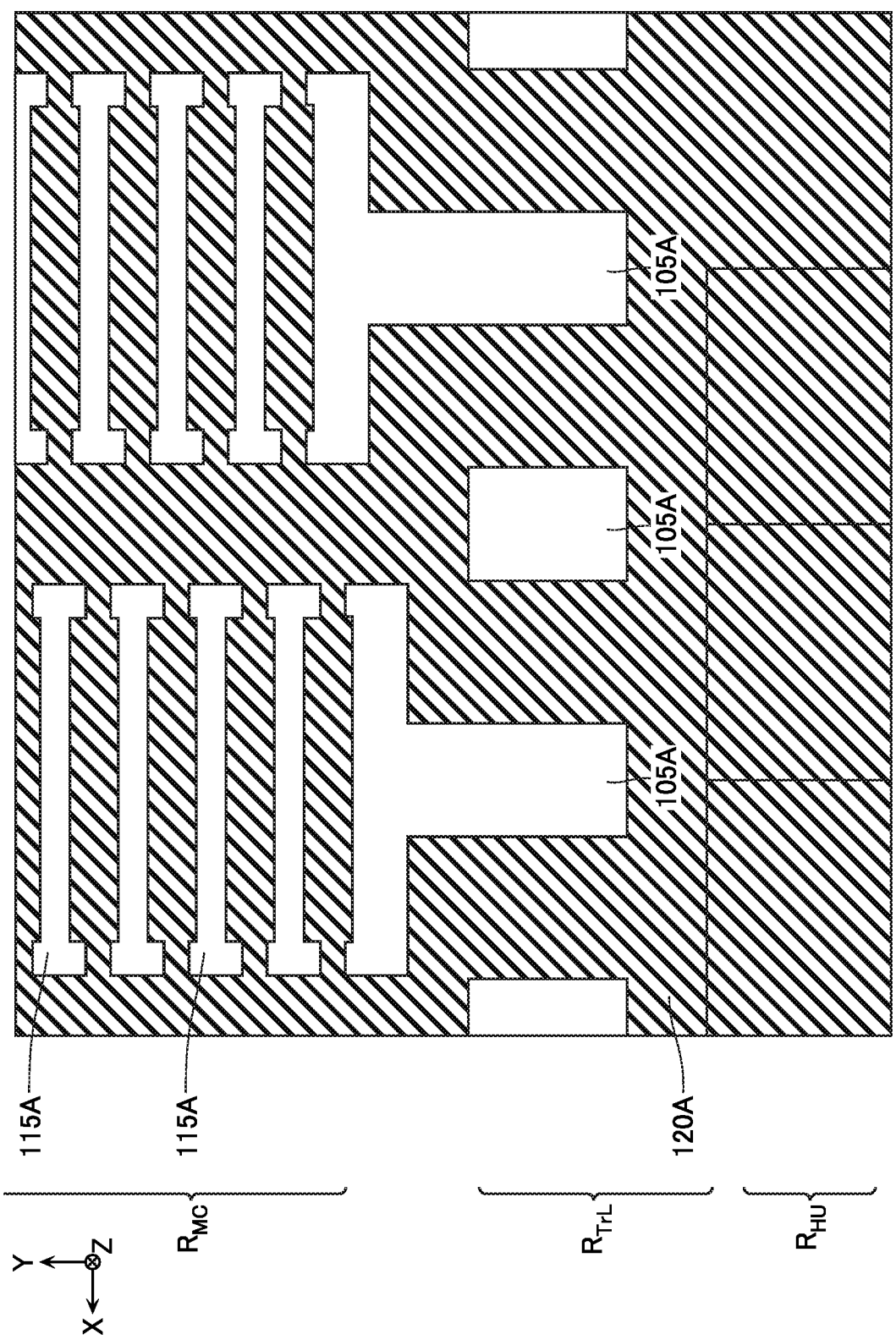
FIG. 18 is a schematic cross-sectional view for explaining same method of manufacturing.
Figure 19:
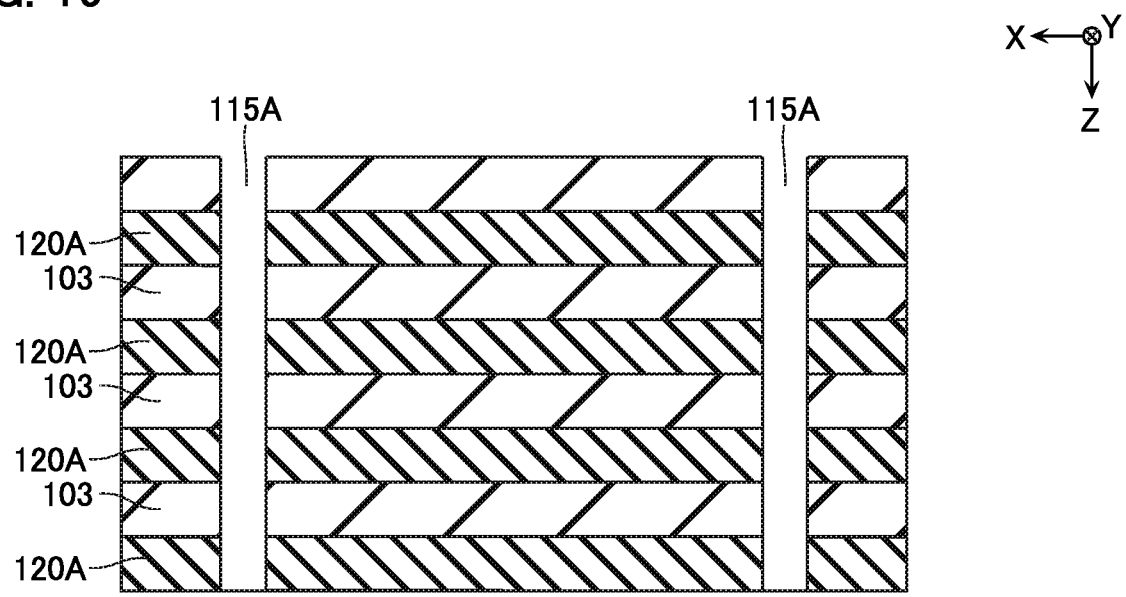
FIG. 19 is a schematic cross-sectional view for explaining same method of manufacturing.
Figure 20:
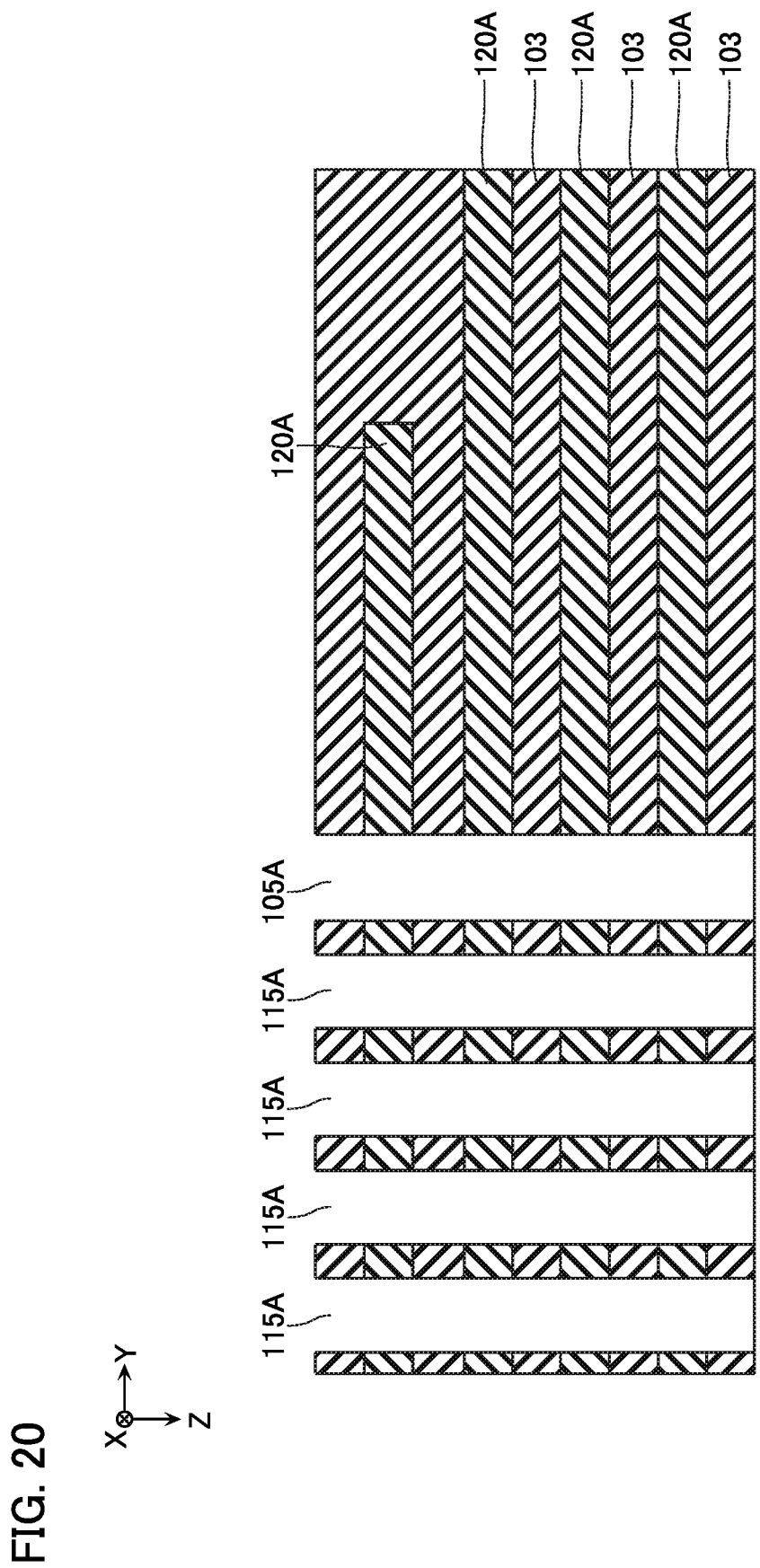
FIG. 20 is a schematic cross-sectional view for explaining same method of manufacturing.

Next, as shown in FIGS. 18 to 20, for example, openings 115A, 105A are formed at positions corresponding to the insulating layers 115, 105. The openings 115A, 105A extend in the Z direction and penetrate the plurality of insulating layers 103 and plurality of sacrifice layers 120A arranged in the Z direction, as shown in FIGS. 19 and 20. This step is performed by the likes of RIE (Reactive Ion Etching), for example.

Figure 21:
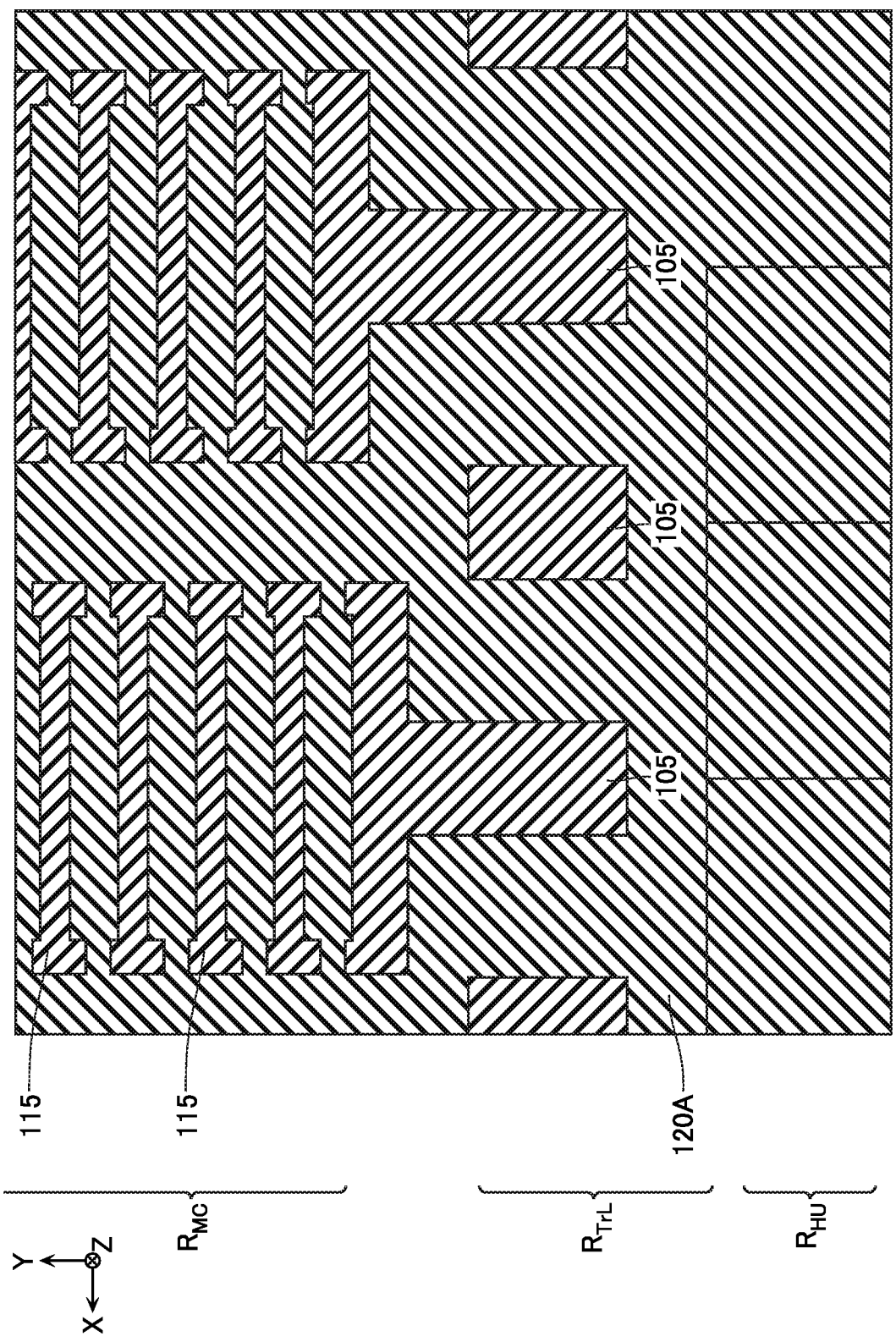
FIG. 21 is a schematic cross-sectional view for explaining same method of manufacturing.
Figure 22:
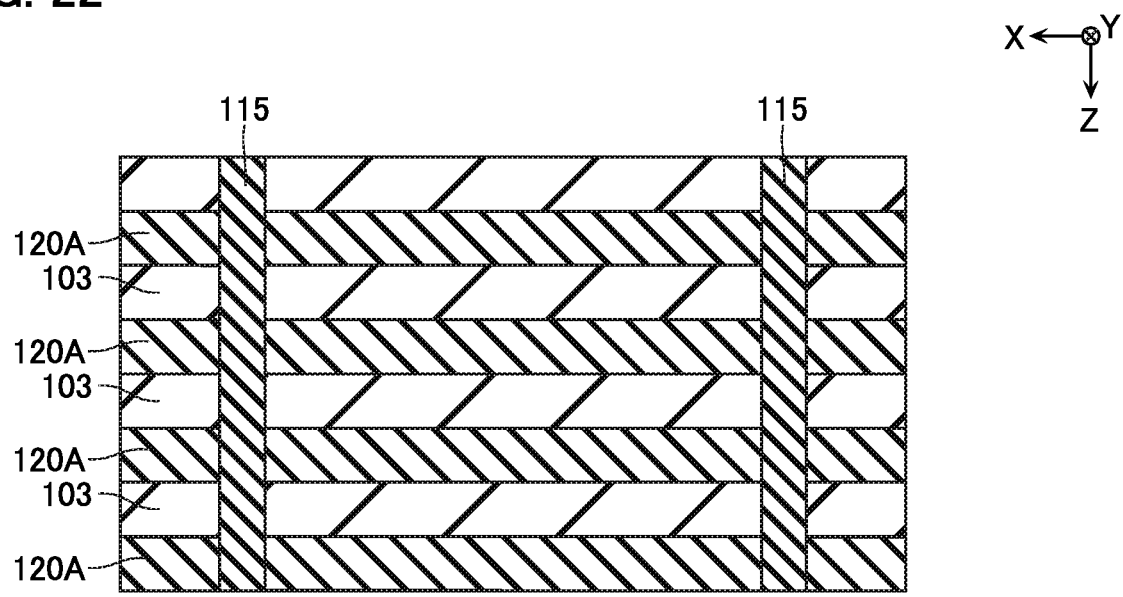
FIG. 22 is a schematic cross-sectional view for explaining same method of manufacturing.
Figure 23:
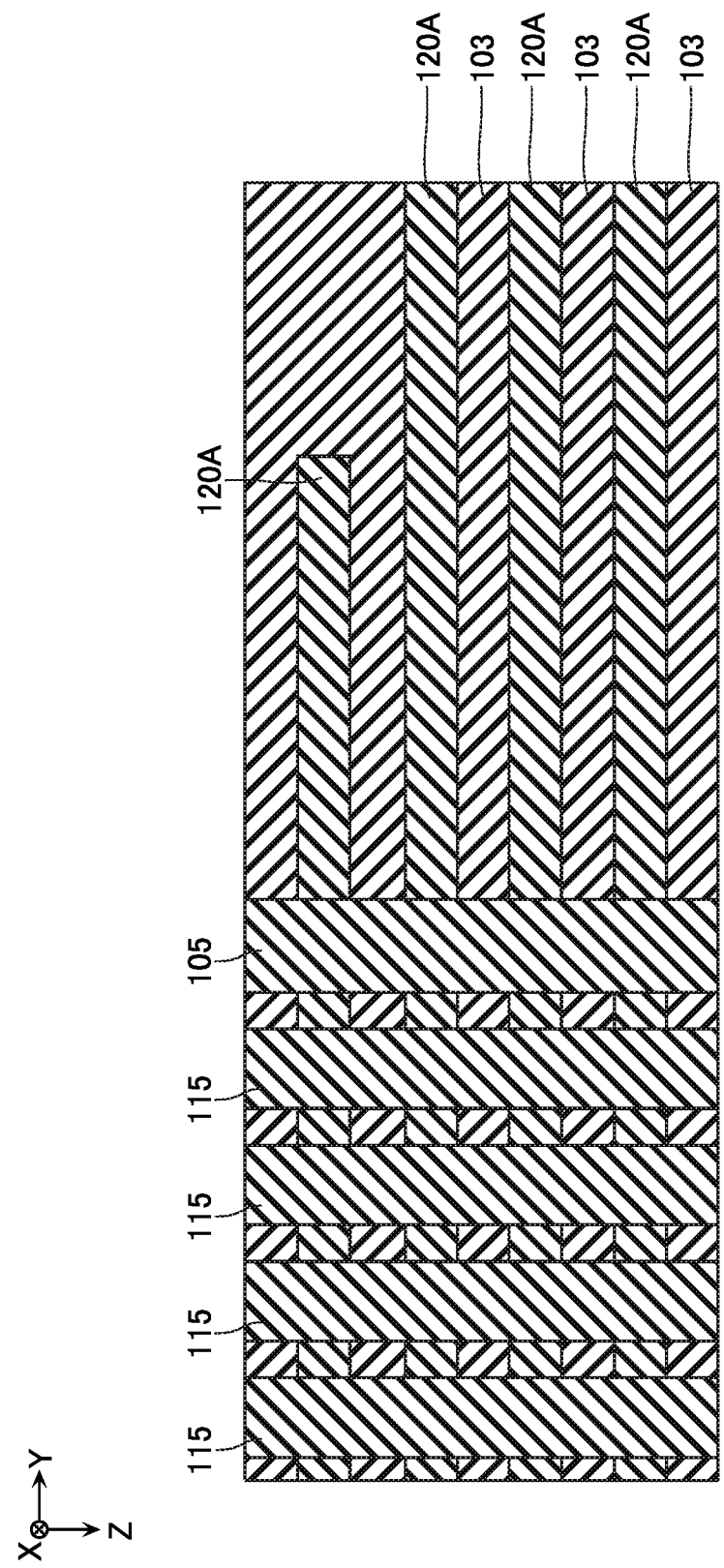
FIG. 23 is a schematic cross-sectional view for explaining same method of manufacturing.

Next, as shown in FIGS. 21 to 23, for example, the insulating layers 115, 105 are formed. This step is performed by the likes of CVD, for example.

Figure 24:
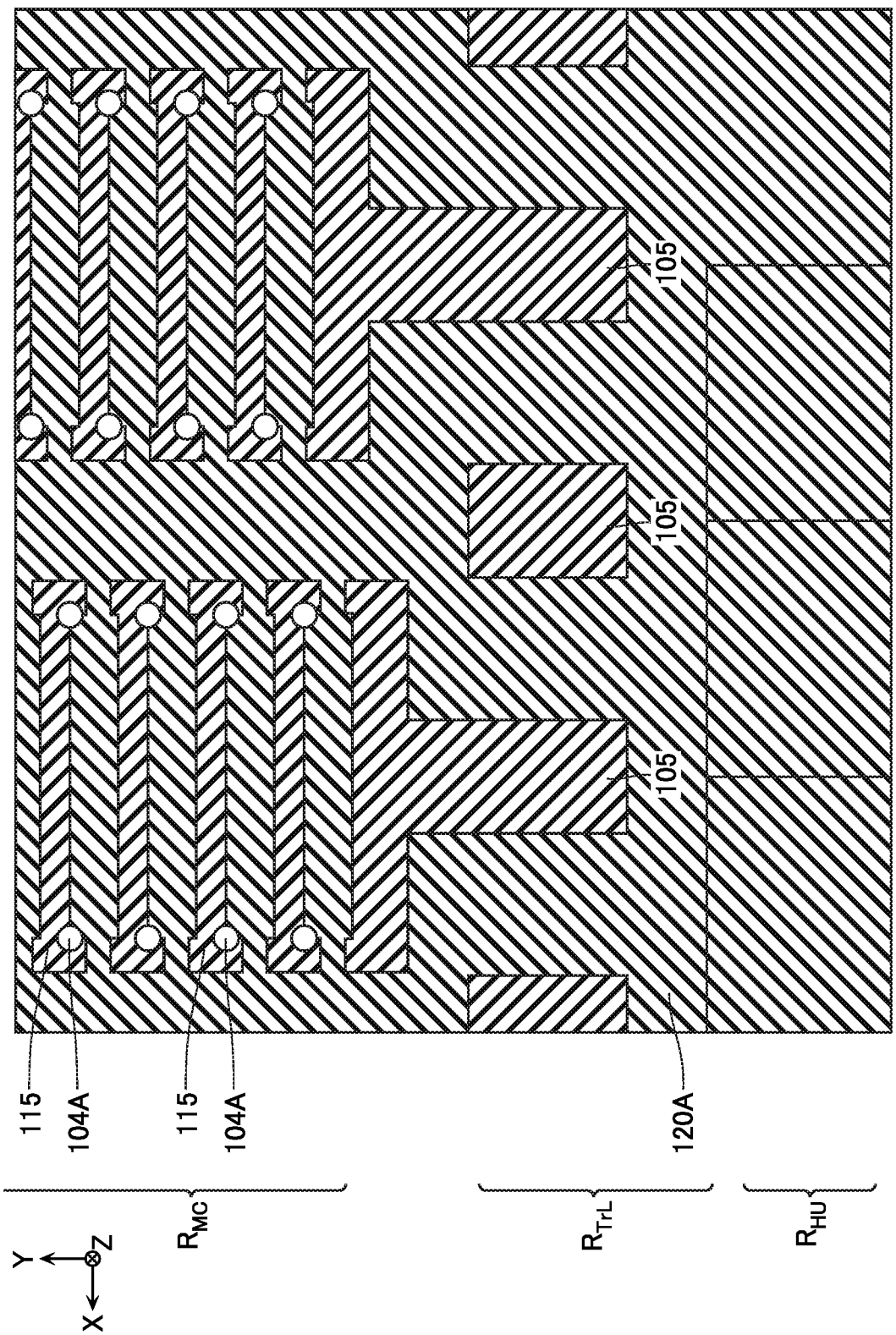
FIG. 24 is a schematic cross-sectional view for explaining same method of manufacturing.
Figure 25:
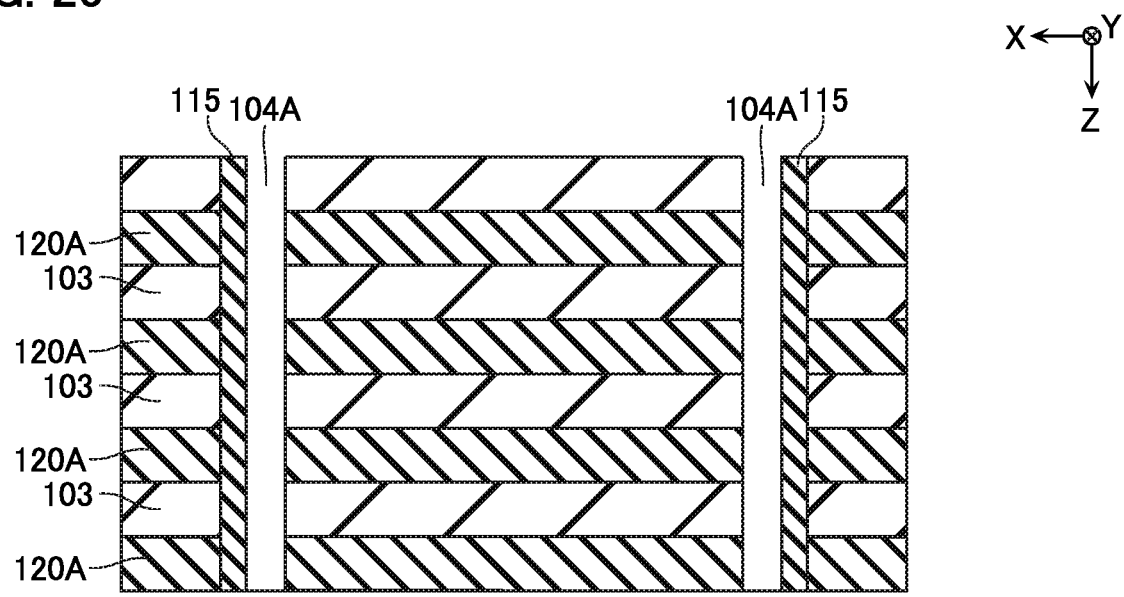
FIG. 25 is a schematic cross-sectional view for explaining same method of manufacturing.

Next, as shown in FIGS. 24 and 25, for example, openings 104A are formed at positions corresponding to the conductive layers 104. The opening 104A extends in the Z direction and penetrates the insulating layer 115 and the plurality of insulating layers 103 and plurality of sacrifice layers 120A arranged in the Z direction, as shown in FIG. 25. This step is performed by the likes of RIE, for example.

Note that in the present embodiment, the opening 104A is formed at a boundary position of the insulating layer 115 and the plurality of insulating layers 103 and the plurality of sacrifice layers 120A arranged in the Z direction. Hence, in the case where an XY cross section including the sacrifice layer 120A is observed, the sacrifice layer 120A will be exposed in a part of an inner peripheral surface of the opening 104A, and the insulating layer 115 will be exposed in the other portion of the inner peripheral surface of the opening 104A, as shown in FIG. 24. Moreover, in the case where an XY cross section including the insulating layer 103 is observed, the insulating layer 103 will be exposed in a part of an inner peripheral surface of the opening 104A, and the insulating layer 115 will be exposed in the other portion of the inner peripheral surface of the opening 104A, although illustration of this is omitted.

Figure 26:
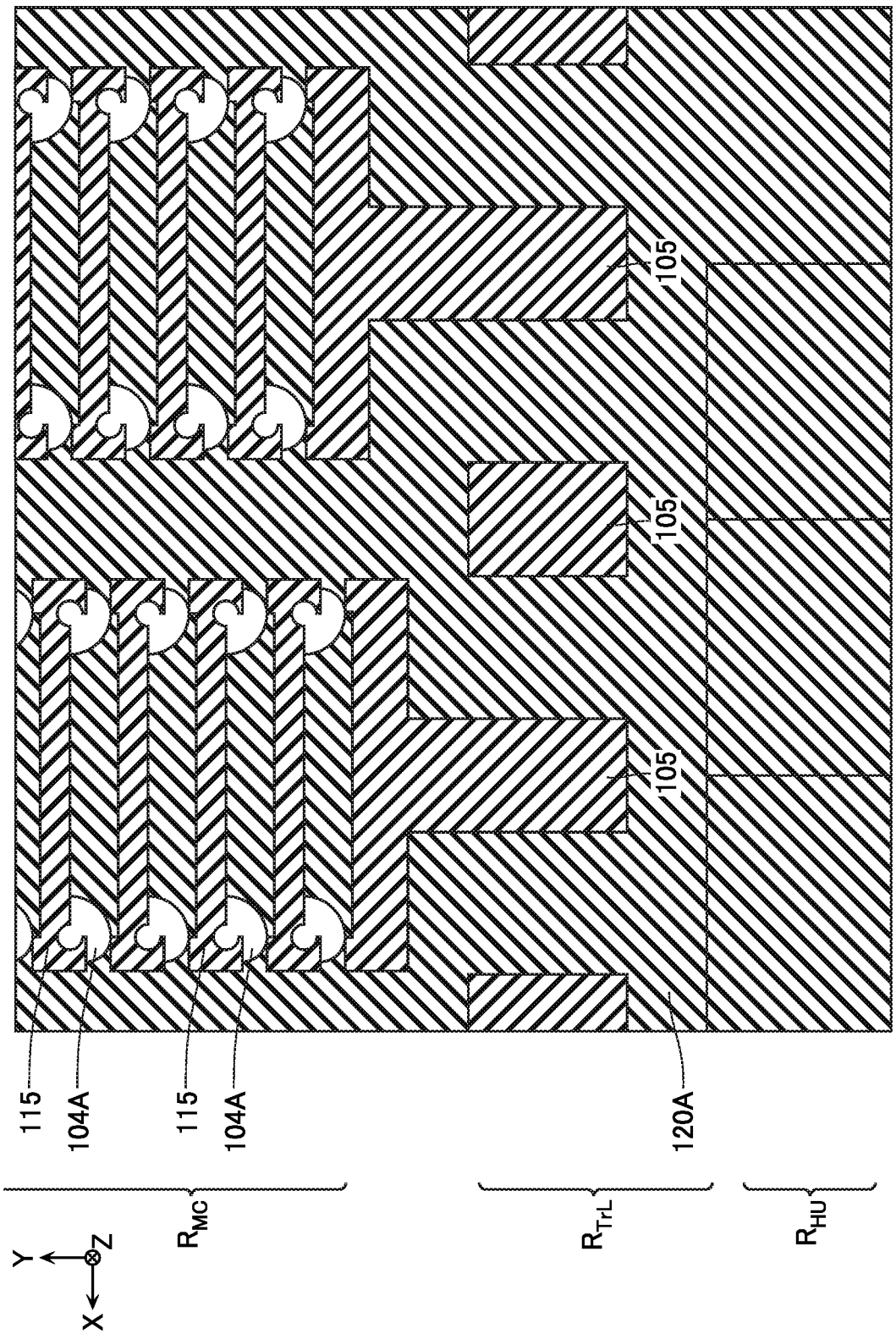
FIG. 26 is a schematic cross-sectional view for explaining same method of manufacturing.
Figure 27:
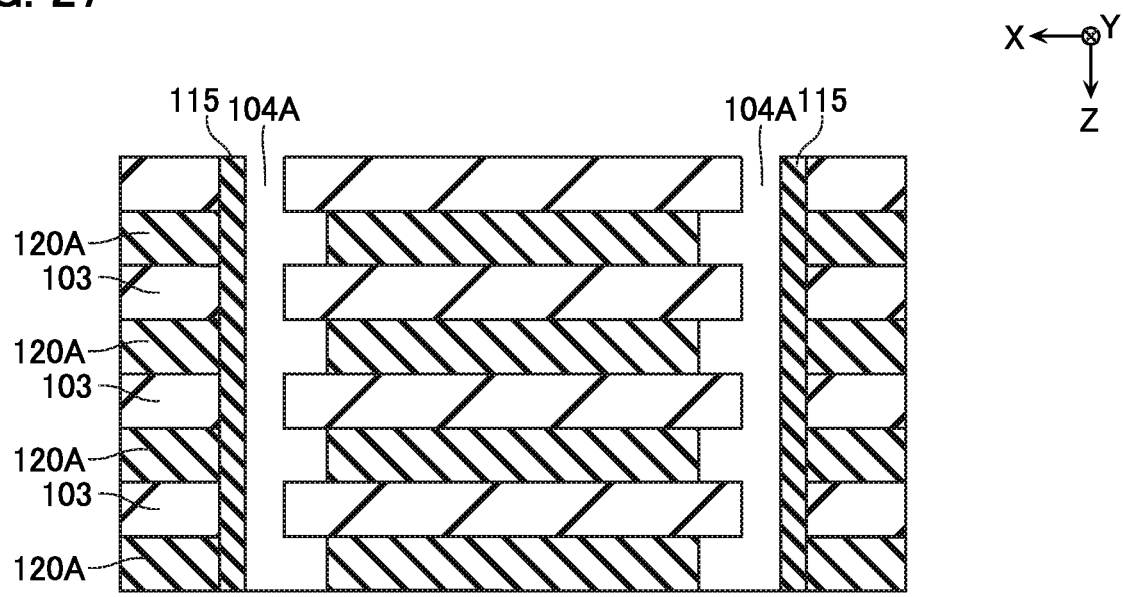
FIG. 27 is a schematic cross-sectional view for explaining same method of manufacturing.

Next, as shown in FIGS. 26 and 27, for example, parts of the sacrifice layers 120A are selectively removed via the opening 104A. This step is performed by the likes of wet etching, for example.

Now, in this step, the parts of the sacrifice layer 120A are removed from positions close to the opening 104A. In the example of FIG. 26, the opening 104A has a circular shape in XY cross section, and a circular region not including the sacrifice layer 120A spreads out centering on a center point of the opening 104A. In this step, parts of two of the insulating layers 115 adjacent in the Y direction are exposed inside the opening 104A, whereby the sacrifice layers 120A are divided in the X direction.

Figure 28:
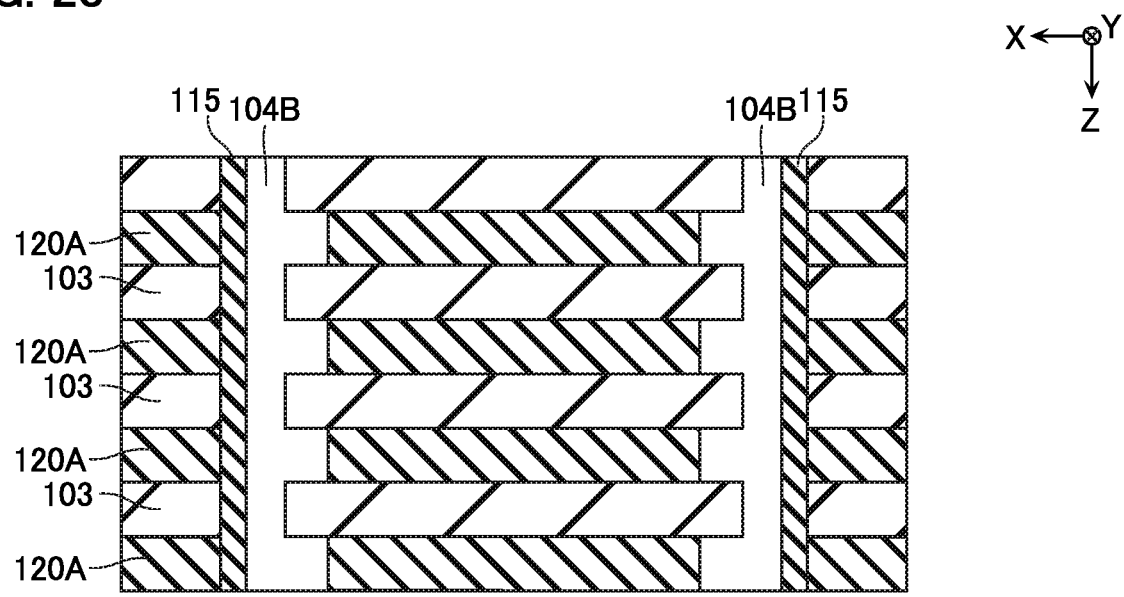
FIG. 28 is a schematic cross-sectional view for explaining same method of manufacturing.

Next, as shown in FIG. 28, for example, a sacrifice layer 104B is formed inside the opening 104A. The sacrifice layer 104B includes the likes of silicon (Si), for example. This step is performed by the likes of CVD, for example.

Figure 29:
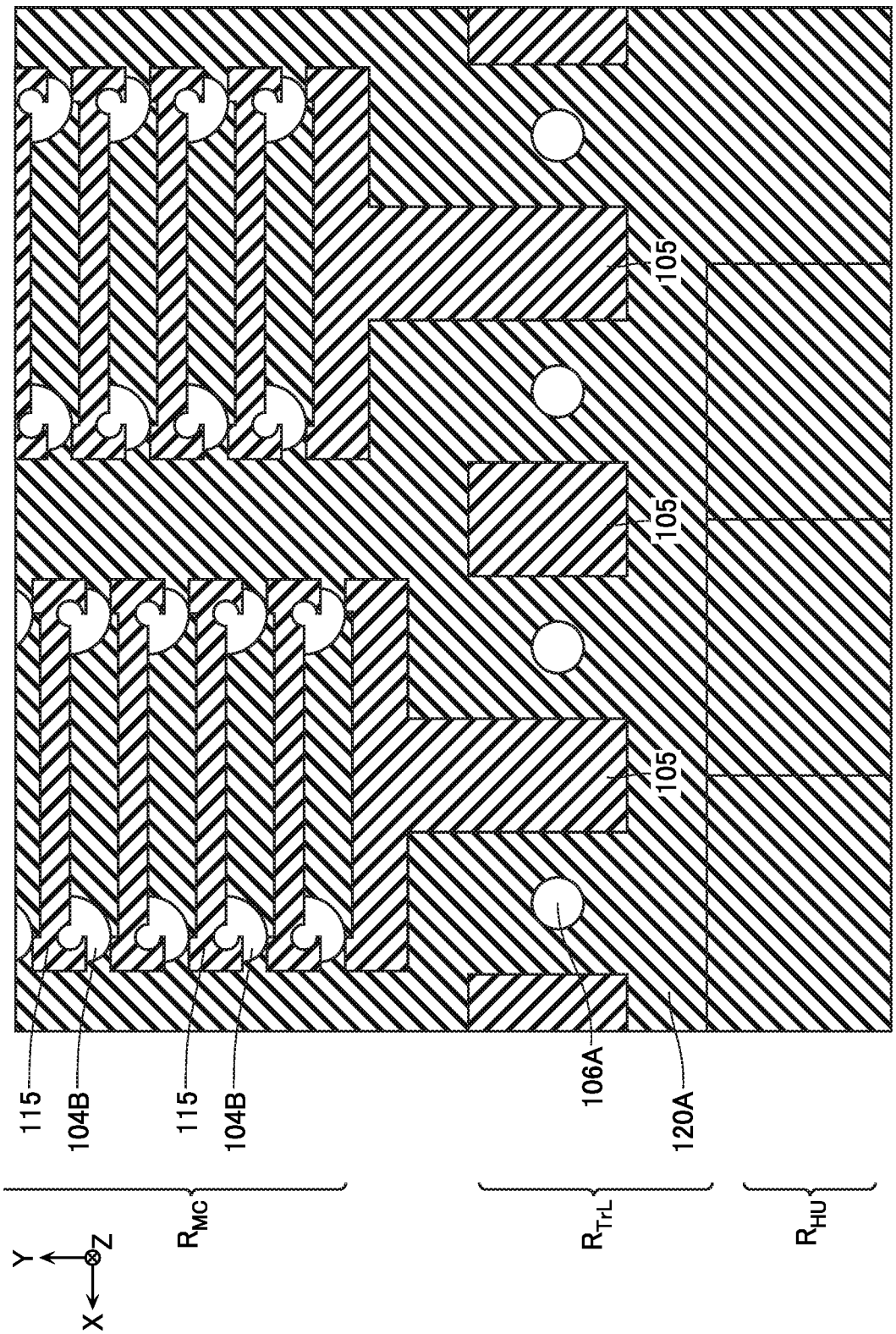
FIG. 29 is a schematic cross-sectional view for explaining same method of manufacturing.
Figure 30:
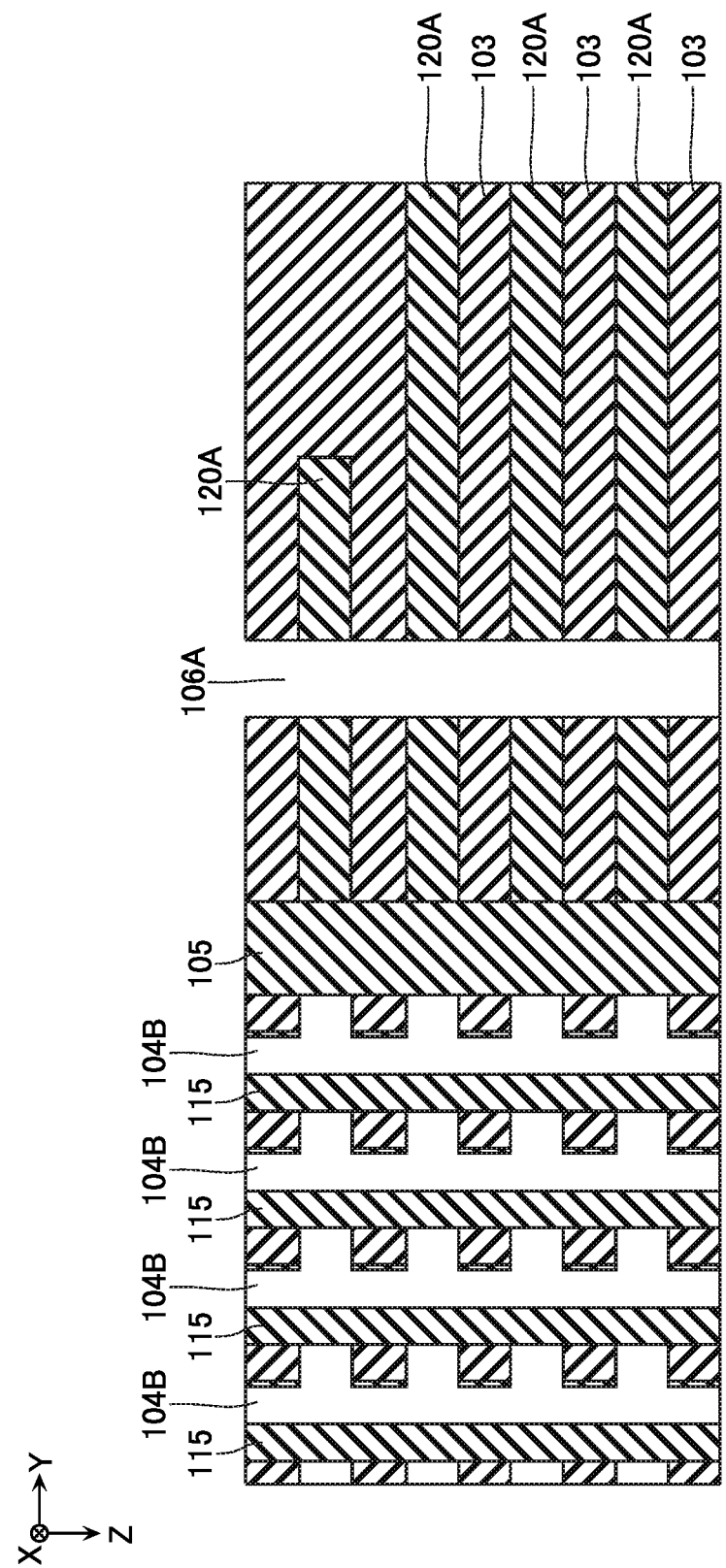
FIG. 30 is a schematic cross-sectional view for explaining same method of manufacturing.

Next, as shown in FIGS. 29 and 30, for example, an opening 106A is formed at a position corresponding to the conductive layer 106. The opening 106A extends in the Z direction and penetrates the plurality of insulating layers 103 and plurality of sacrifice layers 120A arranged in the Z direction, as shown in FIG. 30. This step is performed by the likes of RIE, for example.

Figure 31:
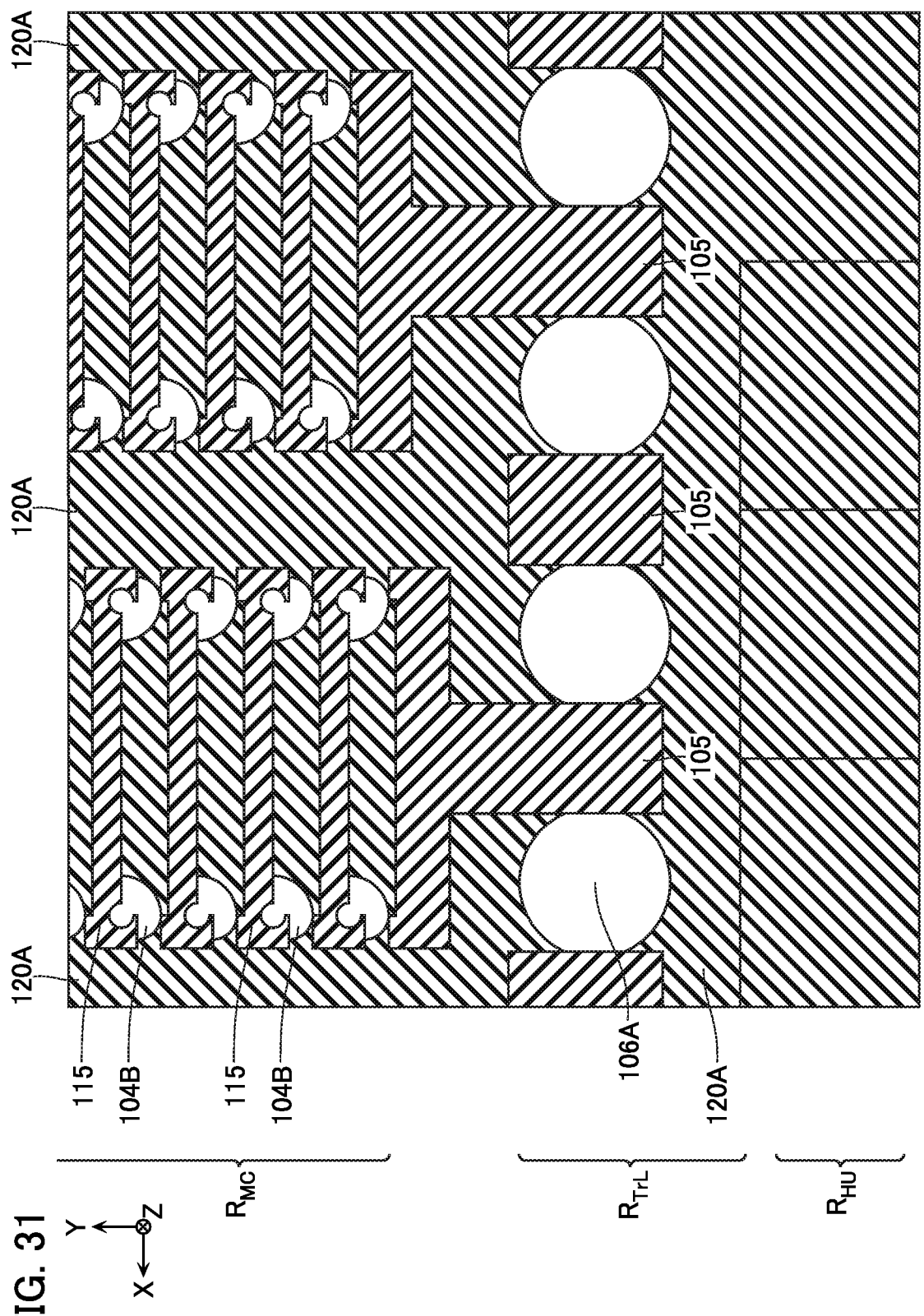
FIG. 31 is a schematic cross-sectional view for explaining same method of manufacturing.
Figure 32:
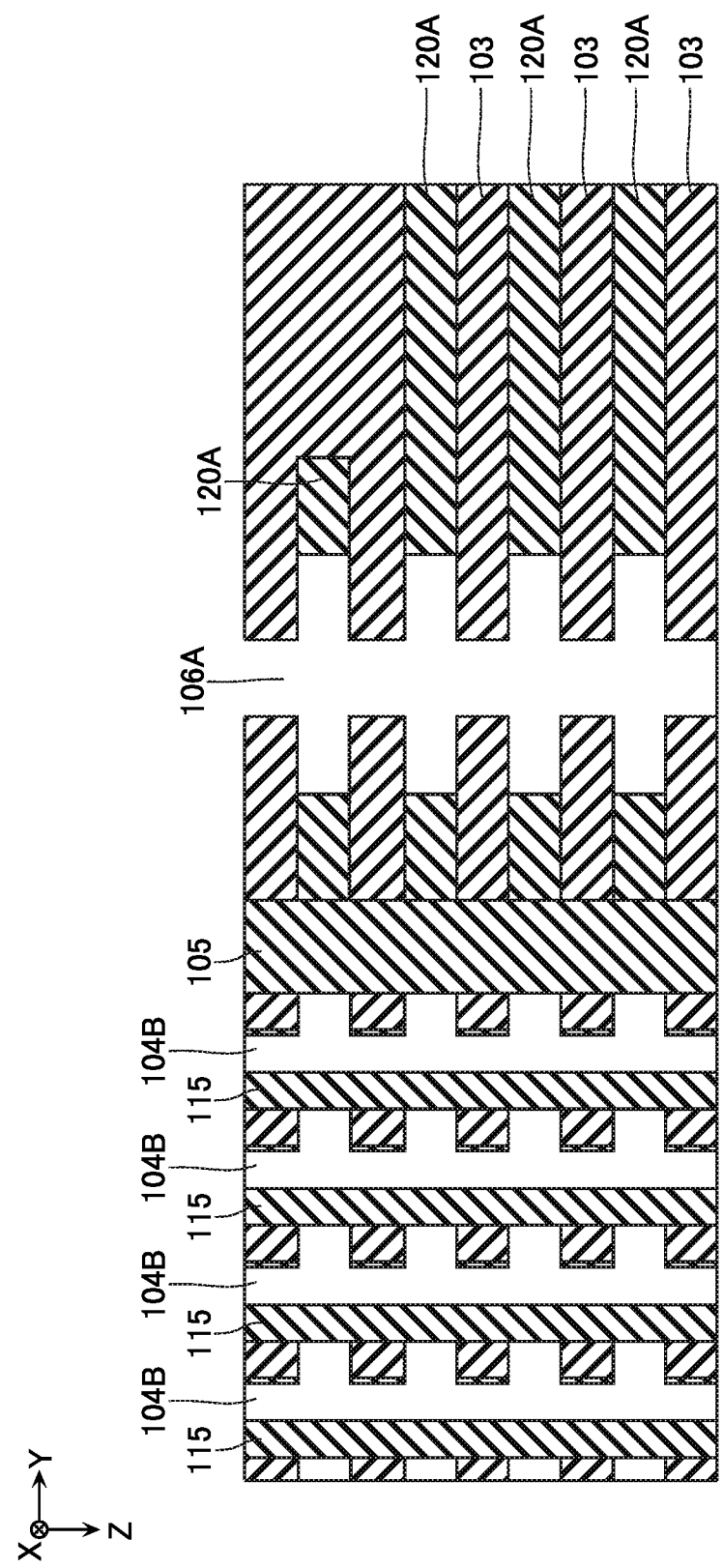
FIG. 32 is a schematic cross-sectional view for explaining same method of manufacturing.

Next, as shown in FIGS. 31 and 32, for example, parts of the sacrifice layers 120A are selectively removed via the opening 106A. In this step, side surfaces in the X direction of two of the insulating layers 105 adjacent in the X direction are exposed inside the opening 106A, whereby the sacrifice layers 120A are divided in the Y direction. This step is performed by the likes of wet etching, for example.

Figure 33:
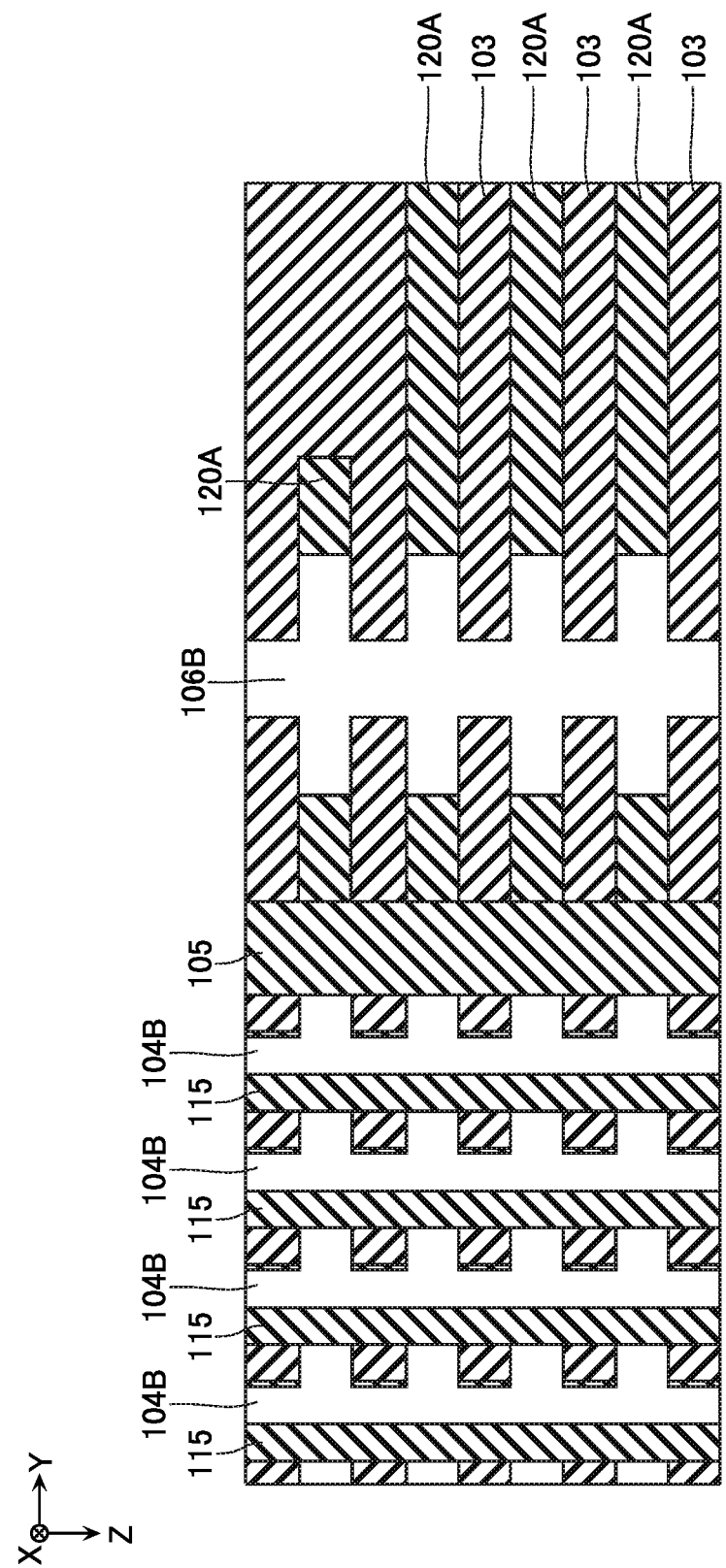
FIG. 33 is a schematic cross-sectional view for explaining same method of manufacturing.

Next, as shown in FIG. 33, for example, a sacrifice layer 106B is formed inside the opening 106A. The sacrifice layer 106B includes the likes of silicon (Si), for example. This step is performed by the likes of CVD, for example.

Figure 34:
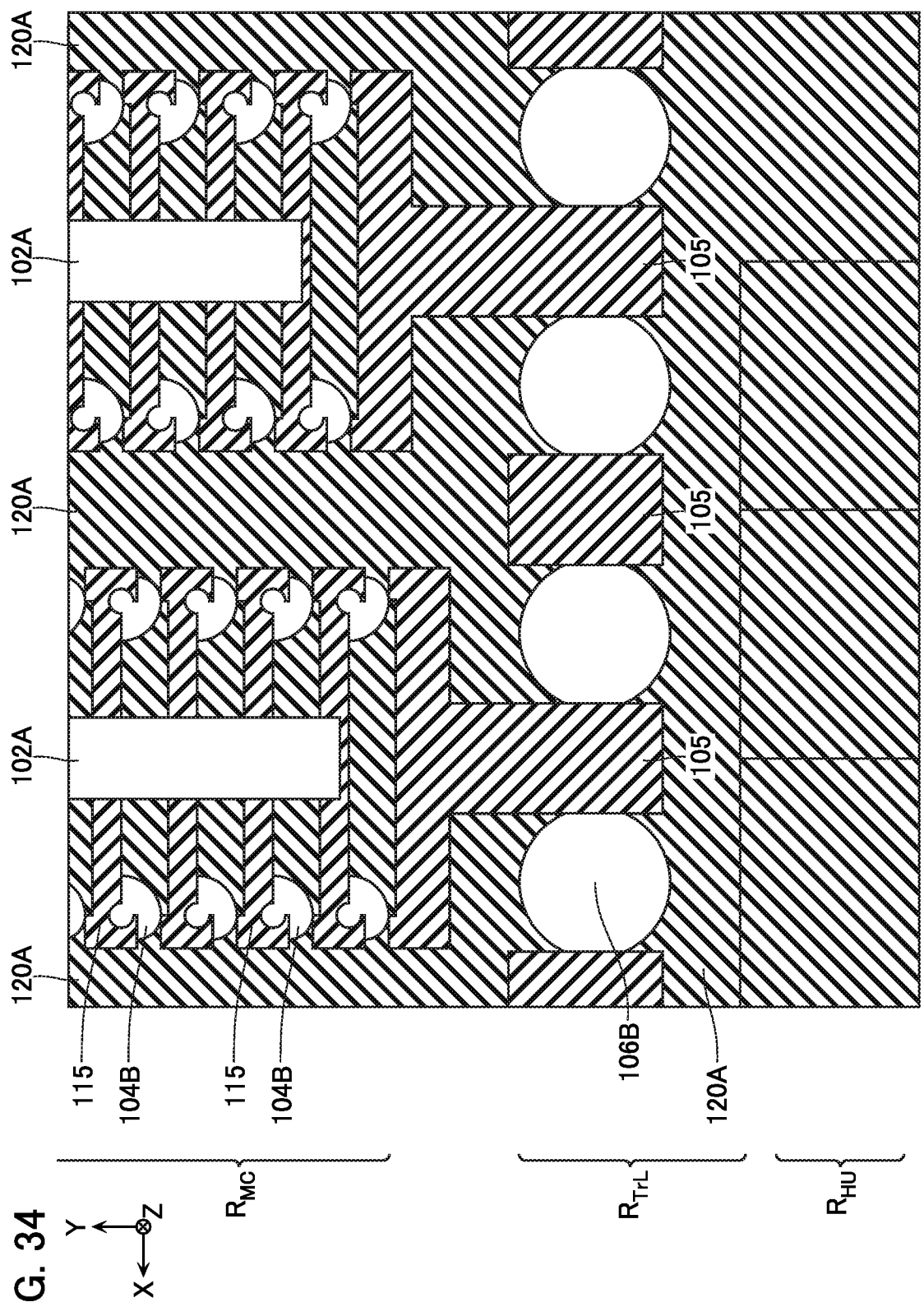
FIG. 34 is a schematic cross-sectional view for explaining same method of manufacturing.
Figure 35:
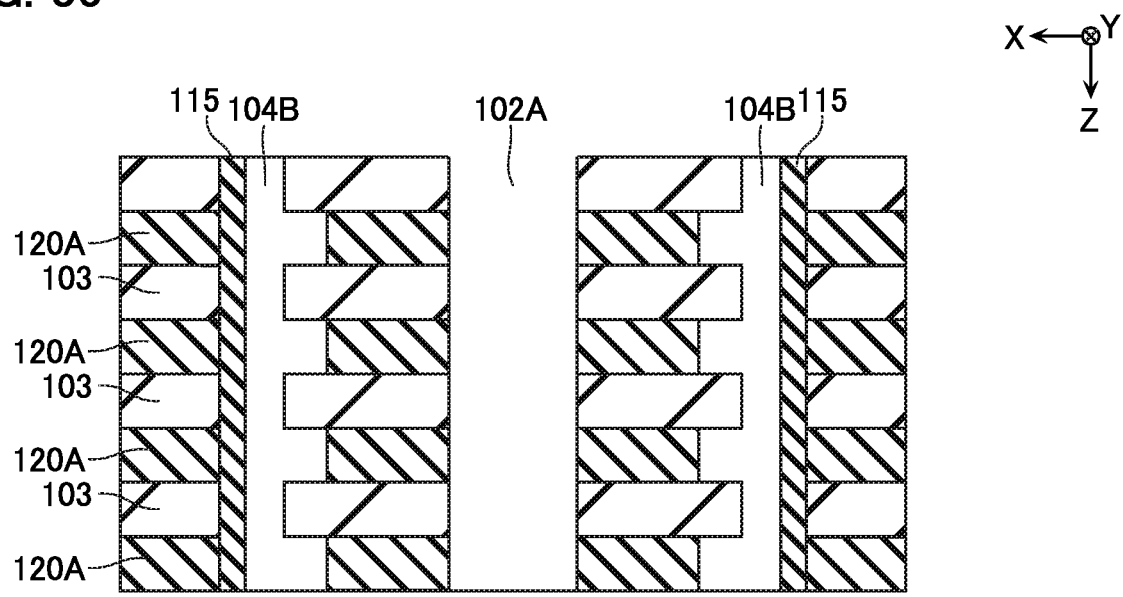
FIG. 35 is a schematic cross-sectional view for explaining same method of manufacturing.

Next, as shown in FIGS. 34 and 35, for example, openings 102A are formed at positions corresponding to the conductive layers 102. The opening 102A extends in the Z direction and penetrates the plurality of insulating layers 103 and plurality of sacrifice layers 120A arranged in the Z direction, thereby dividing these configurations in the X direction, as shown in FIG. 35. This step is performed by the likes of RIE, for example.

Figure 36:
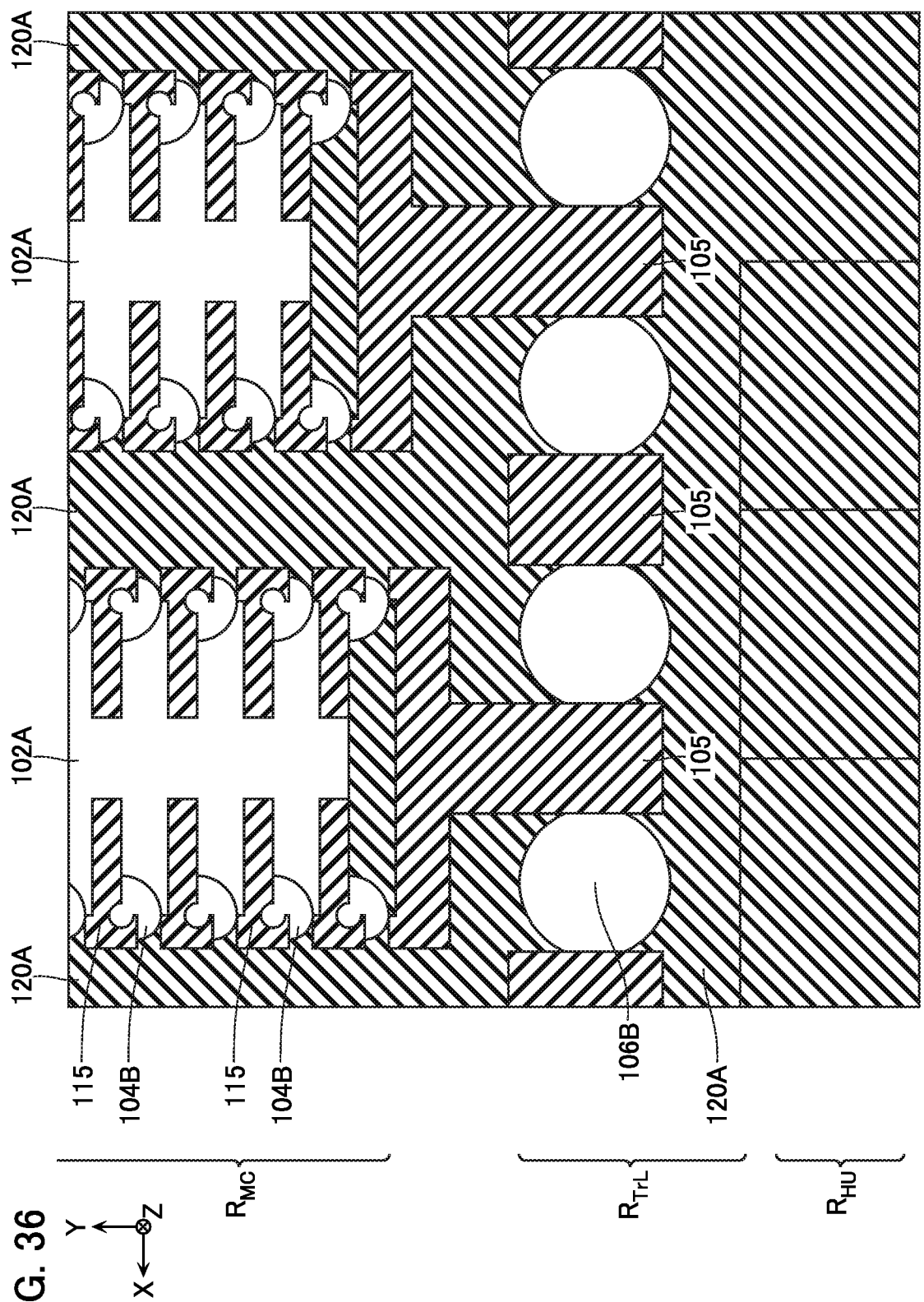
FIG. 36 is a schematic cross-sectional view for explaining same method of manufacturing.
Figure 37:
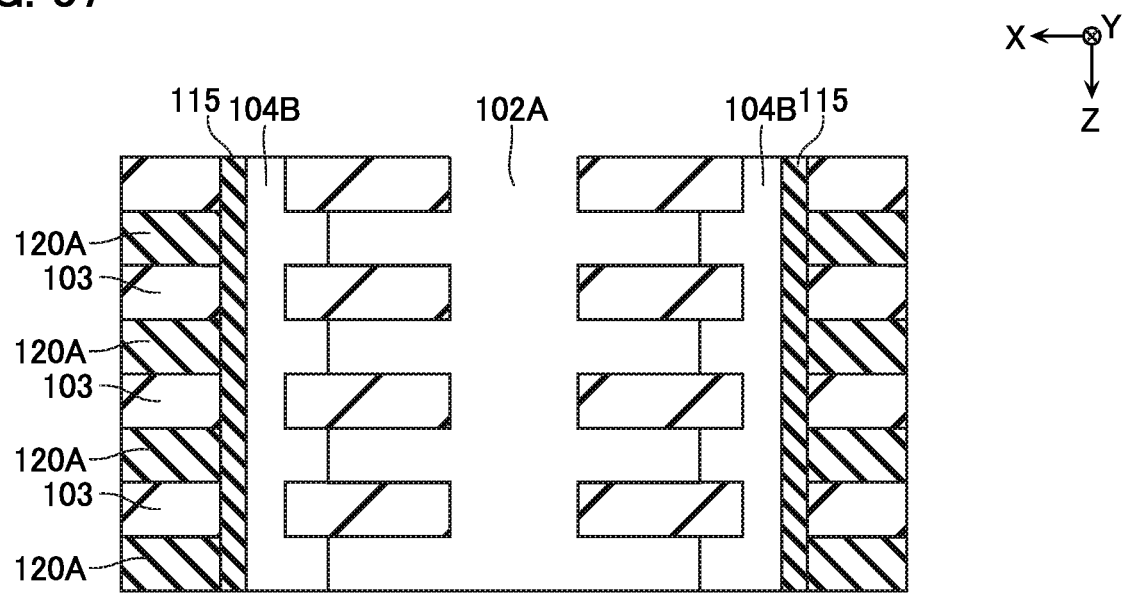
FIG. 37 is a schematic cross-sectional view for explaining same method of manufacturing.

Next, as shown in FIGS. 36 and 37, for example, parts of the sacrifice layers 120A are selectively removed via the opening 102A. In this step, side surfaces of the sacrifice layers 104B are exposed inside the openings 102A. This step is performed by the likes of wet etching, for example.

Figure 38:
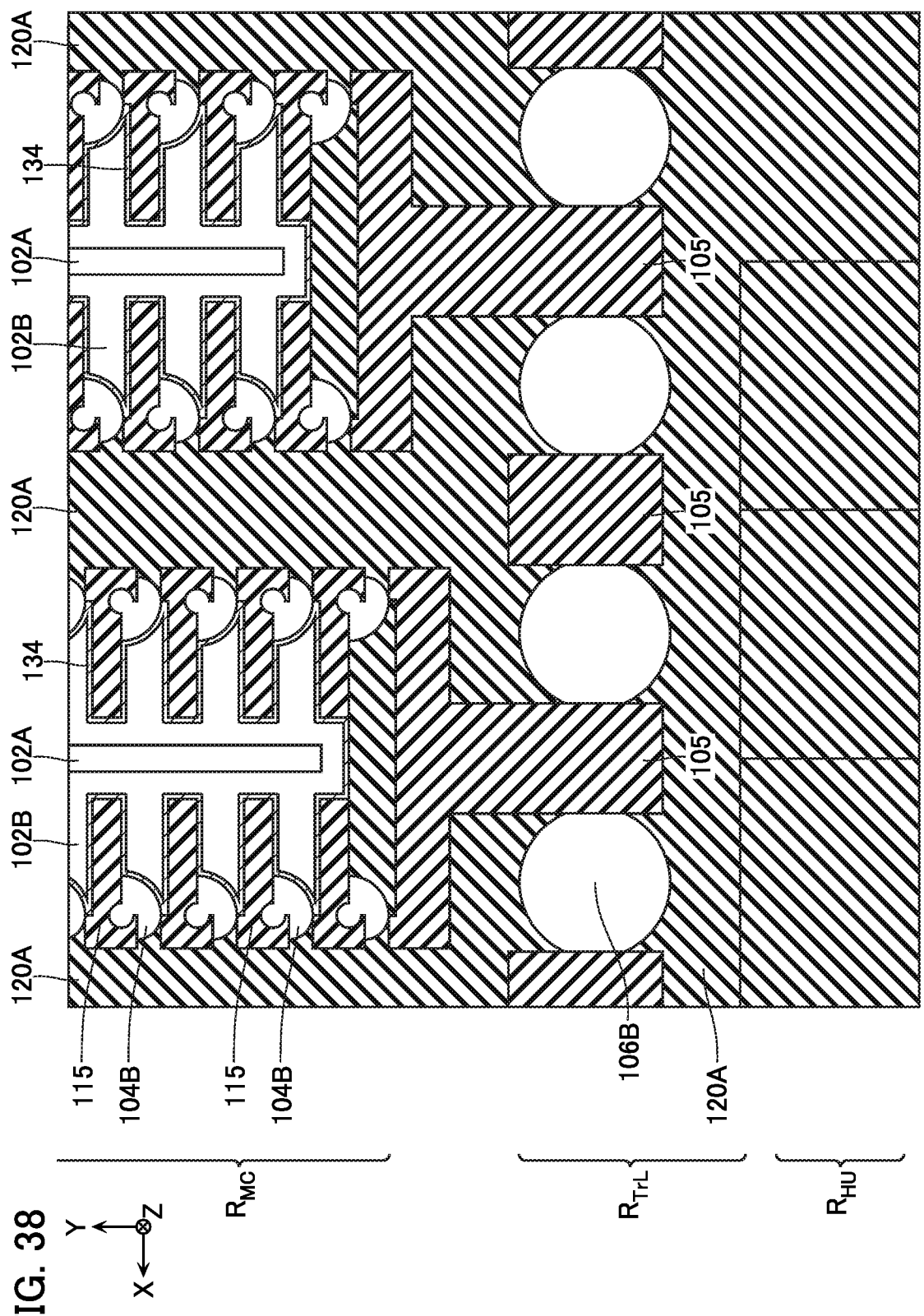
FIG. 38 is a schematic cross-sectional view for explaining same method of manufacturing.
Figure 39:
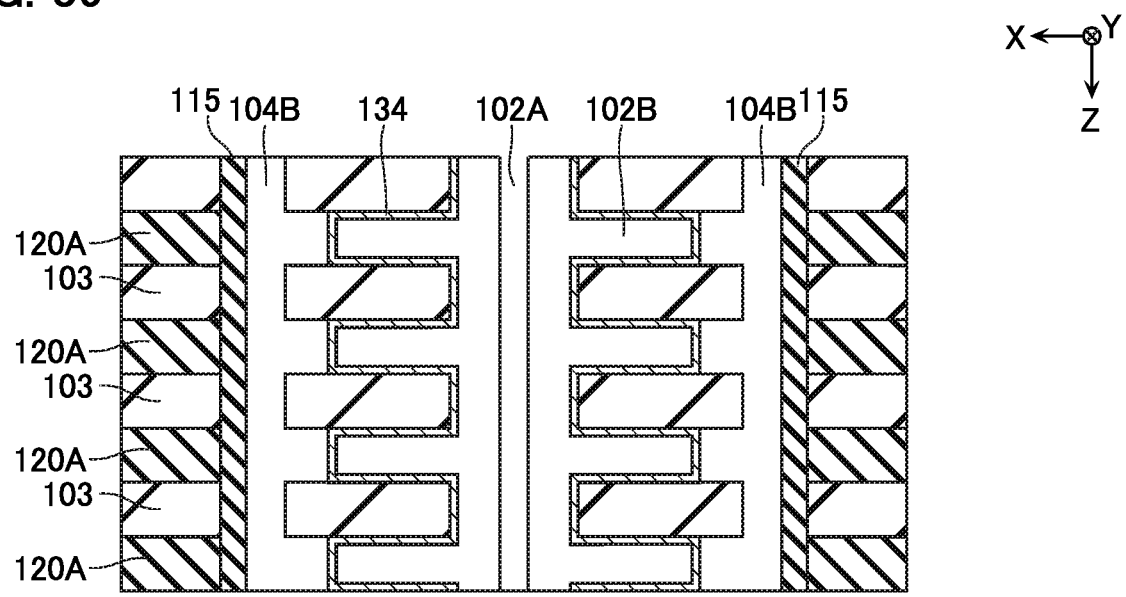
FIG. 39 is a schematic cross-sectional view for explaining same method of manufacturing.

Next, as shown in FIGS. 38 and 39, for example, the conductive layers 134 are formed on the side surfaces of the sacrifice layers 104B, side surfaces of the insulating layers 115 in the X direction and Y direction, upper surfaces of the insulating layers 103, lower surfaces of the insulating layers 103, and side surfaces of the insulating layer 103 in the X direction (FIG. 39), via the openings 102A. In addition, sacrifice layers 102B are formed inside the openings 102A. The sacrifice layer 102B includes the likes of silicon (Si), for example. In this step, as shown in FIG. 39, for example, a region between two of the insulating layers 103 adjacent in the Z direction is filled in by the sacrifice layer 102B. On the other hand, a region between two of the insulating layers 103 adjacent in the X direction is not filled in by the sacrifice layer 102B. This step is performed by the likes of ALD (Atomic Layer Deposition) and CVD, for example.

Figure 40:
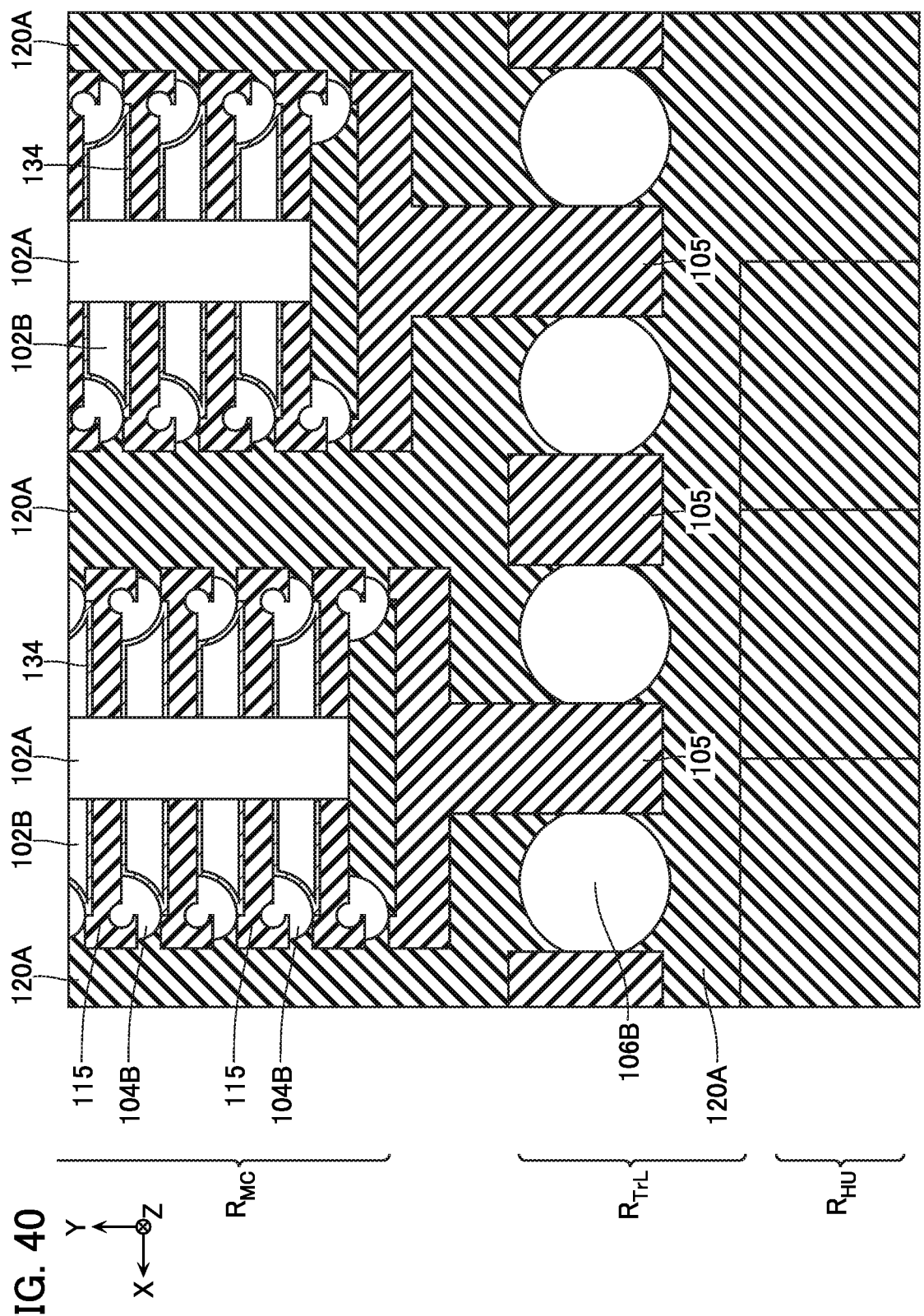
FIG. 40 is a schematic cross-sectional view for explaining same method of manufacturing.
Figure 41:
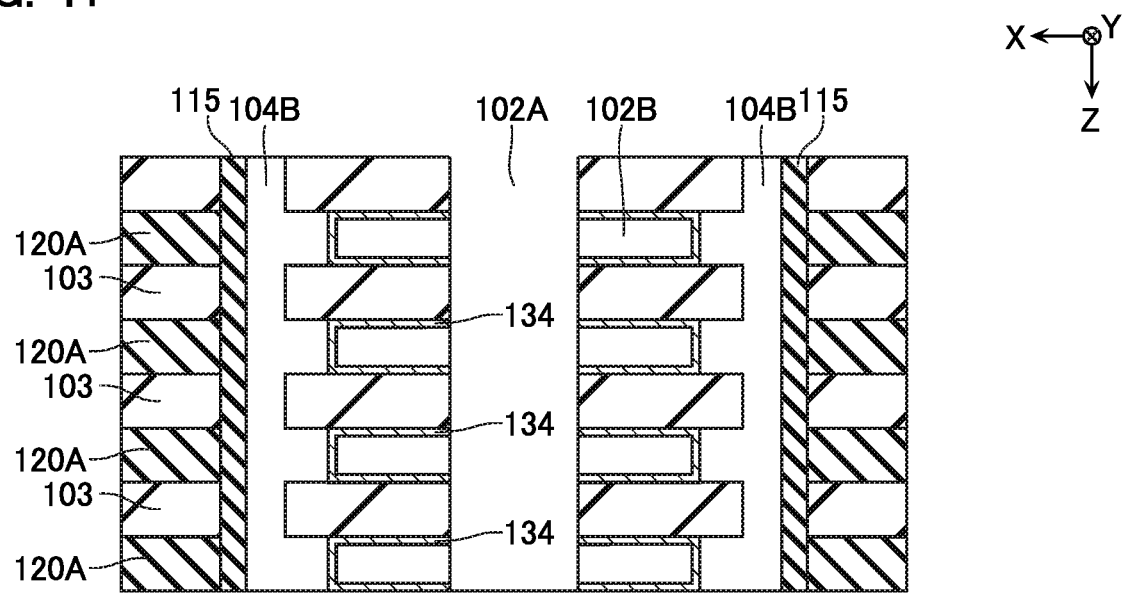
FIG. 41 is a schematic cross-sectional view for explaining same method of manufacturing.

Next, as shown in FIGS. 40 and 41, for example, parts of the sacrifice layers 102B and the conductive layers 134 are removed via the opening 102A. In this step, for example, the parts of the sacrifice layers 102B are removed to expose portions of the conductive layer 134 provided on side surfaces of the insulating layers 115 (FIG. 40) in the X direction and side surfaces of insulating layer 103 (FIG. 41) in the X direction. Additionally, these exposed portions of the conductive layers 134 are removed. This step is performed by the likes of wet etching, for example.

Figure 42:
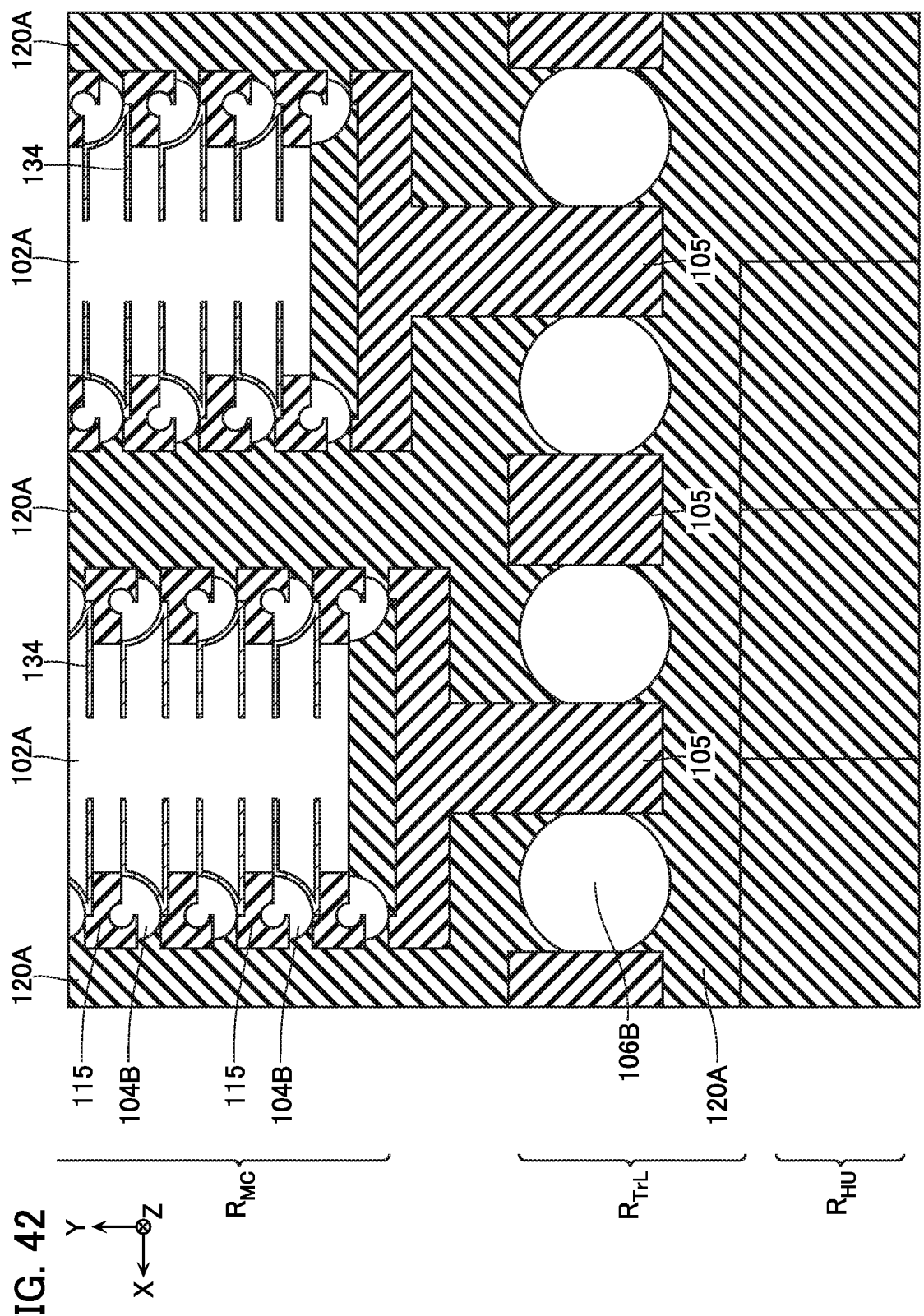
FIG. 42 is a schematic cross-sectional view for explaining same method of manufacturing.
Figure 43:
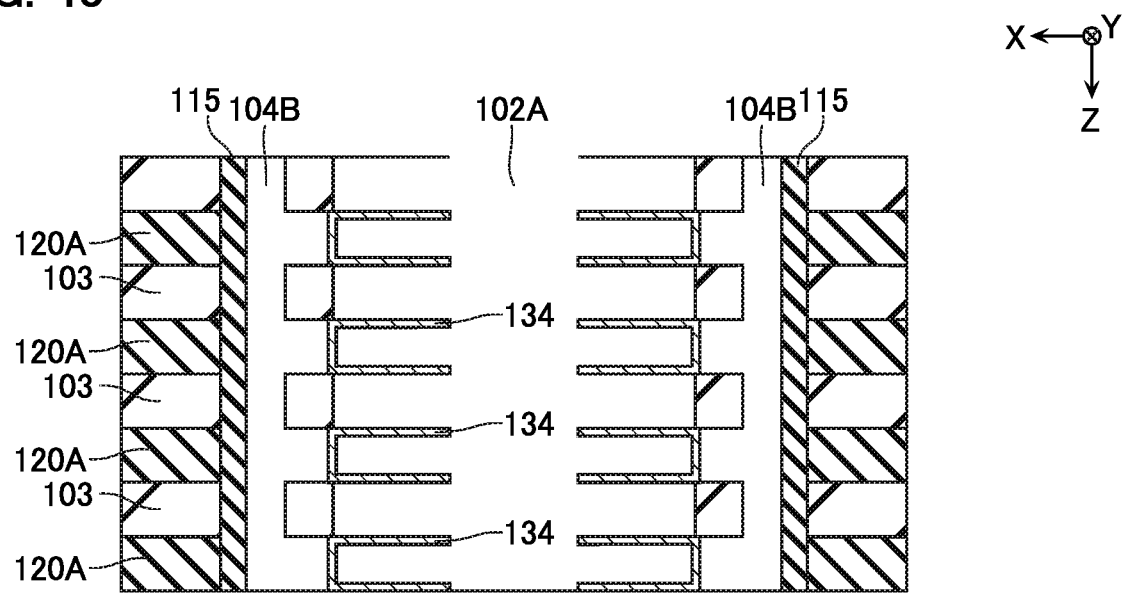
FIG. 43 is a schematic cross-sectional view for explaining same method of manufacturing.

Next, as shown in FIGS. 42 and 43, for example, the sacrifice layers 102B, parts of the insulating layers 115 (FIG. 42), and parts of the insulating layers 103 (FIG. 43) are removed via the openings 102A. In this step, the sacrifice layers 102B are completely removed. Moreover, the insulating layers 115 (FIG. 42) and the insulating layers 103 (FIG. 43) are removed in a range sufficient to prevent the sacrifice layers 104B from being exposed in the openings 102A. This step is performed by the likes of wet etching, for example.

Figure 44:
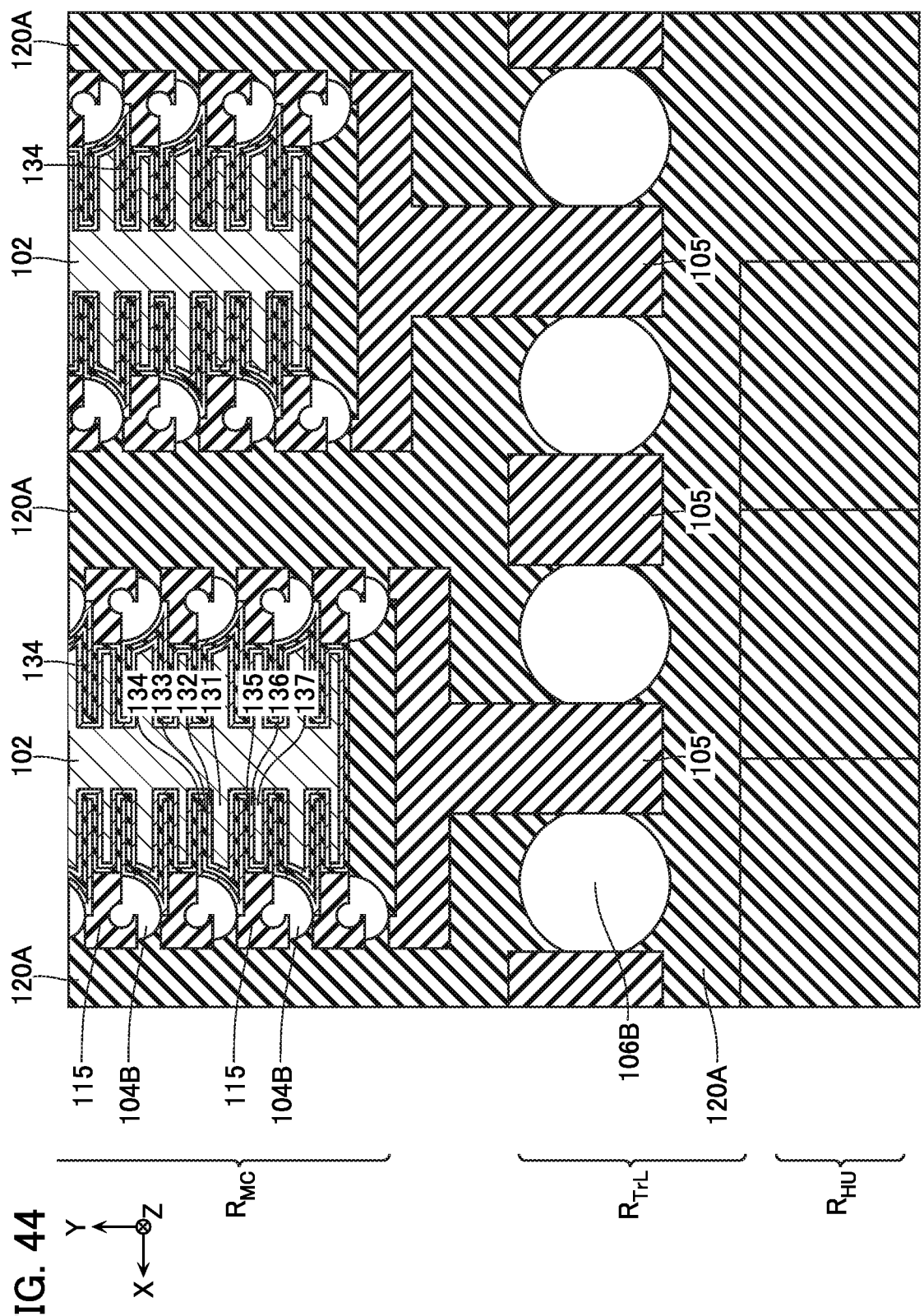
FIG. 44 is a schematic cross-sectional view for explaining same method of manufacturing.
Figure 45:
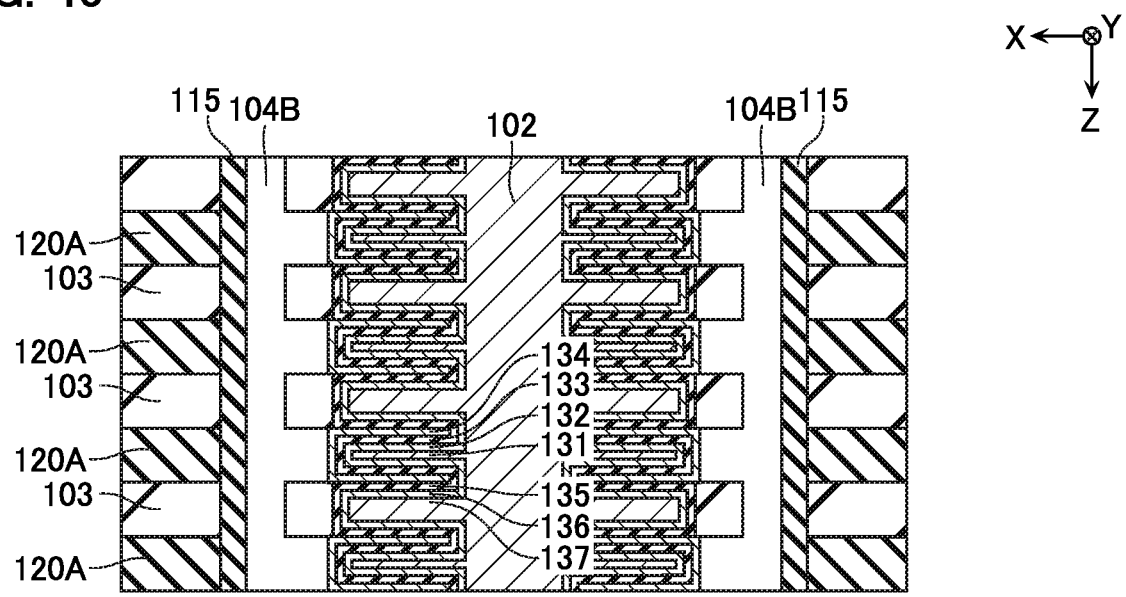
FIG. 45 is a schematic cross-sectional view for explaining same method of manufacturing.

Next, as shown in FIGS. 44 and 45, for example, the insulating layers 133, 135, conductive layers 132, 136, and conductive layers 131, 137, 102 are formed on the upper surfaces, the lower surfaces, the side surfaces in the X direction, and side surfaces in the Y direction, of the conductive layers 134, via the openings 102A. This step is performed by the likes of CVD, for example.

Figure 46:
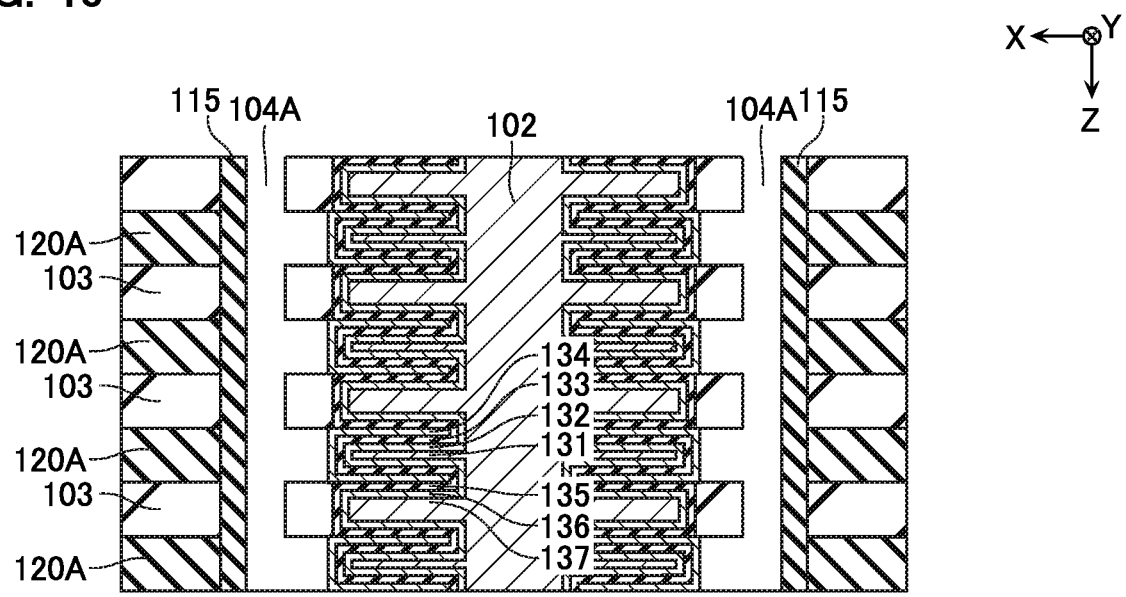
FIG. 46 is a schematic cross-sectional view for explaining same method of manufacturing.

Next, as shown in FIG. 46, for example, the sacrifice layer 104B is removed. This step is performed by the likes of wet etching, for example.

Figure 47:
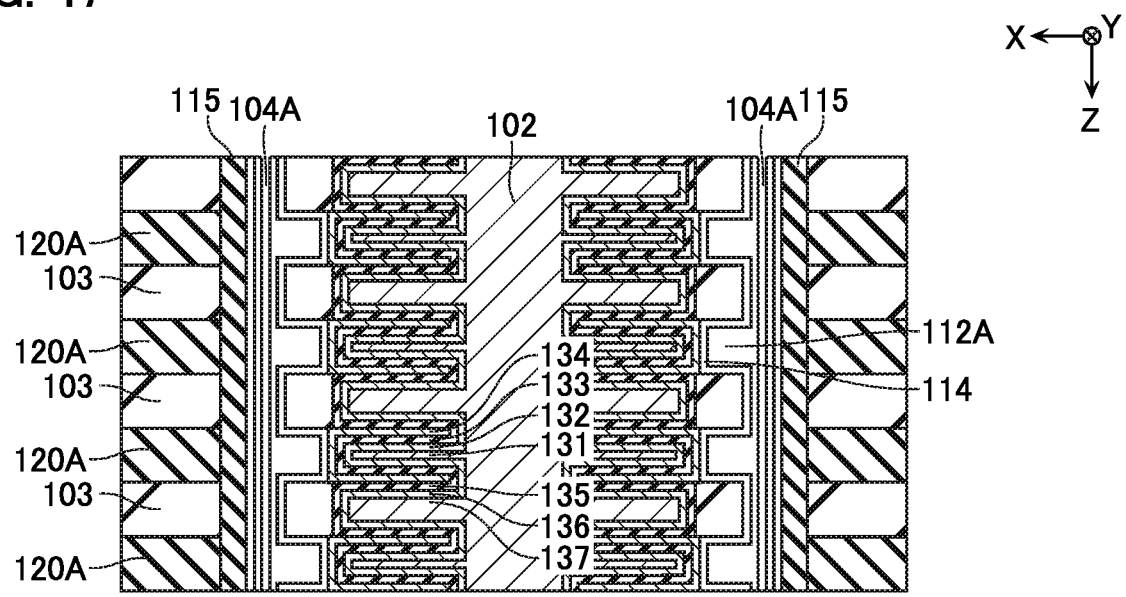
FIG. 47 is a schematic cross-sectional view for explaining same method of manufacturing.

Next, as shown in FIG. 47, for example, the semiconductor layers 114 are formed on side surfaces of the sacrifice layers 120A in the X direction, side surfaces of the conductive layers 134 in the X direction, side surfaces of the insulating layer 115, and upper surfaces, lower surfaces, and inner peripheral surfaces of the insulating layers 103, via the openings 104A. In addition, sacrifice layers 112A are formed in regions between two of the insulating layers 103 adjacent in the Z direction. In this step, as shown in FIG. 47, for example, the region between two of the insulating layers 103 adjacent in the Z direction is filled in by the sacrifice layer 112A. On the other hand, the opening 104A is not filled in by the sacrifice layer 112A. This step is performed by the likes of ALD and CVD, for example.

Figure 48:
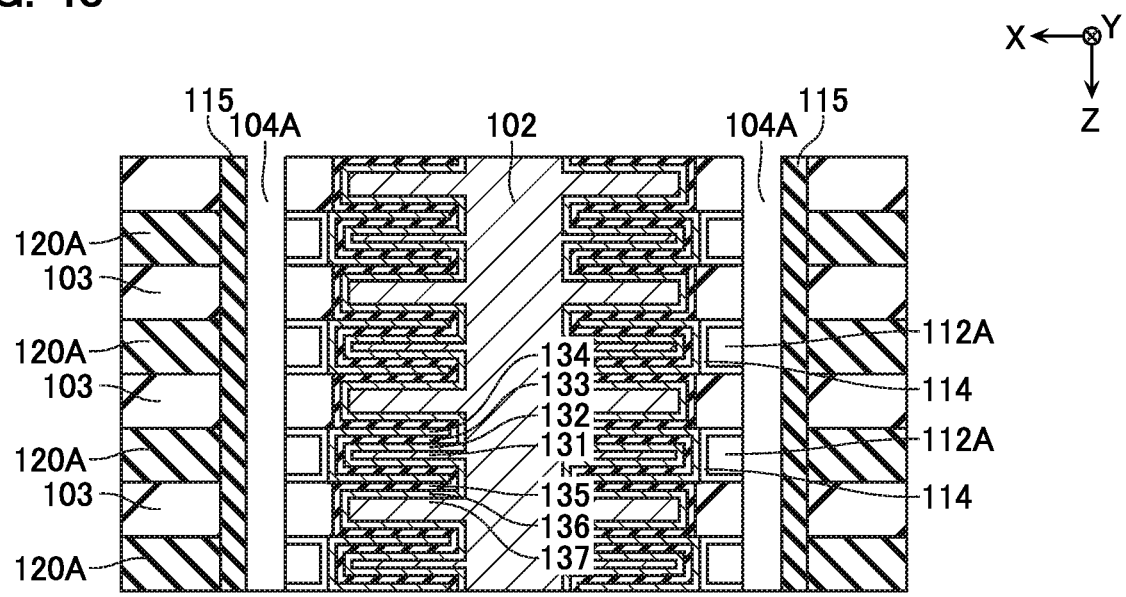
FIG. 48 is a schematic cross-sectional view for explaining same method of manufacturing.

Next, as shown in FIG. 48, for example, parts of the sacrifice layers 112A and parts of semiconductor layers 114 are removed via the openings 104A. In this step, for example, a part of the sacrifice layer 112A is removed to expose portions of the semiconductor layer 114 provided on the inner peripheral surfaces of the insulating layers 103, and these portions are removed. This step is performed by the likes of wet etching, for example.

Figure 49:
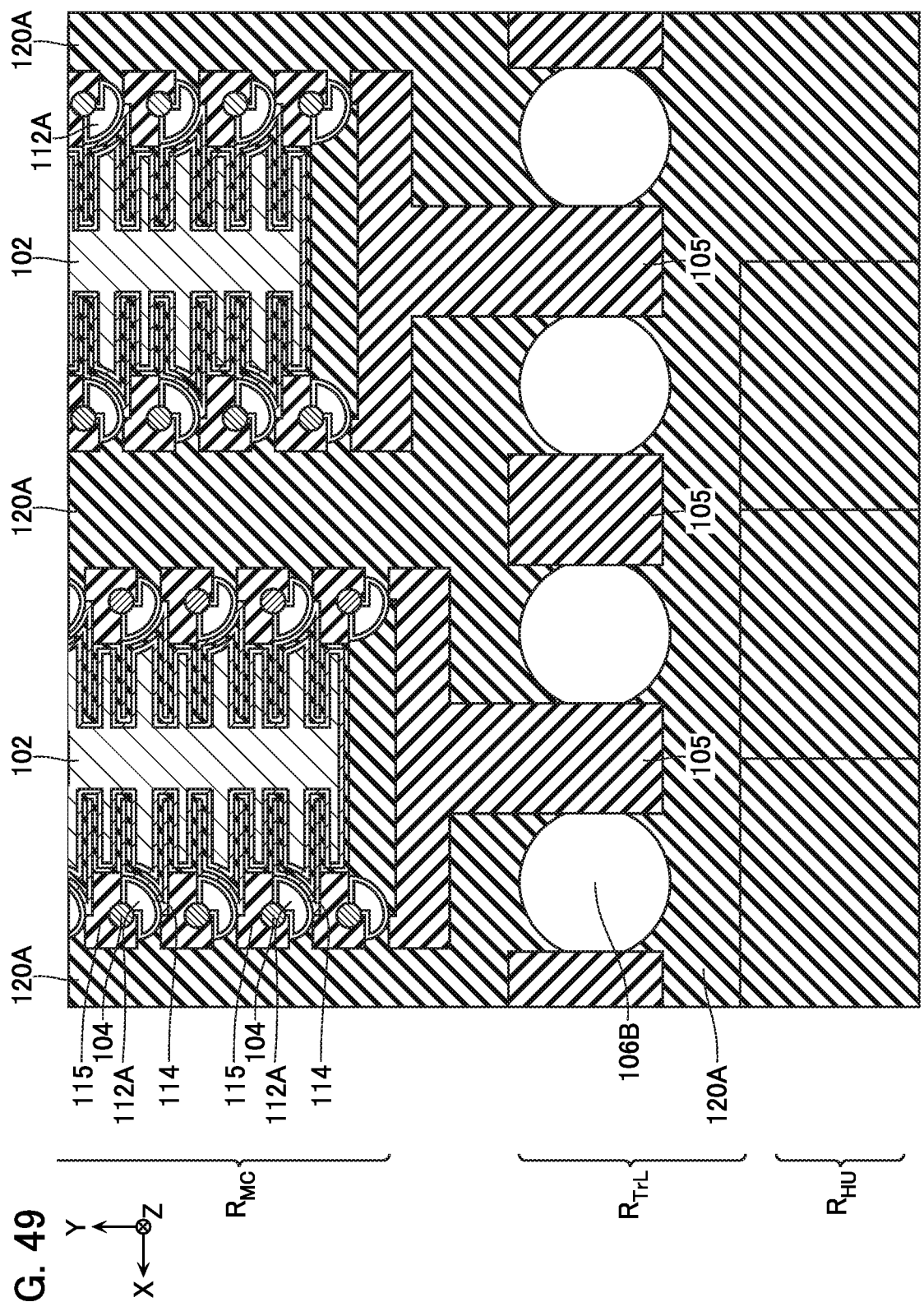
FIG. 49 is a schematic cross-sectional view for explaining same method of manufacturing.
Figure 50:
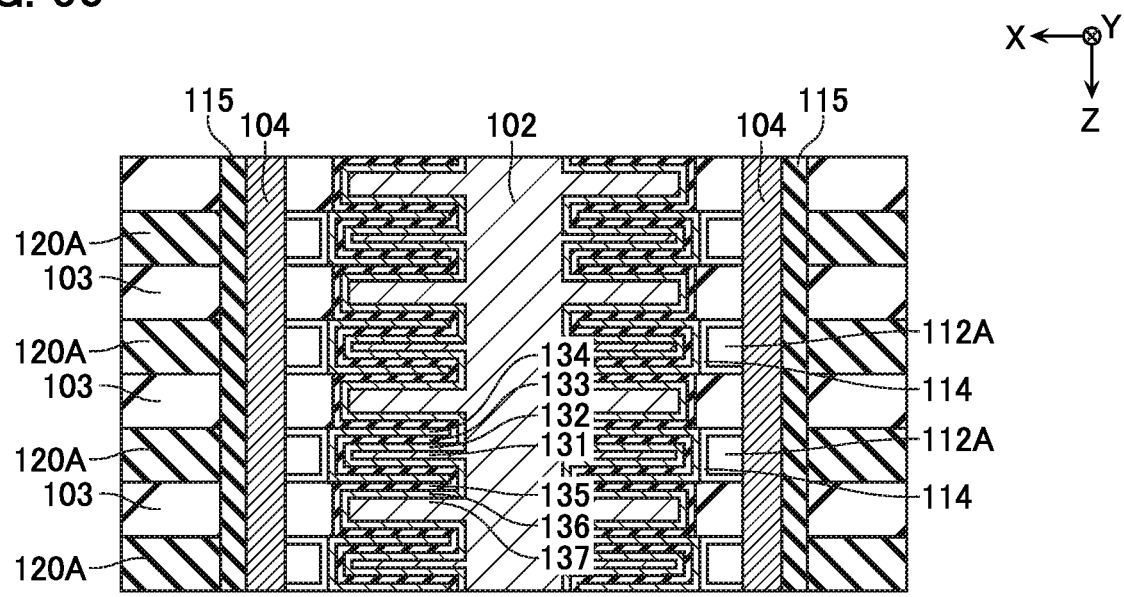
FIG. 50 is a schematic cross-sectional view for explaining same method of manufacturing.

Next, as shown in FIGS. 49 and 50, for example, the conductive layers 104 are formed inside the openings 104A. This step is performed by the likes of ALD and CVD, for example.

Figure 51:
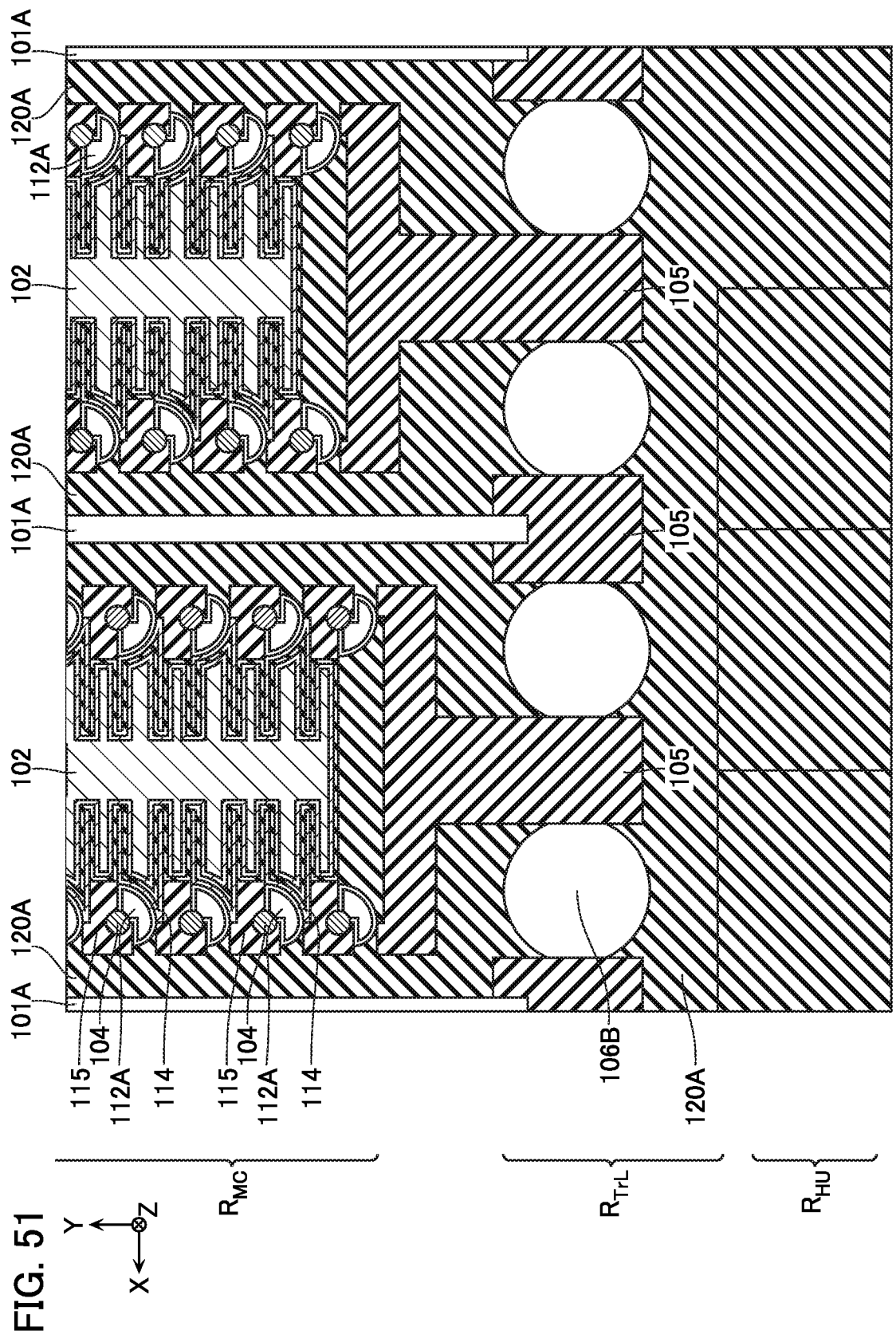
FIG. 51 is a schematic cross-sectional view for explaining same method of manufacturing.
Figure 52:
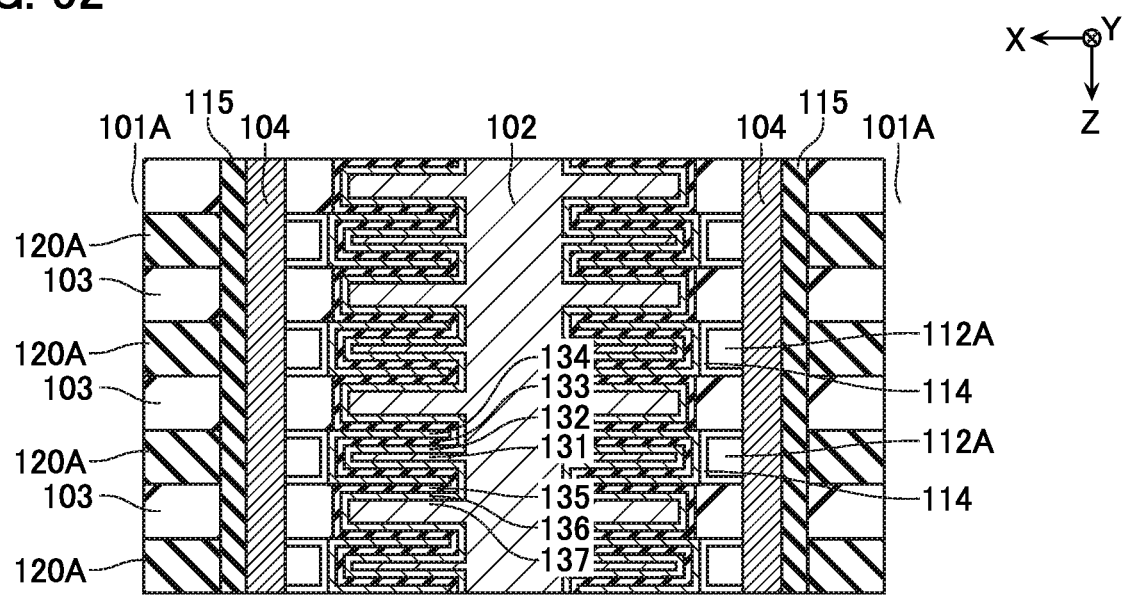
FIG. 52 is a schematic cross-sectional view for explaining same method of manufacturing.

Next, as shown in FIGS. 51 and 52, for example, openings 101A are formed at positions corresponding to the insulating layers 101. The opening 101A extends in the Z direction and penetrates the plurality of insulating layers 103 and the plurality of sacrifice layers 120A arranged in the Z direction, thereby dividing these configurations in the X direction, as shown in FIG. 52. This step is performed by the likes of RIE, for example.

Figure 53:
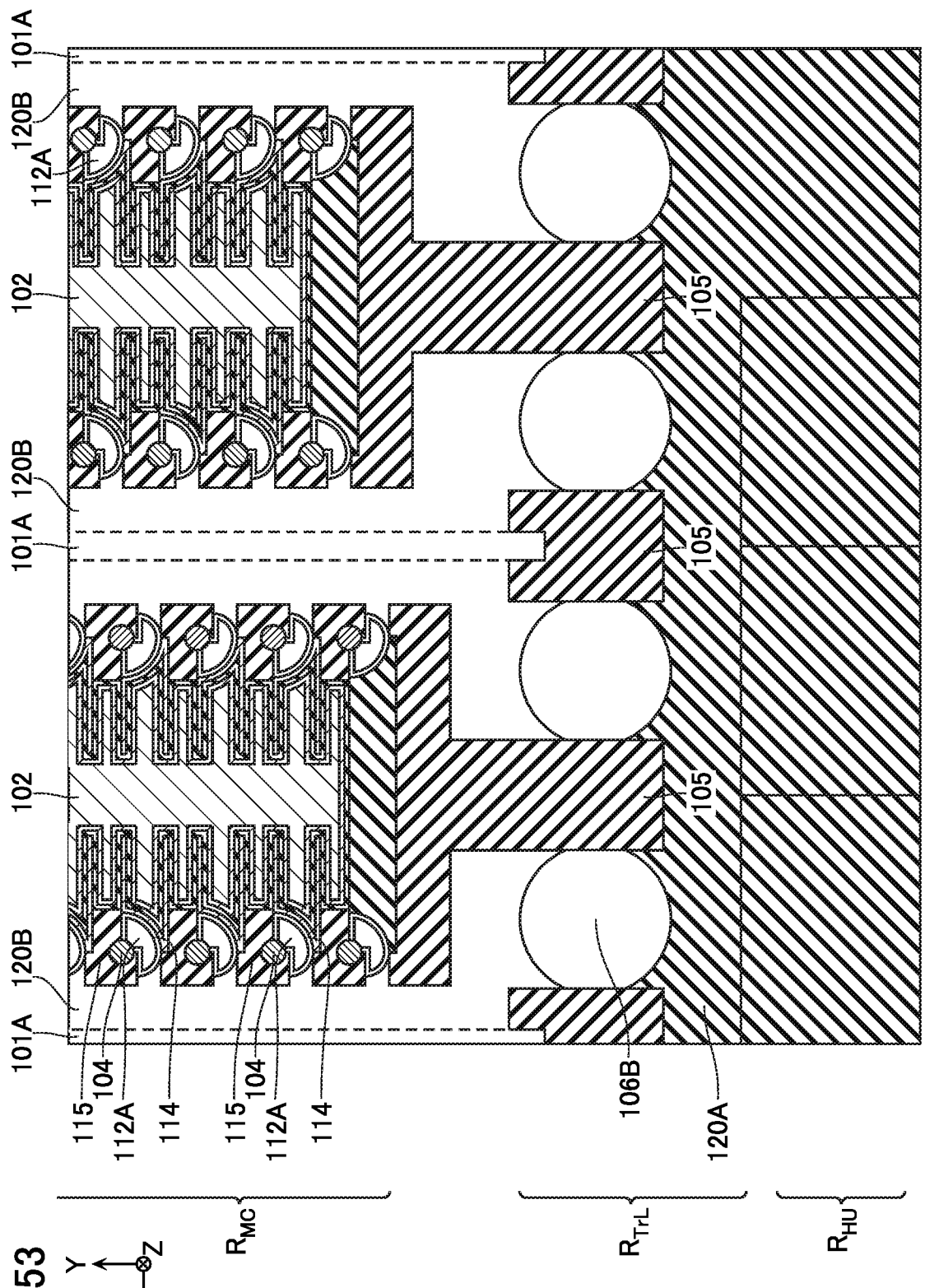
FIG. 53 is a schematic cross-sectional view for explaining same method of manufacturing.
Figure 54:
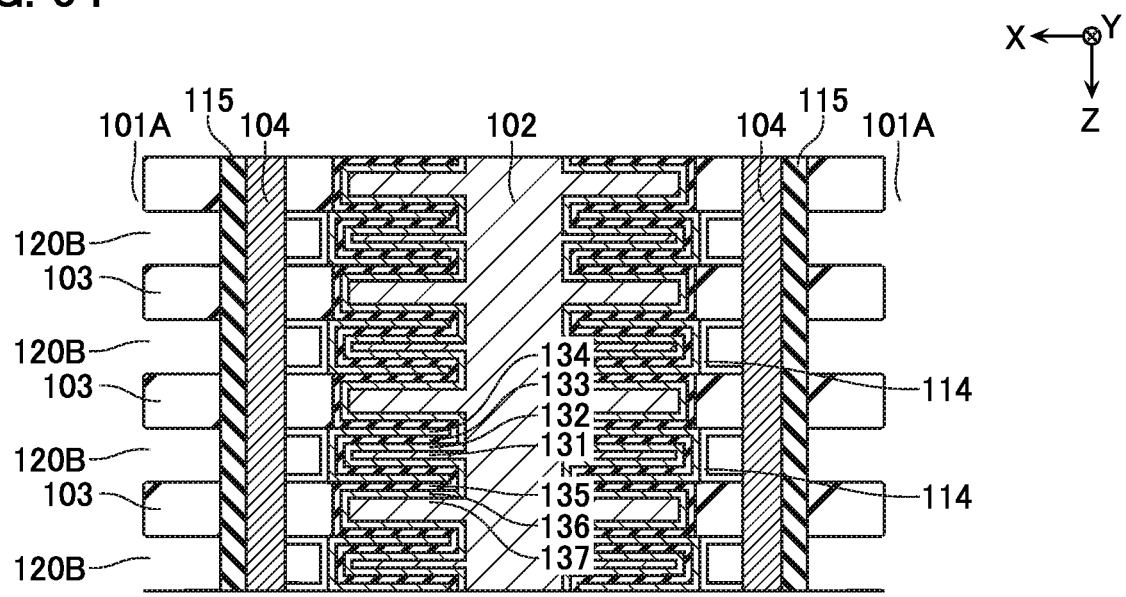
FIG. 54 is a schematic cross-sectional view for explaining same method of manufacturing.

Next, as shown in FIGS. 53 and 54, for example, the sacrifice layers 120A are removed via the openings 101A. This step is performed by the likes of wet etching, for example. Note that in the drawings, openings formed in portions where the sacrifice layers 120A had been provided, are indicated as openings 120B.

Figure 55:
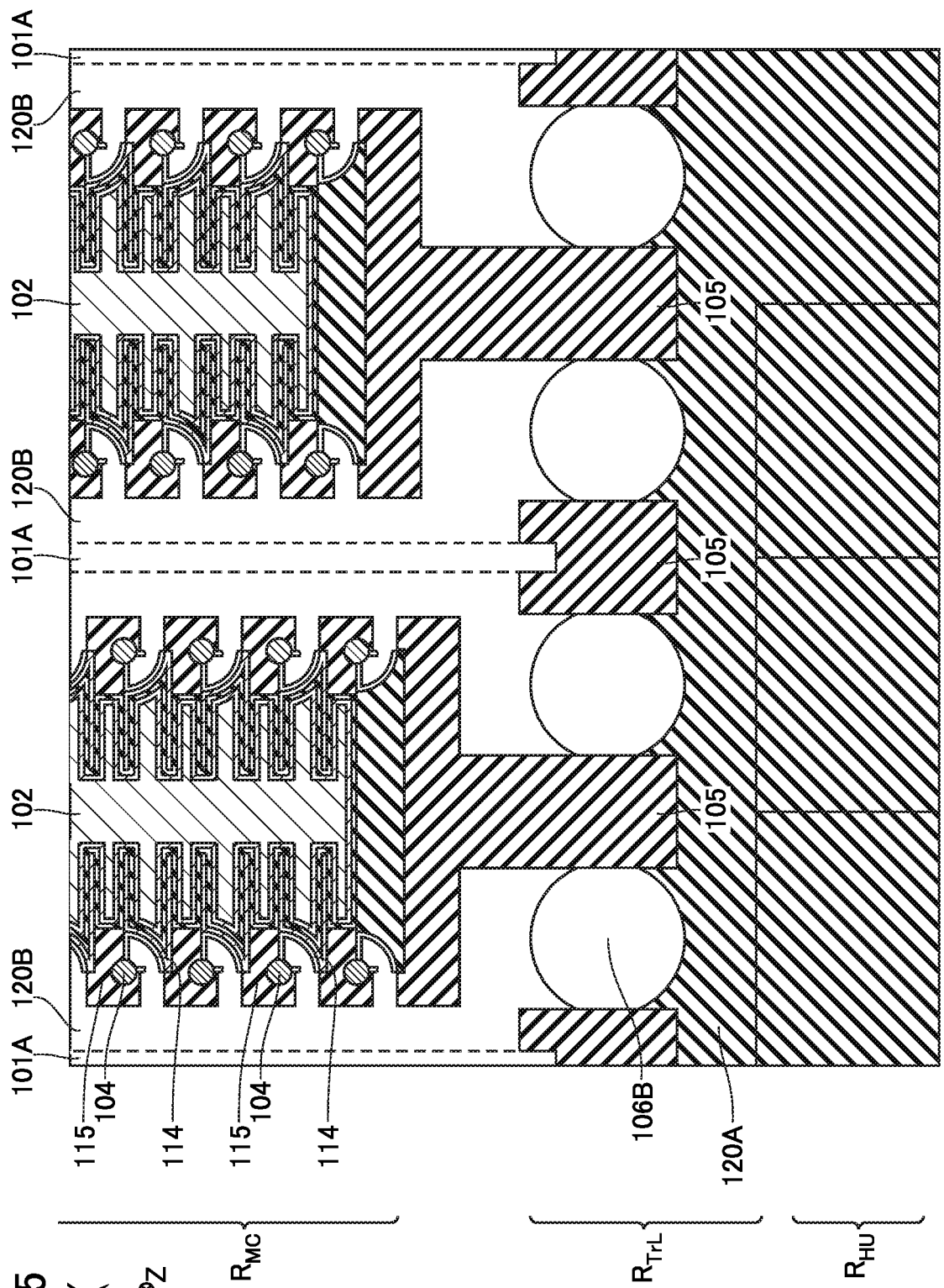
FIG. 55 is a schematic cross-sectional view for explaining same method of manufacturing.

Next, as shown in FIG. 55, for example, parts of the semiconductor layers 114 are removed, and parts of the sacrifice layers 112A are exposed, via the openings 101A, 120B. In addition, the sacrifice layers 112A are removed, and parts of the outer peripheral surfaces of the conductive layers 104 are exposed, via the openings 101A, 120B. This step is performed by the likes of wet etching, for example.

Figure 56:
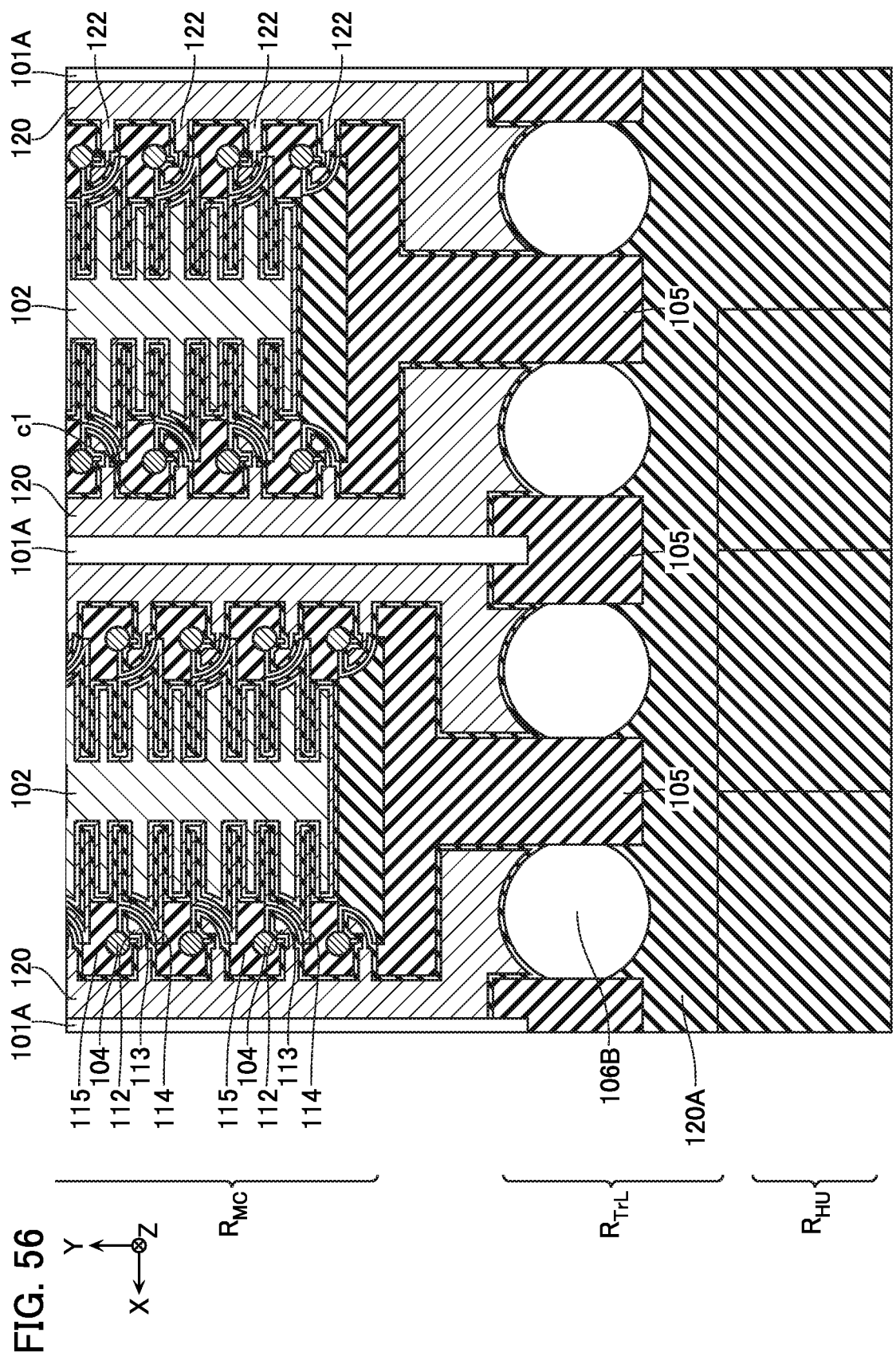
FIG. 56 is a schematic cross-sectional view for explaining same method of manufacturing.
Figure 57:
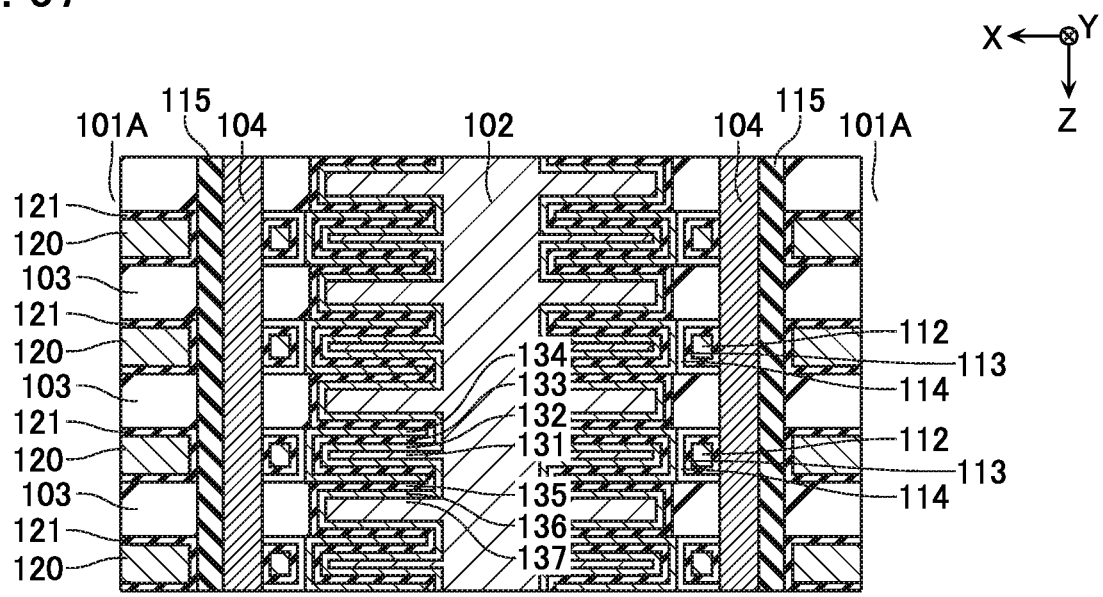
FIG. 57 is a schematic cross-sectional view for explaining same method of manufacturing.

Next, as shown in FIGS. 56 and 57, for example, the insulating layers 113, 121 are formed, and the conductive layers 112, 120, 122 are formed, inside the opening 120B. In this step, the insulating layers and conductive layers are formed in the openings 101A, 120B by the likes of CVD, for example. At this time, the opening 120B is filled in by the conductive layers. On the other hand, the opening 101A is not filled in by the conductive layers. Next, portions of these insulating layers and conductive layers provided on side surfaces of the insulating layers 103 in the X direction are removed by the likes of wet etching, for example. Subsequently, the insulating layers 101 are formed inside the openings 101A.

Figure 58:
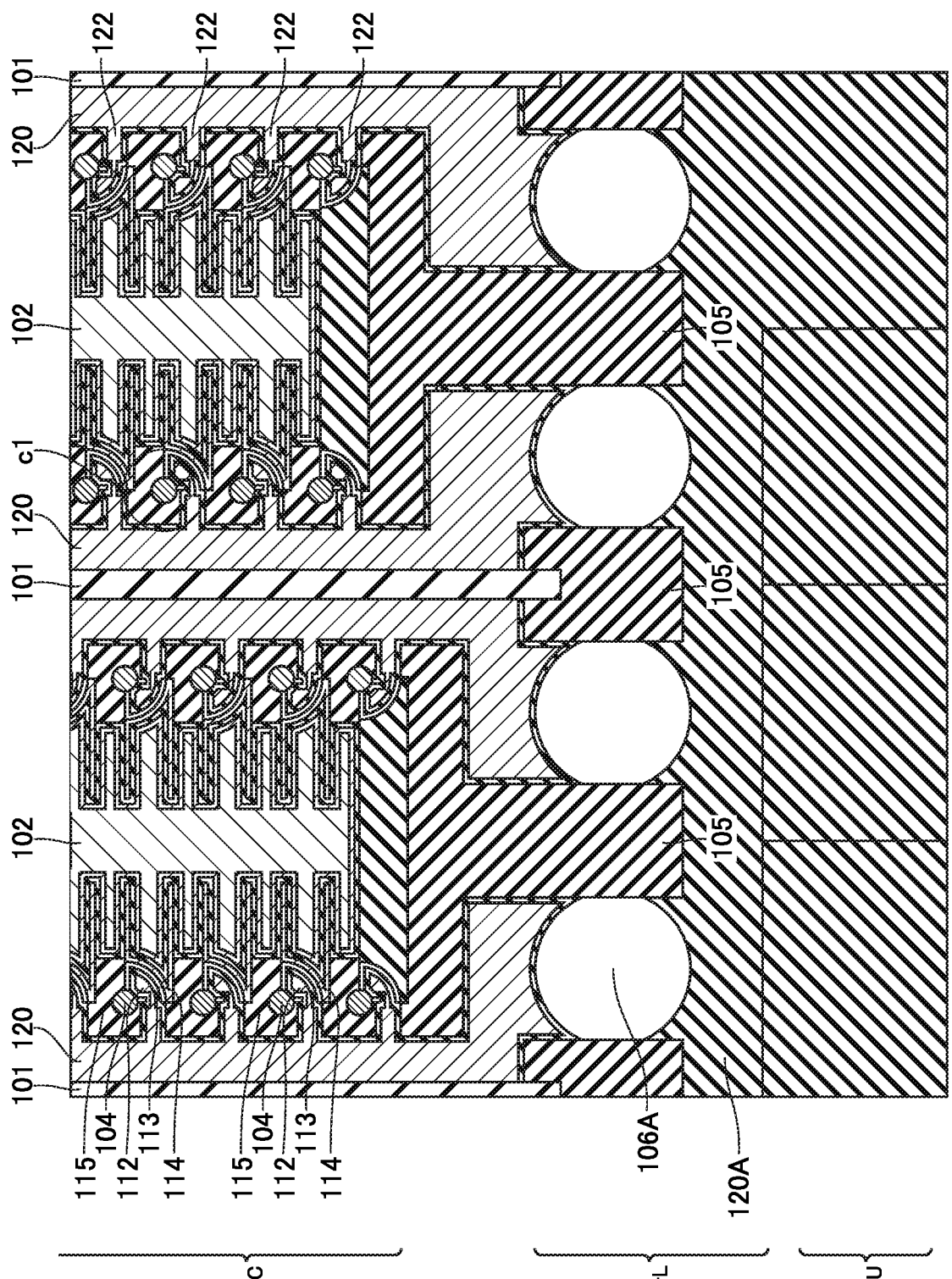
FIG. 58 is a schematic cross-sectional view for explaining same method of manufacturing.
Figure 59:
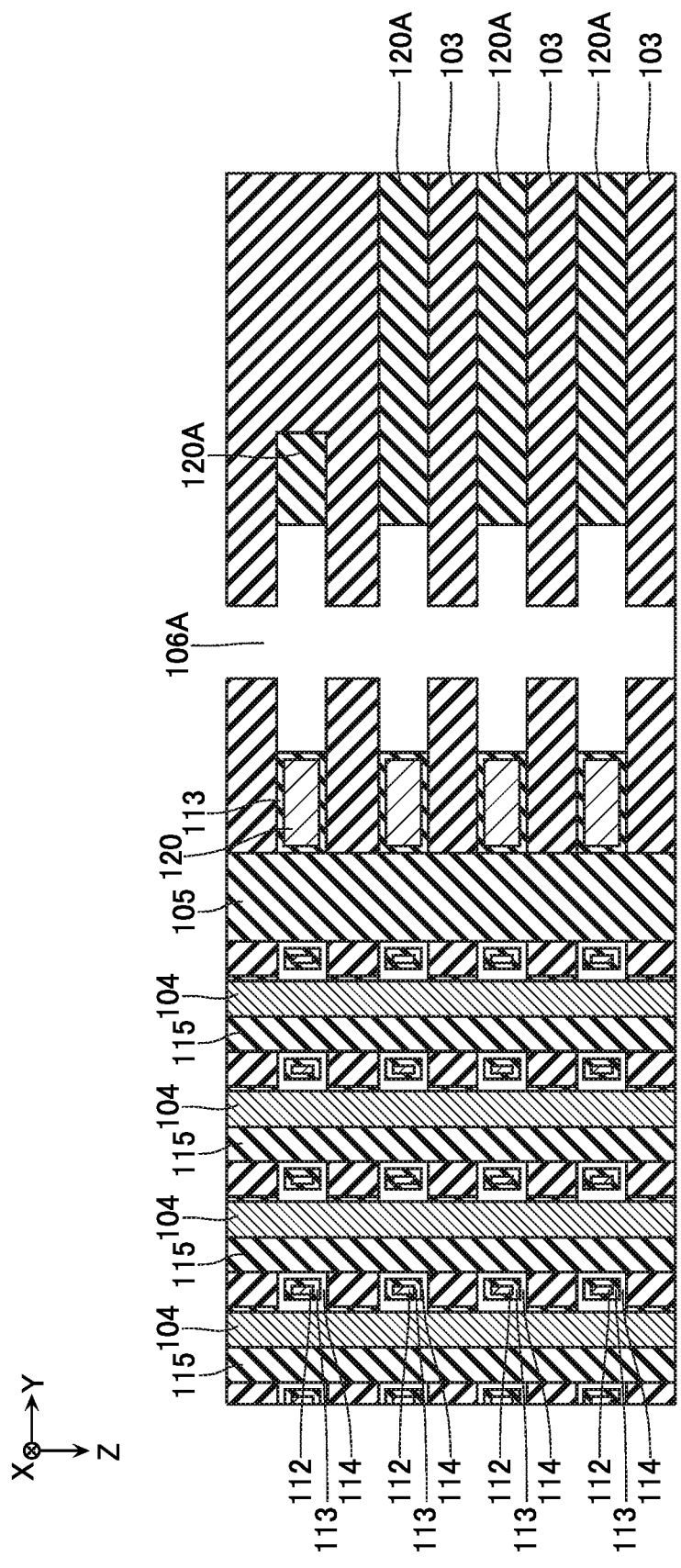
FIG. 59 is a schematic cross-sectional view for explaining same method of manufacturing.

Next, as shown in FIGS. 58 and 59, for example, the sacrifice layer 106B is removed. This step is performed by the likes of wet etching, for example.

Figure 60:
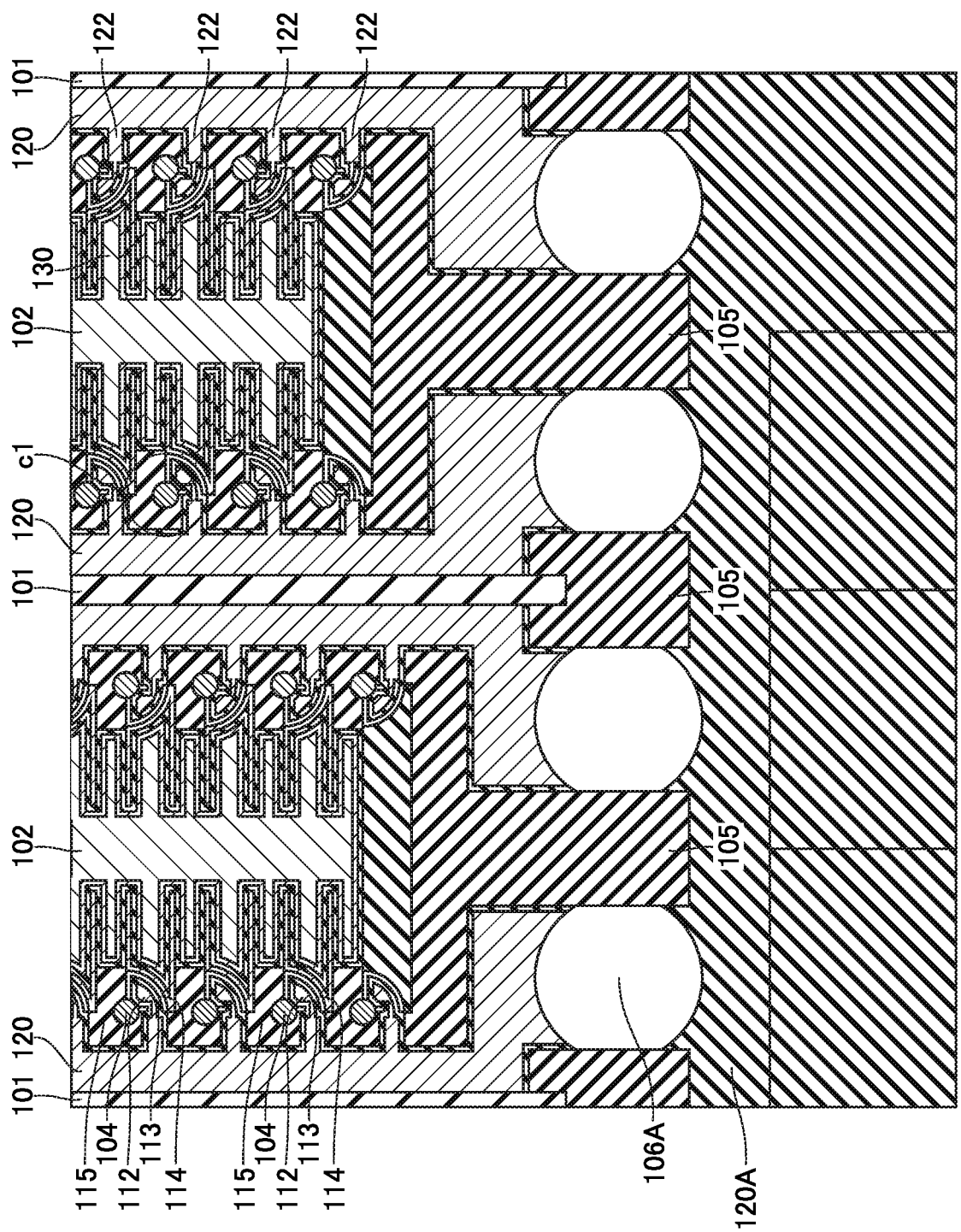
FIG. 60 is a schematic cross-sectional view for explaining same method of manufacturing.
Figure 61:
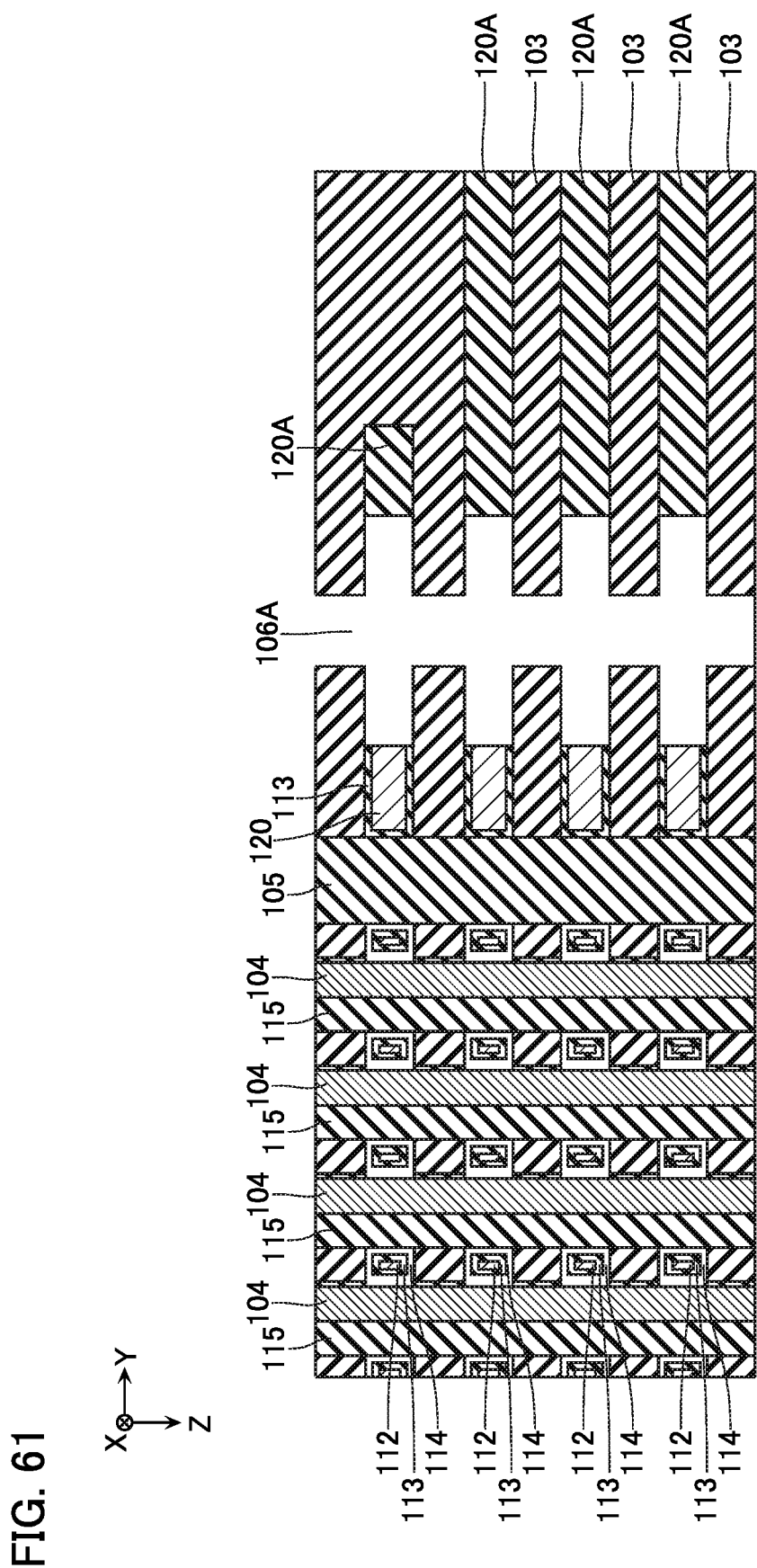
FIG. 61 is a schematic cross-sectional view for explaining same method of manufacturing.

Next, as shown in FIGS. 60 and 61, for example, parts of the insulating layers 113 are removed, and parts of the conductive layers 120 are exposed, via the openings 106A. This step is performed by the likes of wet etching, for example.

Figure 62:
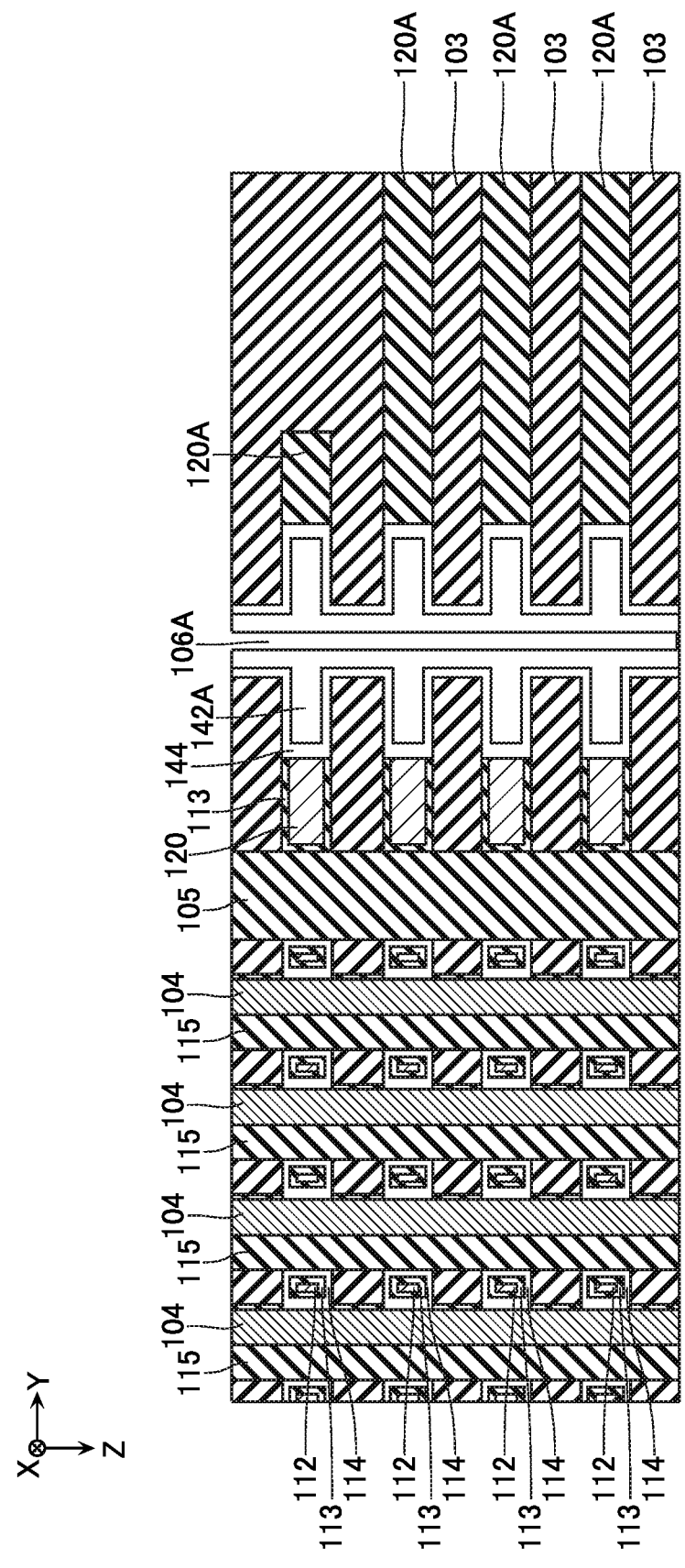
FIG. 62 is a schematic cross-sectional view for explaining same method of manufacturing.

Next, as shown in FIG. 62, for example, the semiconductor layer 144 is formed on side surfaces of the sacrifice layers 120A in the Y direction, side surfaces of conductive layers 120 in the Y direction, side surfaces of the insulating layers 105 in the X direction, and upper surfaces, lower surfaces, and inner peripheral surfaces of the insulating layers 103, via the opening 106A. In addition, a sacrifice layer 142A is formed in a region between two of the insulating layers 103 adjacent in the Z direction. In this step, the region between two of the insulating layers 103 adjacent in the Z direction is filled in by the sacrifice layer 142A. On the other hand, the opening 106A is not filled in by the sacrifice layer 142A. This step is performed by the likes of ALD and CVD, for example.

Figure 63:
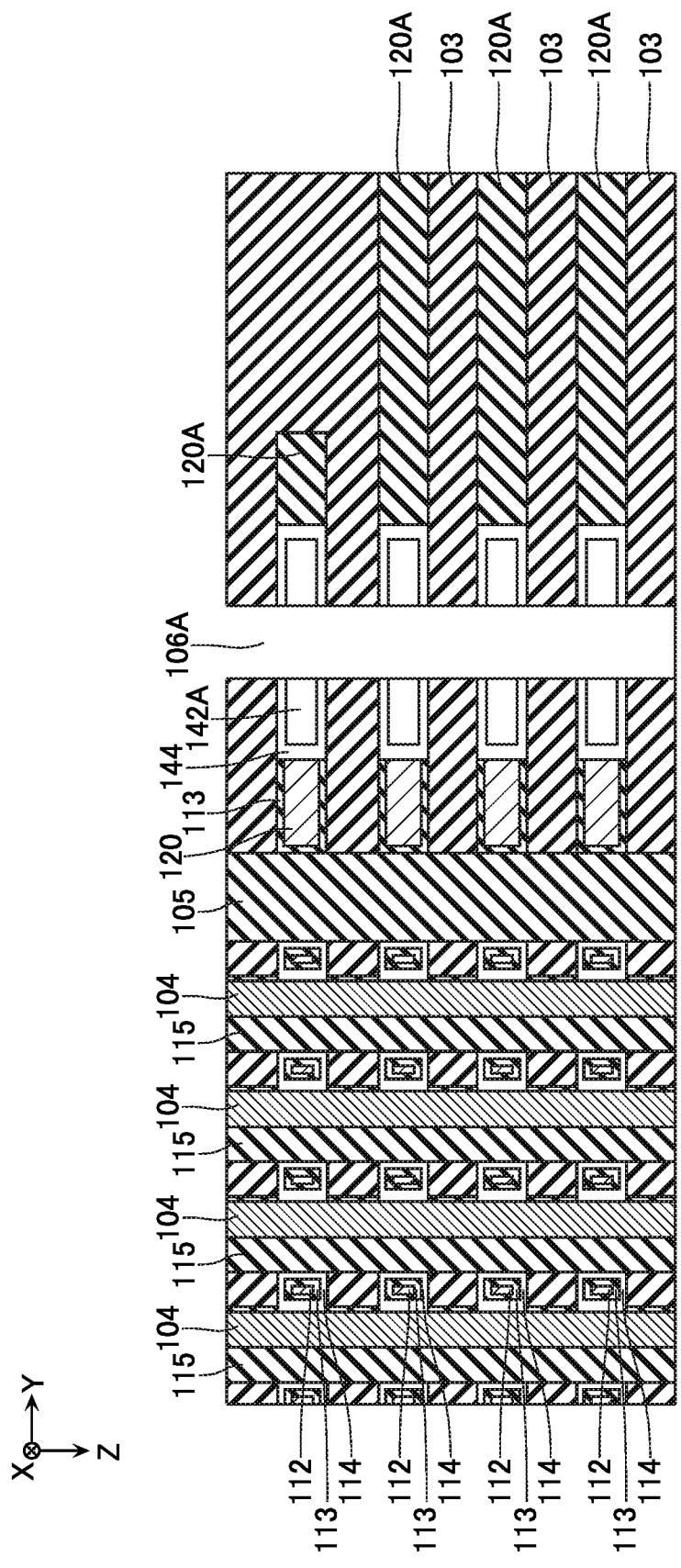
FIG. 63 is a schematic cross-sectional view for explaining same method of manufacturing.

Next, as shown in FIG. 63, for example, parts of the sacrifice layer 142A and semiconductor layer 144 are removed via the opening 106A. In this step, for example, a part of the sacrifice layer 142A is removed to expose portions of the semiconductor layer 144 provided on the inner peripheral surfaces of the insulating layers 103, and these portions are removed. This step is performed by the likes of wet etching, for example.

Figure 64:
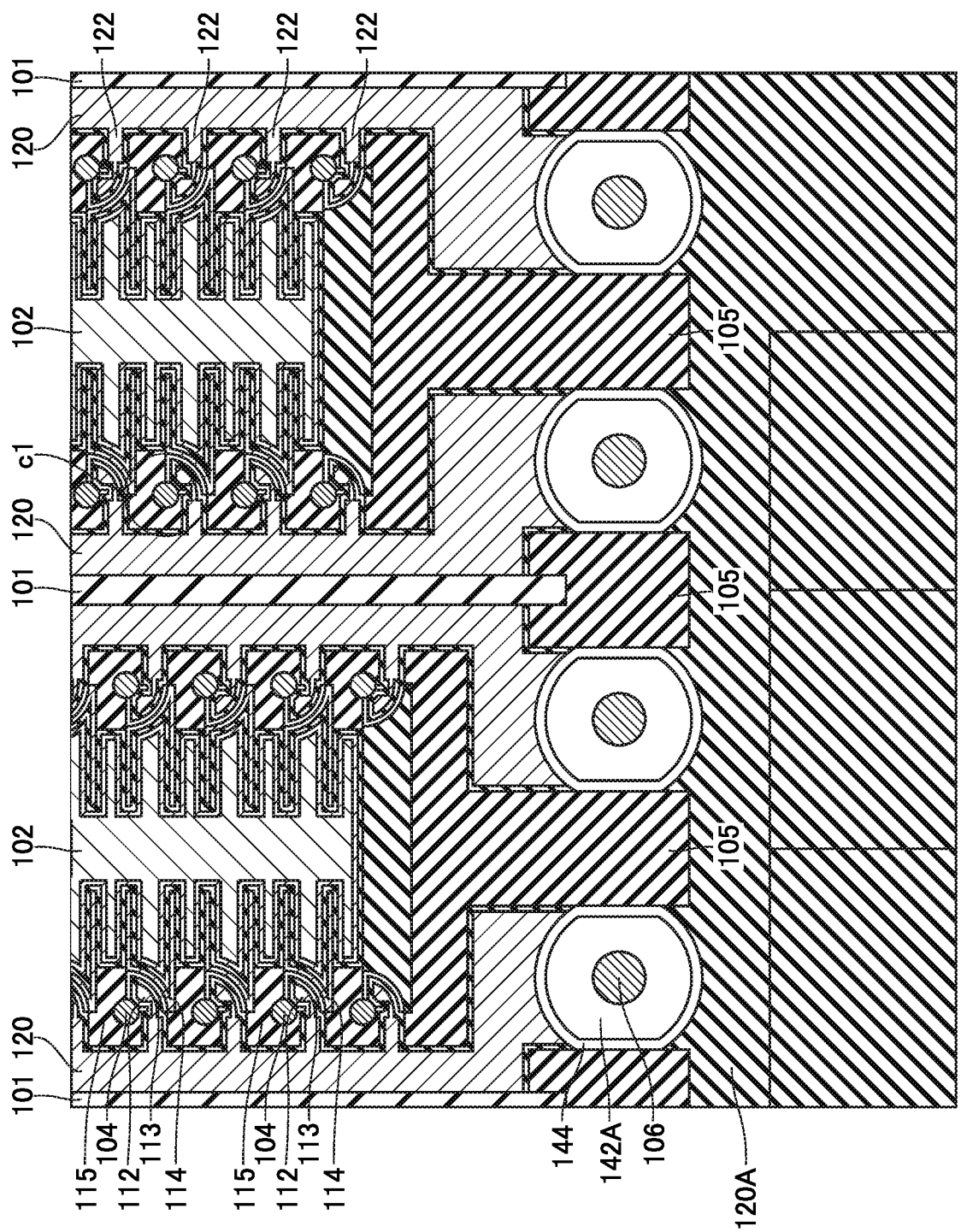
FIG. 64 is a schematic cross-sectional view for explaining same method of manufacturing.
Figure 65:
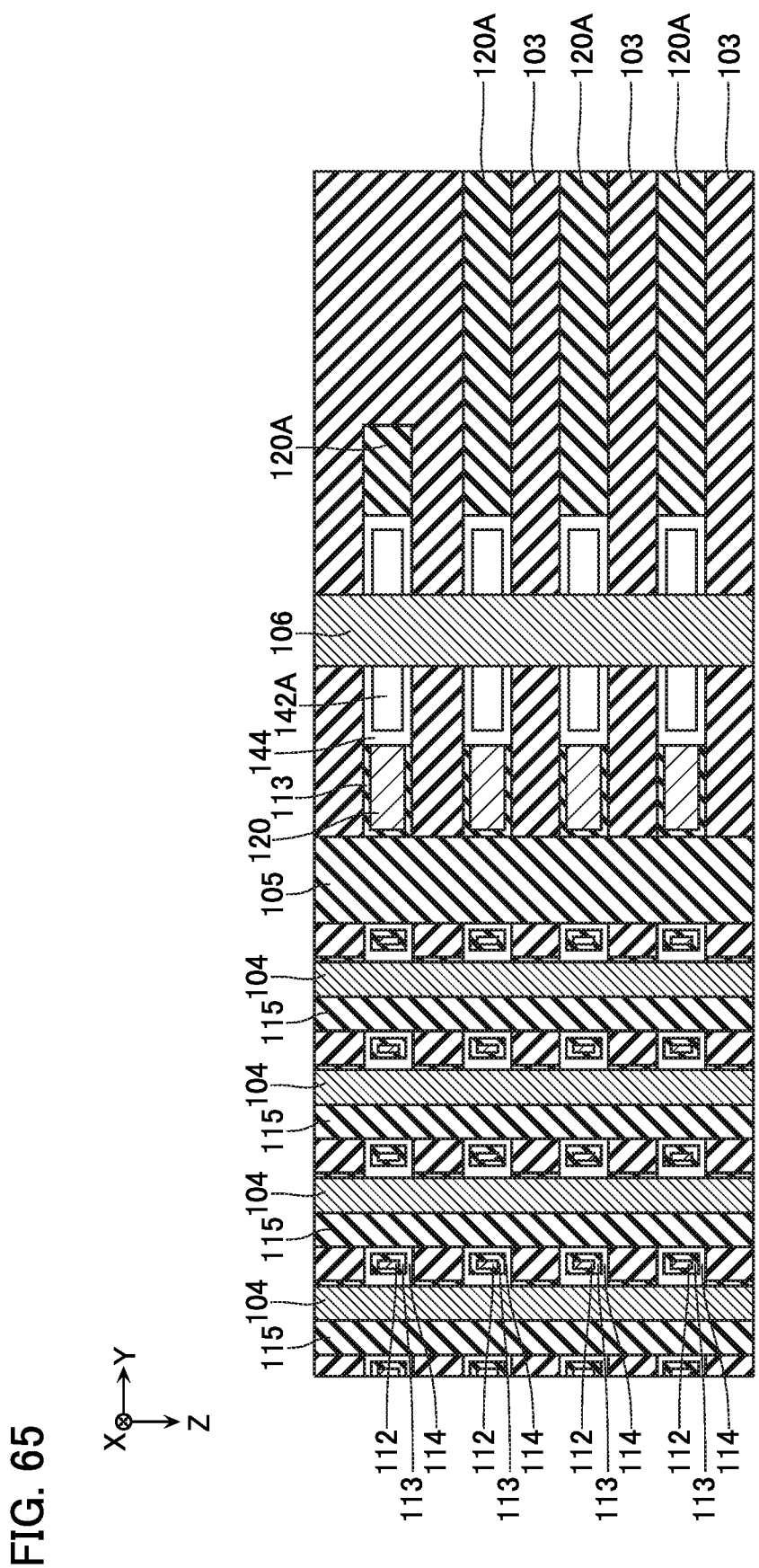
FIG. 65 is a schematic cross-sectional view for explaining same method of manufacturing.

Next, as shown in FIGS. 64 and 65, for example, the conductive layers 106 are formed inside the openings 106A. This step is performed by the likes of ALD or CVD, for example.

Figure 66:
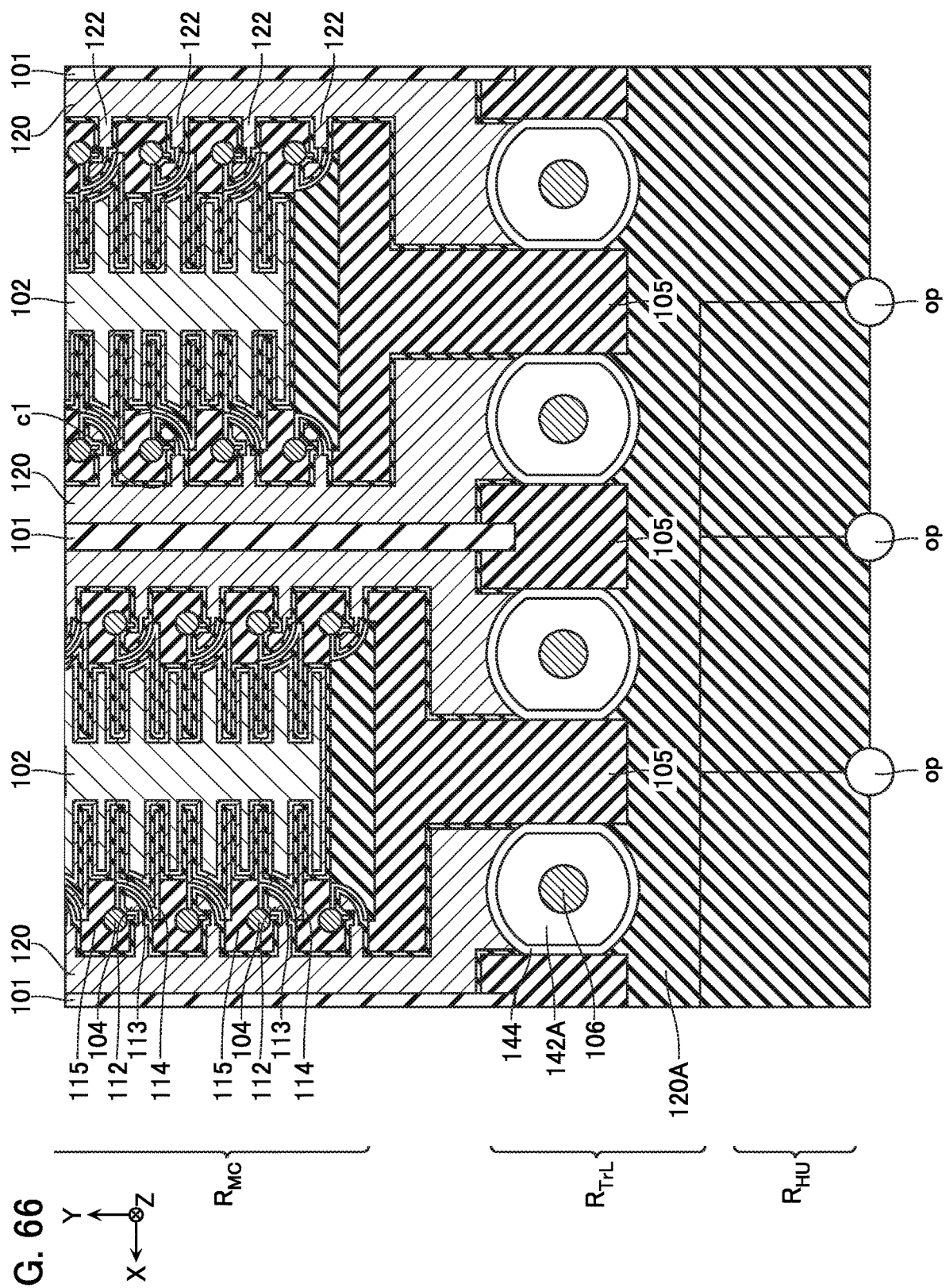
FIG. 66 is a schematic cross-sectional view for explaining same method of manufacturing.

Next, as shown in FIG. 66, for example, a plurality of openings op arranged in the X direction, are formed in the hookup region $R_{HU}$. The opening op extends in the Z direction and penetrates the plurality of insulating layers 103 and plurality of sacrifice layers 120A arranged in the Z direction. This step is performed by the likes of RIE, for example.

Figure 67:
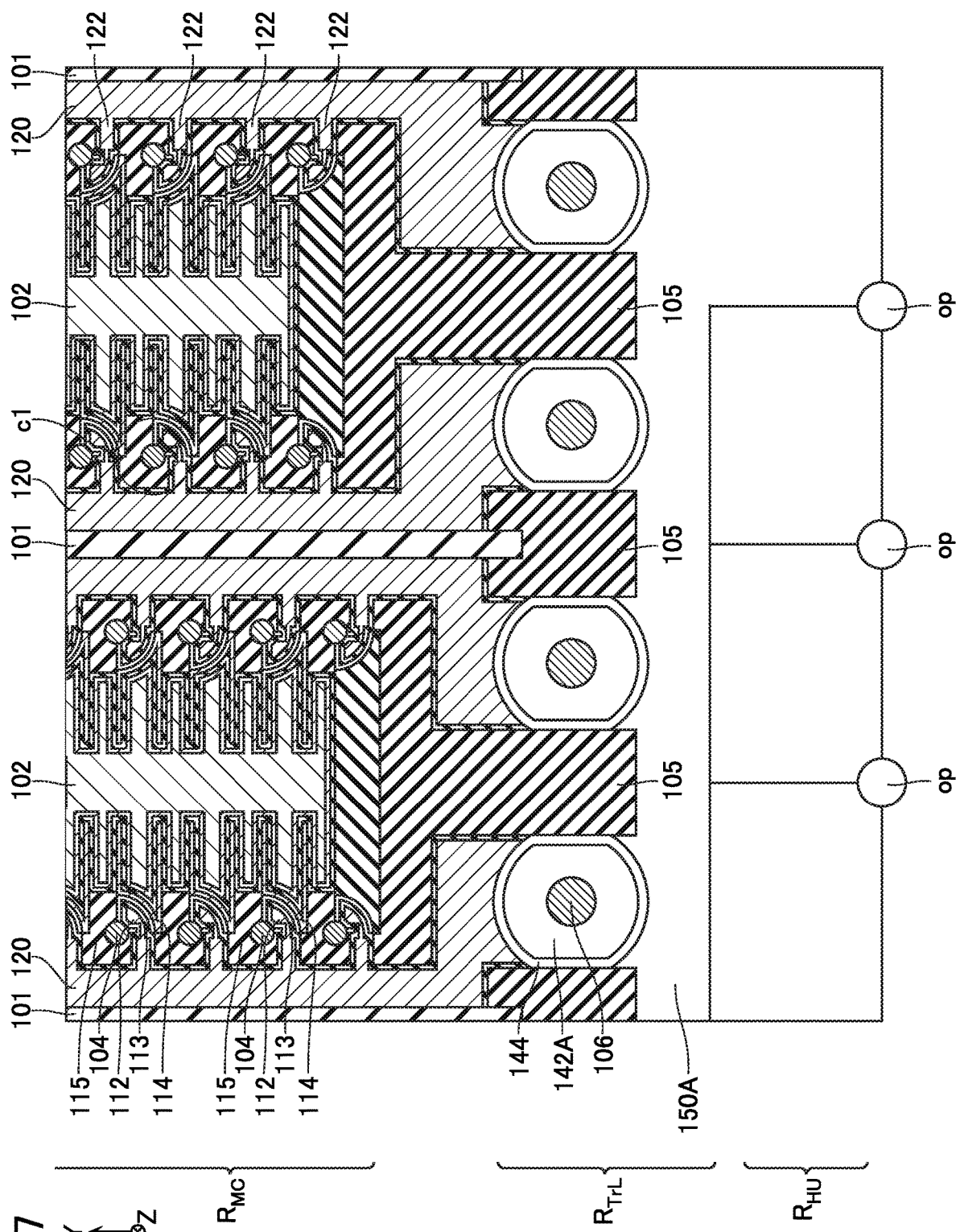
FIG. 67 is a schematic cross-sectional view for explaining same method of manufacturing.
Figure 68:
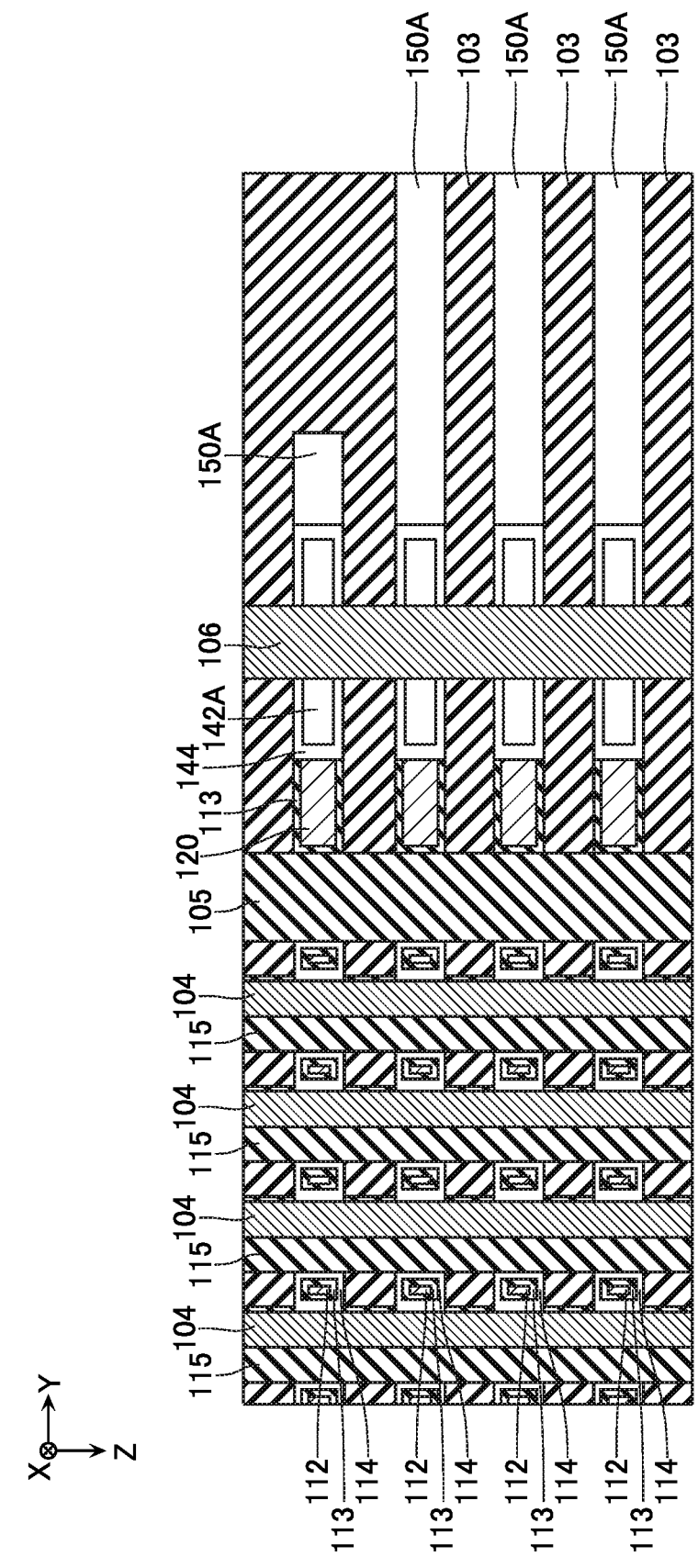
FIG. 68 is a schematic cross-sectional view for explaining same method of manufacturing.

Next, as shown in FIGS. 67 and 68, for example, the sacrifice layers 120A are removed via the openings op. This step is performed by the likes of wet etching, for example. Note that in the drawings, openings formed in portions where the sacrifice layers 120A had been provided, are indicated as openings 150A.

Figure 69:
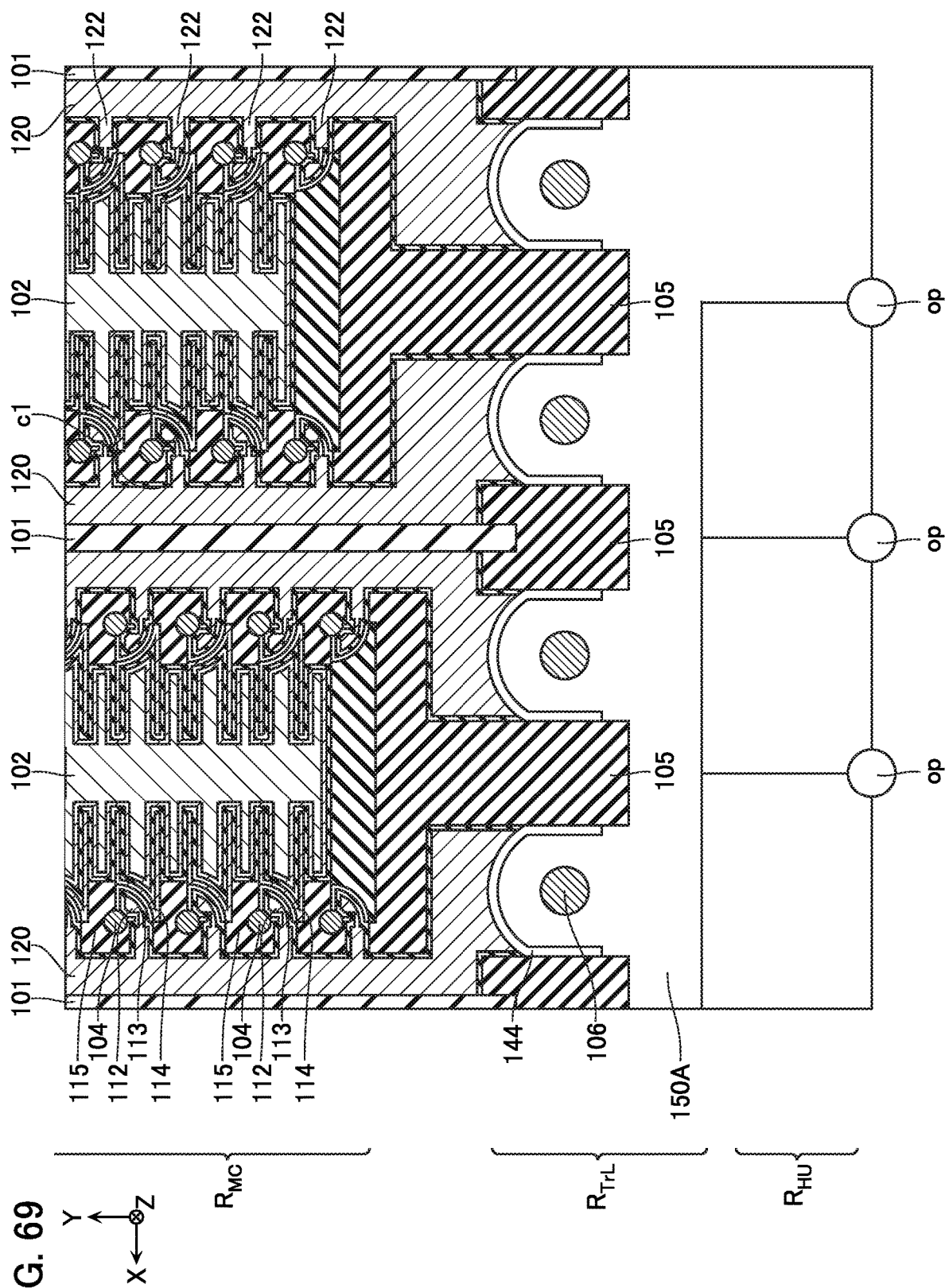
FIG. 69 is a schematic cross-sectional view for explaining same method of manufacturing.
Figure 70:
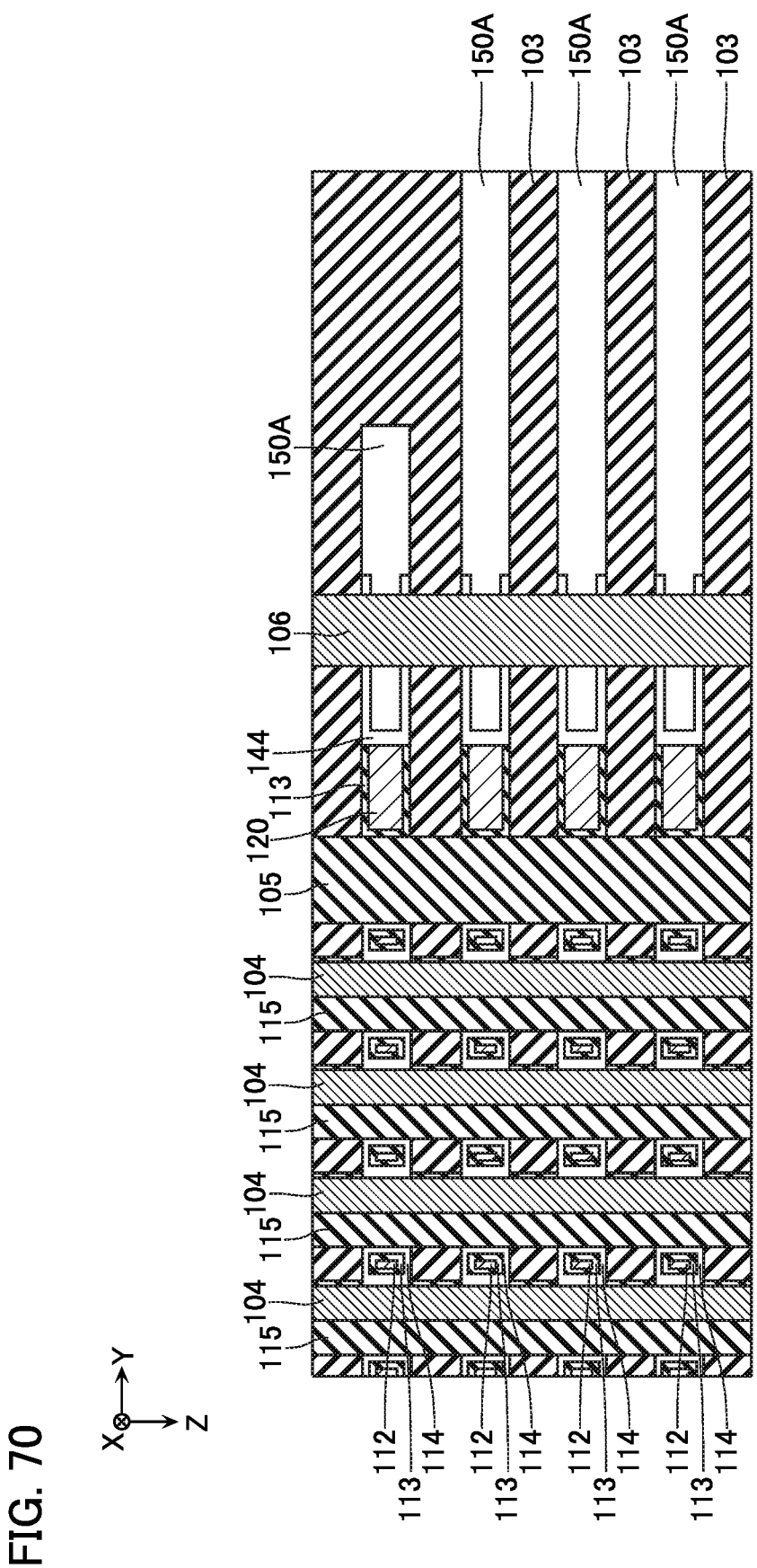
FIG. 70 is a schematic cross-sectional view for explaining same method of manufacturing.

Next, as shown in FIGS. 69 and 70, for example, parts of the semiconductor layers 144 are removed, and parts of the sacrifice layers 142A are exposed, via the openings op, 150A. In addition, the sacrifice layers 142A are removed, and outer peripheral surfaces of the conductive layers 106 are exposed, via the openings op, 150A. This step is performed by the likes of wet etching, for example.

Next, as shown in FIGS. 71 and 72, for example, the insulating layers 141, 143, 151 are formed, and the conductive layers 142, 150 are formed, in the opening 150A. In this step, the insulating layers and conductive layers are formed in the openings op, 150A, by the likes of CVD, for example. At this time, the opening 150A is filled in by the conductive layers. On the other hand, the opening op is not filled in by the conductive layers. Next, portions of these insulating layers and conductive layers provided on the inner peripheral surfaces of the insulating layers 103 are removed by the likes of wet etching, for example. Subsequently, an insulating layer is formed inside the opening op.

Comparative Example

Figure 73:
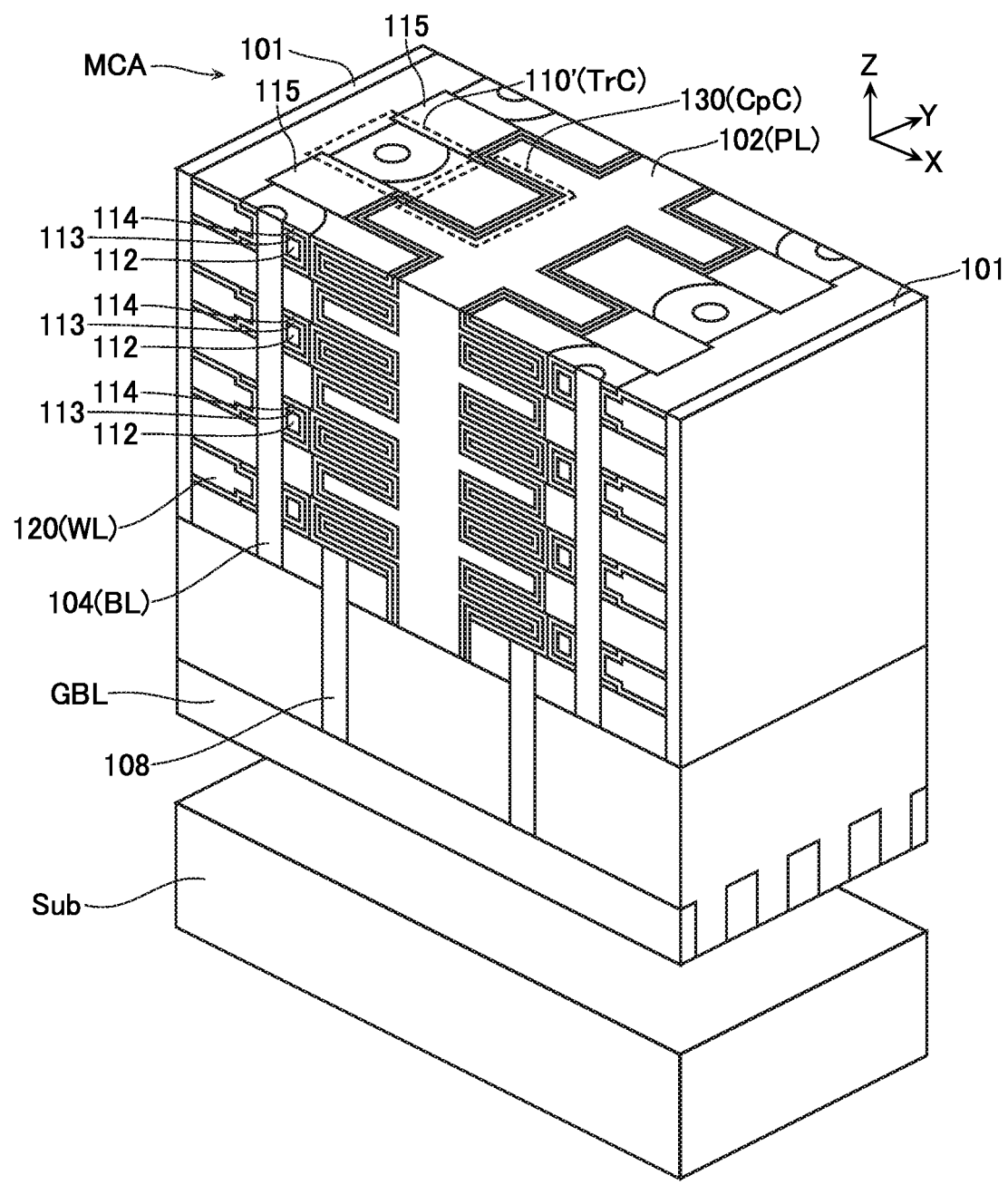
FIG. 73 is a schematic perspective view showing configuration of a semiconductor memory device according to a comparative example.

FIG. 73 is a schematic perspective view showing configuration of a semiconductor memory device according to a comparative example.

As has been described with reference to FIG. 12, and so on, in the semiconductor memory device according to the first embodiment, in the case of attention being focused on two of the insulating layers 115 adjacent in the Y direction, the conductive layer 104 provided between these insulating layers 115 is in contact with one of the insulating layers 115. On the other hand, as shown in FIG. 73, in the semiconductor memory device according to the comparative example, in the case of attention being focused on two of the insulating layers 115 adjacent in the Y direction, the conductive layer 104 provided between these insulating layers 115 is separated from both of the insulating layers 115.

Moreover, as has been described with reference to FIG. 12, and so on, in the semiconductor memory device according to the first embodiment, in an XY cross section corresponding to the conductive layer 112, only a part of the outer peripheral surface of the conductive layer 104 is connected to the transistor structure 110, while the remaining portion of the outer peripheral surface of the conductive layer 104 is not connected to the transistor structure 110. On the other hand, in the semiconductor memory device according to the comparative example, in an XY cross section corresponding to the conductive layer 112, a transistor structure 110' surrounds the outer peripheral surface of the conductive layer 104 over its entire periphery, and the whole outer peripheral surface of the conductive layer 104 is connected to the transistor structure 110'.

Advantages

In the semiconductor memory device according to the comparative example, there is adopted a configuration whereby the semiconductor layer 114 surrounds the upper surface, a lower surface, and side surfaces of the conductive layer 112. In such a configuration, channel is formed in a portion of the semiconductor layer 114 facing the upper surface of the conductive layer 112, a portion of the semiconductor layer 114 facing the lower surface of the conductive layer 112, and portions of the semiconductor layer 114 facing the side surfaces of the conductive layer 112. It is hence possible for ON current of the transistor Tr to be made comparatively large. As a result, it is possible for speeding-up and stability of operation to be achieved.

However, in such a configuration, the conductive layer 104 functioning as the bit line BL and the conductive layer 112 functioning as the gate electrode of the transistor TrC, face each other via the insulating layer 113. Hence, parasitic capacitance will end up occurring between the bit line BL and the gate electrode of the transistor TrC. Moreover, parasitic capacitance will end up occurring between the global bit lines GBL too. In order for the read operation to be suitably executed by such a configuration, it is conceivable for facing area of the conductive layer 104 and the conductive layer 112 to be reduced, and for electrostatic capacitance between the bit line BL and the gate electrode of the transistor TrC to thereby be reduced, for example.

Moreover, in such a configuration, parasitic capacitance will end up occurring between two of the conductive layers 112 adjacent in the Z direction. Hence, area in the XY cross section of the conductive layer 112 is preferably small.

Accordingly, in the semiconductor memory device according to the present embodiment, as has been described with reference to FIG. 12, there is adopted a configuration in which a part of the conductive layer 104 faces the conductive layer 112, while the other part of the conductive layer 104 does not face the conductive layer 112. Due to such a configuration, it is possible for facing area of the conductive layer 104 and the conductive layer 112 to be reduced, and for parasitic capacitance between these conductive layers 104, 112 to be reduced. Moreover, it is possible for area in the XY cross section of the conductive layer 112 to be reduced, and for parasitic capacitance between the conductive layers 112 to be reduced.

Note that in the semiconductor memory device according to the comparative example, in the XY cross section corresponding to the semiconductor layer 114, the outer peripheral surface of the conductive layer 104 is in contact with the semiconductor layer 114 over its entire periphery. On the other hand, in the semiconductor memory device according to the first embodiment, in the XY cross section corresponding to the semiconductor layer 114, only a part of the outer peripheral surface of the conductive layer 104 is in contact with the semiconductor layer 114, while the remaining part of the outer peripheral surface of the conductive layer 104 is not in contact with the semiconductor layer 114. In such a configuration, there is conceivably a possibility that operation current of the transistor TrC will decrease more, compared to in the comparative example. Accordingly, the inventors carried out a study regarding operation current of the transistor TrC in such a configuration.

As has been described with reference to FIG. 6, during the read operation of the semiconductor memory device according to the first embodiment, data in the memory cell MC is read to the global bit line GBL.

At this time, when the capacitor CpC of the memory cell MC is charged by the voltage $V_{DD}$, current flows into the global bit line GBL from the memory cell MC. At this time, electrons are supplied to the capacitor CpC, via the transistor TrC, from the bit line BL. Hence, in the transistor TrC, the bit line BL functions as a source terminal, and the capacitor CpC functions as a drain terminal. In such a case, the current flowing in the transistor TrC is limited by contact resistance between the bit line BL and transistor TrC.

On the other hand, when the capacitor CpC of the memory cell MC is discharged to the ground voltage $V_{SS}$, current flows into the memory cell MC from the global bit line GBL. At this time, electrons are supplied to the bit line BL, via the transistor TrC, from the capacitor CpC. Hence, in the transistor TrC, the capacitor CpC functions as the source terminal, and the bit line BL functions as the drain terminal. In such a case, the current flowing in the transistor TrC is limited by contact resistance between the capacitor CpC and transistor TrC.

The larger these two types of currents are, the higher the possibility will be that the read operation speeds up. Moreover, speed of the read operation is set in accordance with the smaller of these two types of currents. The same applies also to the write operation, although description of this will be omitted.

Accordingly, the inventors performed a simulation regarding current of the transistor TrC in the case where the bit line BL functions as the source terminal and current of the transistor TrC in the case where the capacitor CpC functions as the source terminal, for the semiconductor memory device according to the comparative example. As a result, current in the former case was found to be larger than current in the latter case. This is conceivably because contact resistance between the bit line BL and transistor TrC is smaller than contact resistance between the capacitor CpC and transistor TrC.

In addition, the inventors performed a simulation regarding a relationship between area that the bit line BL and semiconductor layer 114 are in contact in the XY cross section and the above-described two types of currents. In the simulation, it was supposed there would be two line segments passing through a center point in the XY cross section of the bit line BL, and a circle centered on the center point in the XY cross section of the bit line BL, and it was supposed there would be a configuration of a kind where the semiconductor layer 114 would be provided in a circular-sector shaped region stipulated by these two line segments and the circle. For example, in the case where an angle of the above-described two line segments is 90°, there will result a configuration similar to in the semiconductor memory device according to the first embodiment. Moreover, in the case where an angle of the above-described two line segments is 360°, there will result a configuration similar to in the semiconductor memory device according to the comparative example.

Results of the simulations were that the current of the transistor TrC in the case of the bit line BL functioning as the source terminal, decreased greatly as the above-described angle decreased. This is conceivably because contact resistance between the bit line BL and transistor TrC increased with decrease in area-of-contact between the bit line BL and transistor TrC. On the other hand, the current of the transistor TrC in the case of the capacitor CpC functioning as the source terminal, did not change much until about a range that the above-described angle falls below 90°. This is conceivably because in the configuration of the kind described with reference to FIG. 73, only a portion corresponding to an angular range of the above-described angle being about 90°, of an outline in the XY cross section of the semiconductor layer 114, is connected to the conductive layer 134, while the remaining portion of the outline in the XY cross section of the semiconductor layer 114 is not connected to the conductive layer 134 (but is connected to the insulating layer 115 or insulating layer 121). In this kind of structure, until about a range that the above-described angle falls below 90°, area-in-contact of the semiconductor layer 114 and conductive layer 134 does not change, hence contact resistance between the capacitor CpC and transistor TrC does not change either. As a result, in a region where the above-described angle is about 90°, the current of the transistor TrC in the case of the bit line BL functioning as the source terminal and the current of the transistor TrC in the case of the capacitor CpC functioning as the source terminal, achieved the same level of magnitude. Note that there are cases too where the above-described angle, that is, an angle of a kind that will result in current of the transistor TrC in the case of the bit line BL functioning as the source terminal having the same level of magnitude as current of the transistor TrC in the case of the capacitor CpC functioning as the source terminal, is not 90°.

Now, as mentioned above, speed of the read operation is stipulated by the smaller of the above-described two types of currents. Hence, there is no need for speed of the read operation to be lowered, even if current of the transistor TrC in the case of the bit line BL functioning as the source terminal decreases to the same level of current as current of the transistor TrC in the case of the capacitor CpC functioning as the source terminal. Hence, the semiconductor memory device according to the first embodiment makes it possible for parasitic capacitance between the conductive layer 104 and conductive layer 112 and parasitic capacitance between the conductive layers 112 to be reduced, without any substantive effect being exerted on current of the transistor TrC.

Second Embodiment

During manufacture of the semiconductor memory device according to the first embodiment, in the step described with reference to FIGS. 26 and 27, parts of the sacrifice layers 120A are selectively removed via the openings 104A, whereby the sacrifice layers 120A are divided in the X direction. This makes it possible to prevent an unintended portion of the sacrifice layer 120A from being removed in the step described with reference to FIG. 36.

Now, as has been described with reference to FIG. 11, and so on, in the semiconductor memory device according to the first embodiment, the side surface of the part 115b of the insulating layer 115 on a positive side in the Y direction is provided more to a positive side in the Y direction than the side surface of the part 115a of the insulating layer 115 on a positive side in the Y direction is. Such a configuration makes it possible for the sacrifice layer 120A to be suitably divided in the step described with reference to FIGS. 26 and 27, even when a range that the sacrifice layer 120A is removed is comparatively small. As a result, it is possible for downsizing of the transistor structure 110 to be achieved.

However, in this kind of configuration, sometimes, in the step described with reference to FIG. 55, the sacrifice layers 112A cannot be suitably removed. Moreover, sometimes, in the step described with reference to FIGS. 56 and 57, the conductive layers 112 and the insulating layers 113 cannot be suitably formed.

In such cases, a position in the Y direction of the side surface of the part 115b of the insulating layer 115 on a positive side in the Y direction may be the same as a position in the Y direction of the side surface of the part 115a of the insulating layer 115 on a positive side in the Y direction. Moreover, the side surface of the part 115b of the insulating layer 115 on a positive side in the Y direction may be provided more to a negative side in the Y direction than the side surface of the part 115a of the insulating layer 115 on a positive side in the Y direction is.

Such a configuration will be exemplified below.

Figure 74:
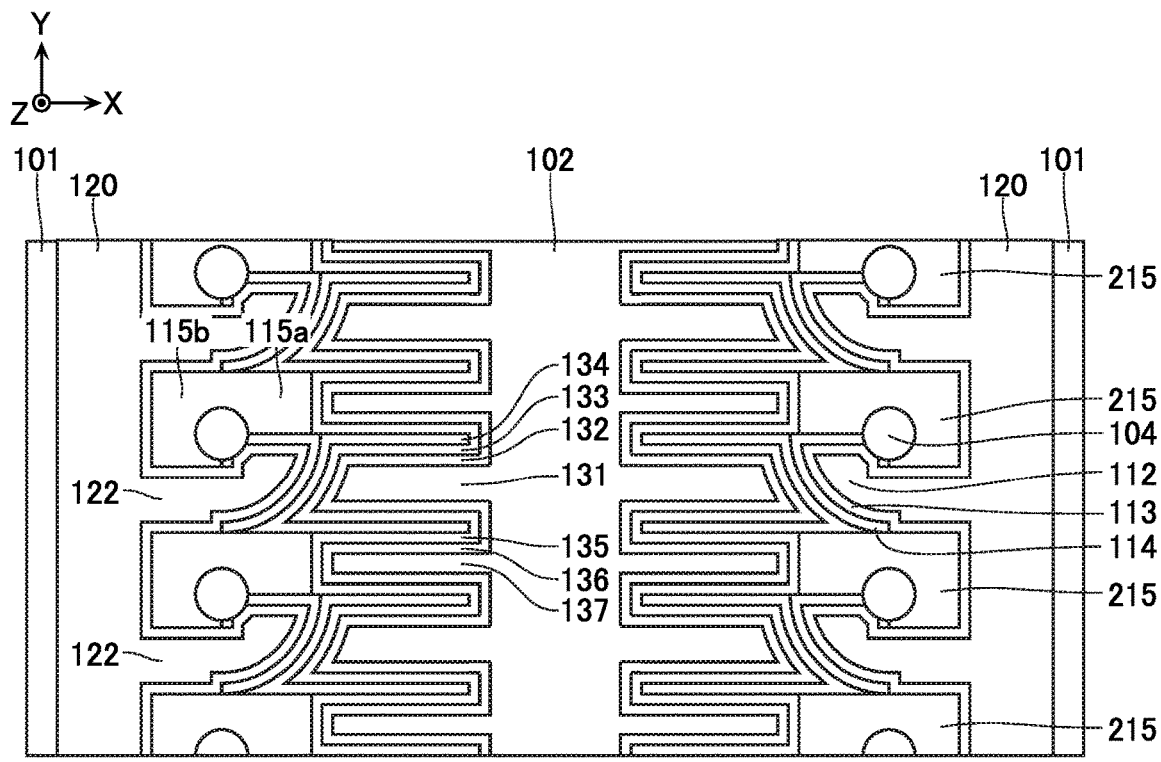
FIG. 74 is a schematic XY cross-sectional view showing some of configurations of a semiconductor memory device according to a second embodiment.

FIG. 74 is a schematic XY cross-sectional view showing some of configurations of a semiconductor memory device according to a second embodiment. In the following description, configurations similar to in the first embodiment will be assigned with the same symbols as in the first embodiment, and descriptions thereof omitted.

The semiconductor memory device according to the second embodiment is basically configured similarly to the semiconductor memory device according to the first embodiment. However, the semiconductor memory device according to the second embodiment comprises an insulating layer 215, instead of the insulating layer 115. The insulating layer 215 is basically configured similarly to the insulating layer 115. However, in the insulating layer 215, the position in the Y direction of the side surface of the part 115b on a positive side in the Y direction is the same as the position in the Y direction of the side surface of the part 115a on a positive side in the Y direction, and the parts 115a, 115b extend continuously in the X direction.

Third Embodiment

During manufacture of the semiconductor memory device according to the first embodiment, in the step described with reference to FIGS. 24 and 25, the openings 104A are formed. Sometimes, the more upwardly a portion of the opening 104A is provided, the larger a diameter of that portion will become, and the more downwardly a portion of the opening 104A is provided, the smaller a diameter of that portion will become.

Moreover, in the step described with reference to FIGS. 26 and 27, parts of the sacrifice layers 120A are selectively removed via the openings 104A, whereby the sacrifice layers 120A are divided in the X direction. In this step, a plurality of the sacrifice layers 120A arranged in the Z direction have their sacrifice layers 120A removed over the same level of range.

Moreover, in the step described with reference to FIGS. 34 and 35, the openings 102A are formed. Sometimes, the more upwardly a portion of the opening 102A is provided, the broader a width of that portion in the X direction will become, and the more downwardly a portion of the opening 102A is provided, the narrower a width of that portion in the X direction will become.

Moreover, in the step described with reference to FIGS. 36 and 37, the sacrifice layers 120A are removed to expose the sacrifice layers 104B.

Figure 75:
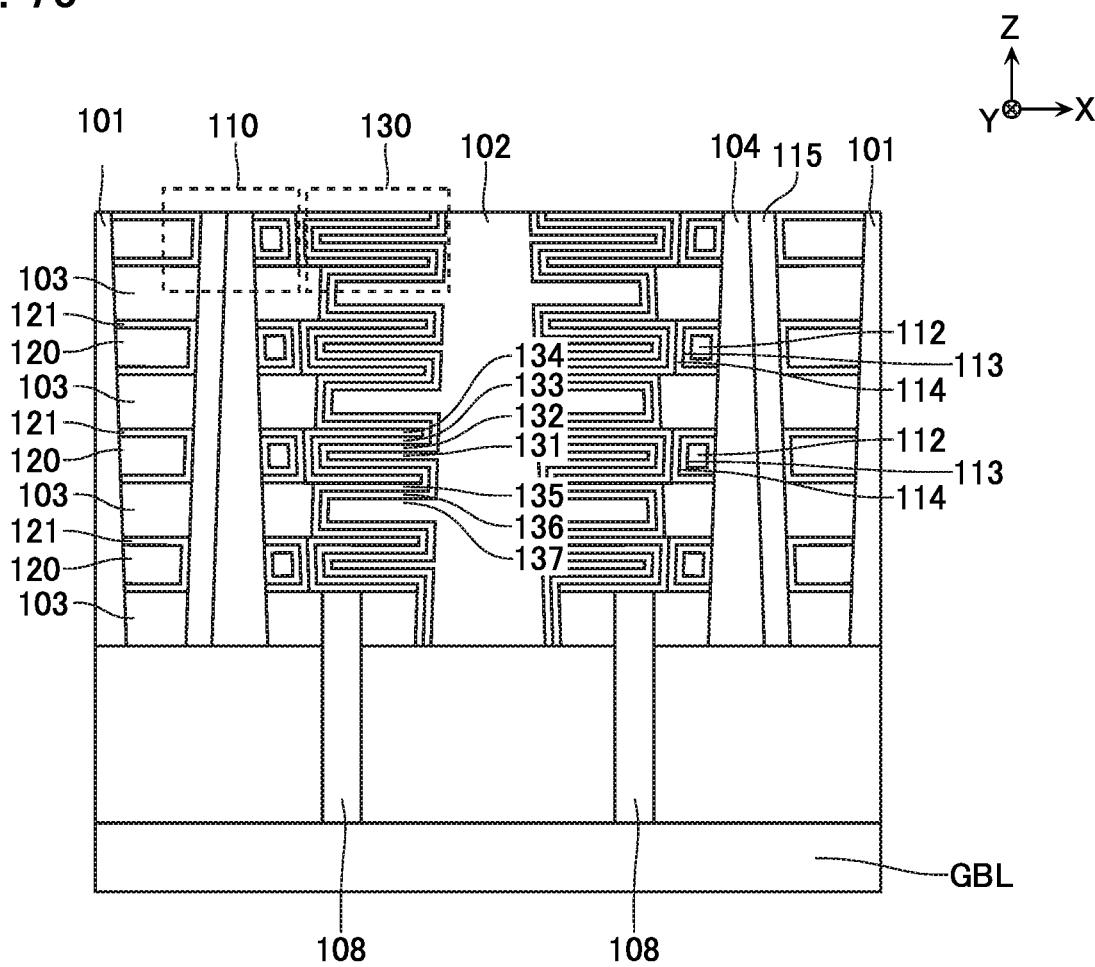
FIG. 75 is a schematic cross-sectional view showing configuration of the semiconductor memory device according to the first embodiment.

Now, as mentioned above, in the semiconductor memory device according to the first embodiment, sometimes, the vertical relationship of configurations in the memory cell array MCA is reversed between the case where the semiconductor substrate Sub shown in FIG. 9, and so on, is taken as reference, and the case where the wafer having the memory cell array MCA formed therein is taken as reference. In such a case, sometimes, in the final structure, as shown in FIG. 75, for example, the more upwardly the capacitor structure 130 is provided, the larger its length in the X direction will become, and the more downwardly the capacitor structure 130 is provided, the smaller its length in the X direction will become. In such a configuration, the more upwardly the capacitor CpC is provided, the larger its electrostatic capacitance will be, and the more downwardly the capacitor CpC is provided, the smaller its electrostatic capacitance will be.

In the case where this kind of variation in electrostatic capacitance of the capacitors CpC is to be suppressed, for example, steps for forming the conductive layer 102 and capacitor structure 130 (the steps described with reference to FIGS. 34 to 45) will conceivably be executed prior to steps for forming the opening 104A, and so on (the steps described with reference to FIGS. 24 to 27). Such a method will be described below.

Figure 83:
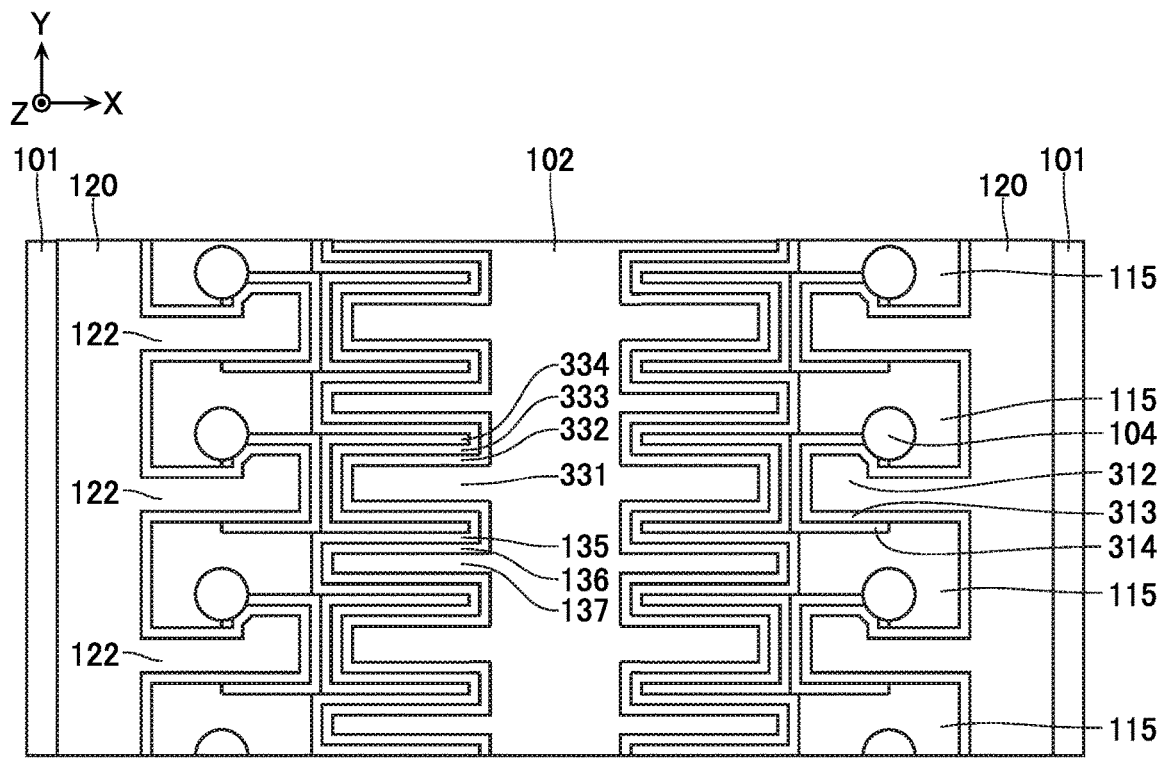
FIG. 83 is a schematic cross-sectional view showing configuration of the semiconductor memory device according to the third embodiment.
Figure 84:
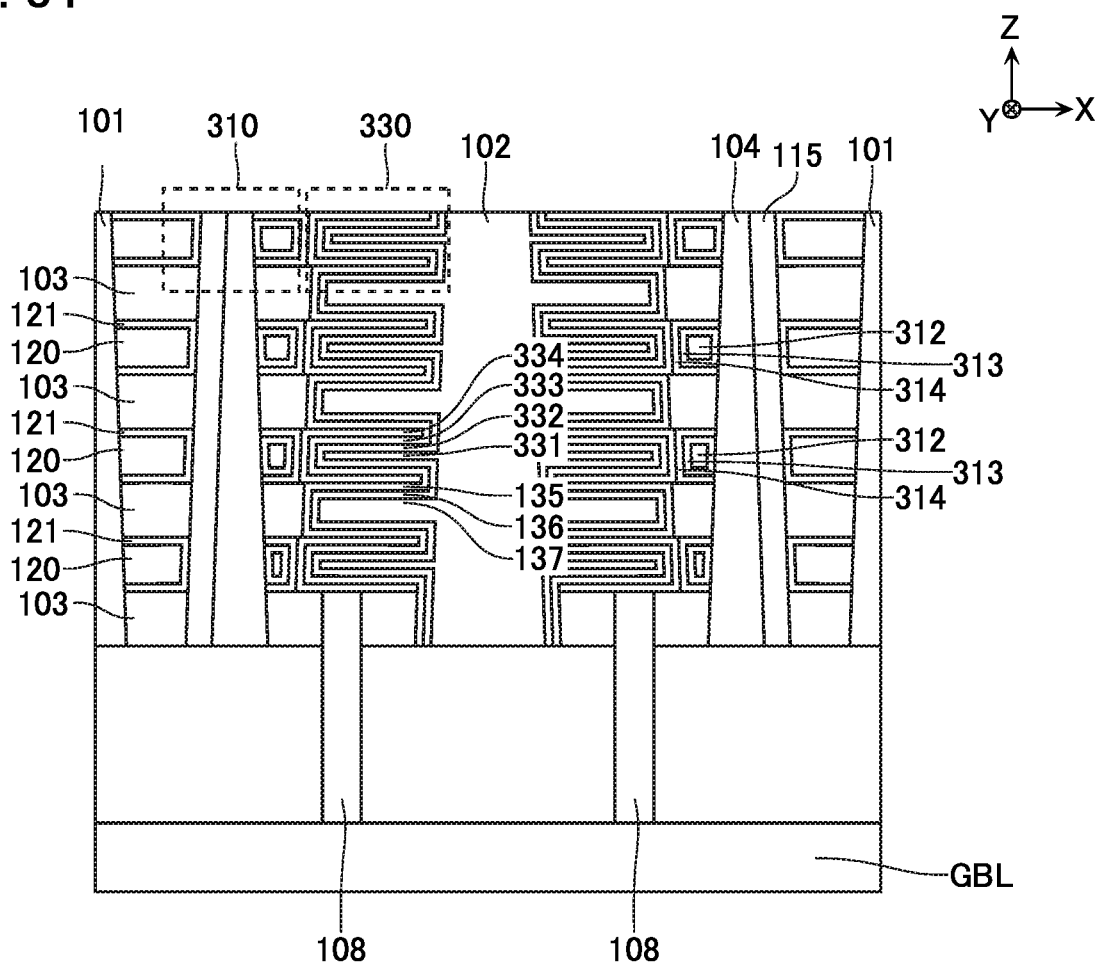
FIG. 84 is a schematic cross-sectional view showing configuration of the semiconductor memory device according to the third embodiment.

FIGS. 76 to 82 are schematic cross-sectional views for explaining a method of manufacturing a semiconductor memory device according to a third embodiment. FIGS. 83 and 84 are schematic cross-sectional views showing configuration of the semiconductor memory device according to the third embodiment.

Figure 76:
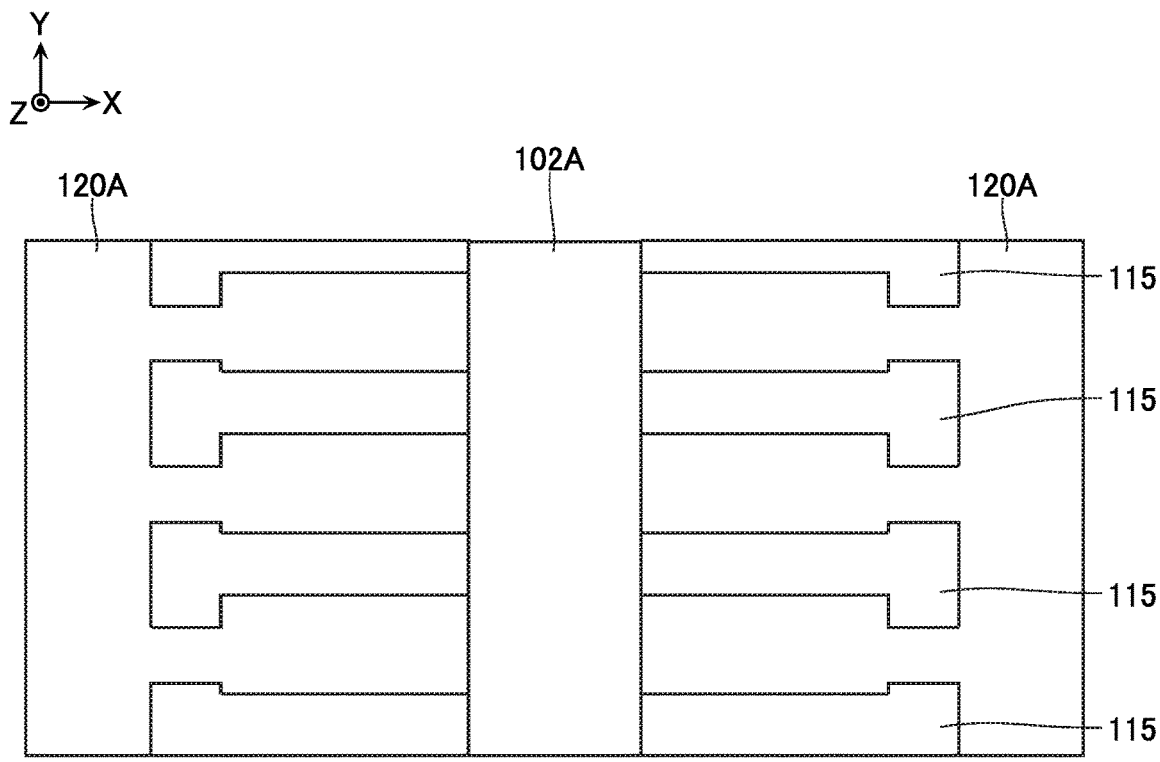
FIG. 76 is a schematic cross-sectional view for explaining a method of manufacturing a semiconductor memory device according to a third embodiment.

For example, as shown in FIG. 76, the step described with reference to FIGS. 34 and 35 is executed prior to formation of the opening 104A.

Figure 77:
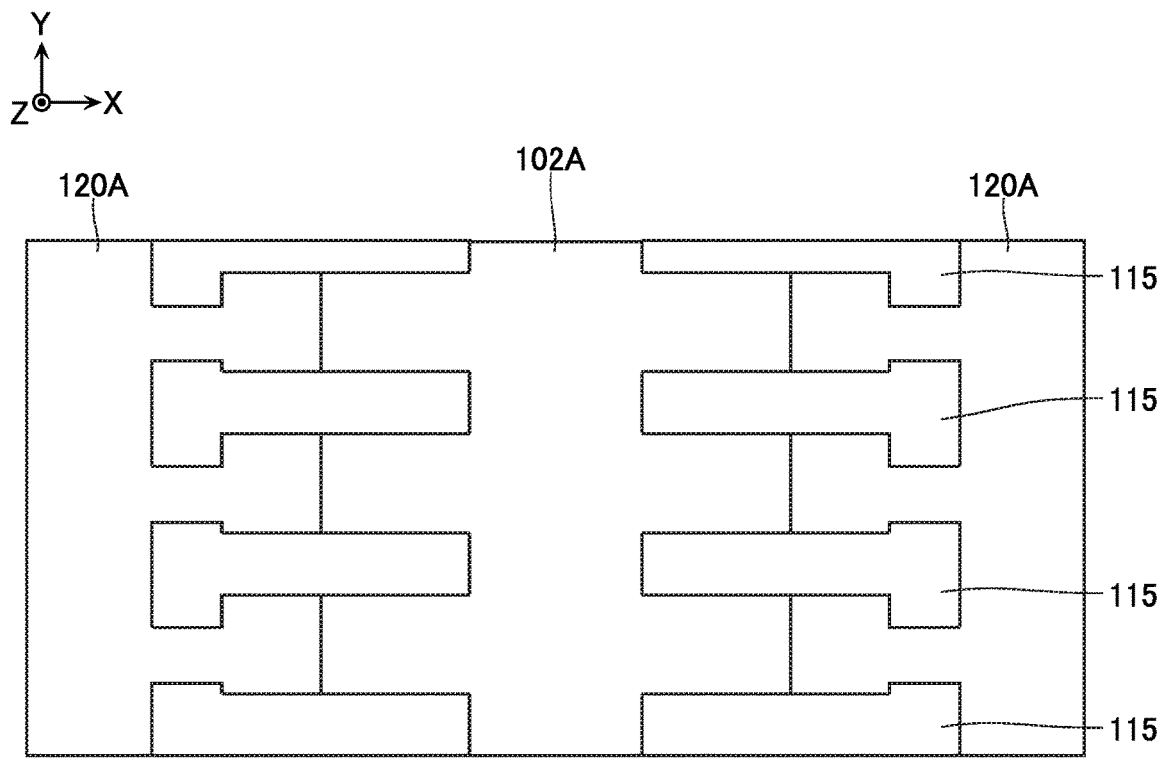
FIG. 77 is a schematic cross-sectional view for explaining same method of manufacturing.

Next, as shown in FIG. 77, the step described with reference to FIGS. 36 and 37 is executed.

Figure 78:
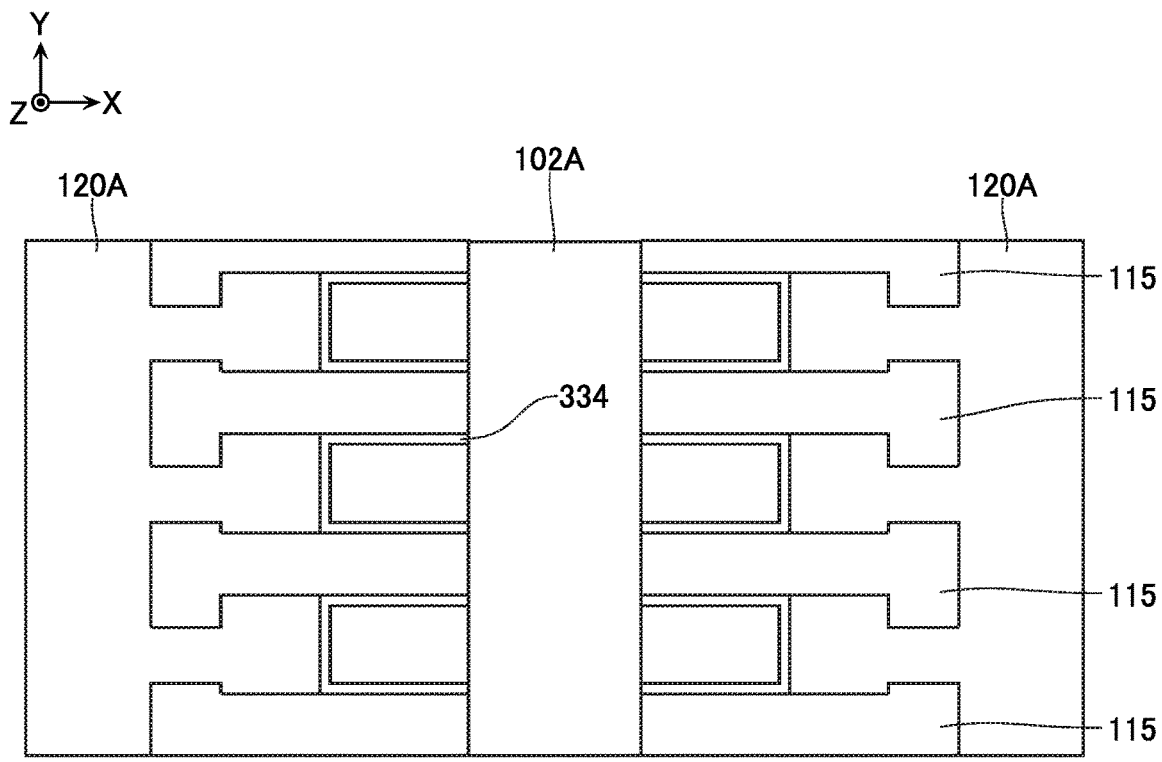
FIG. 78 is a schematic cross-sectional view for explaining same method of manufacturing.

Next, as shown in FIG. 78, the steps described with reference to FIGS. 38 to 41 are executed.

Figure 79:
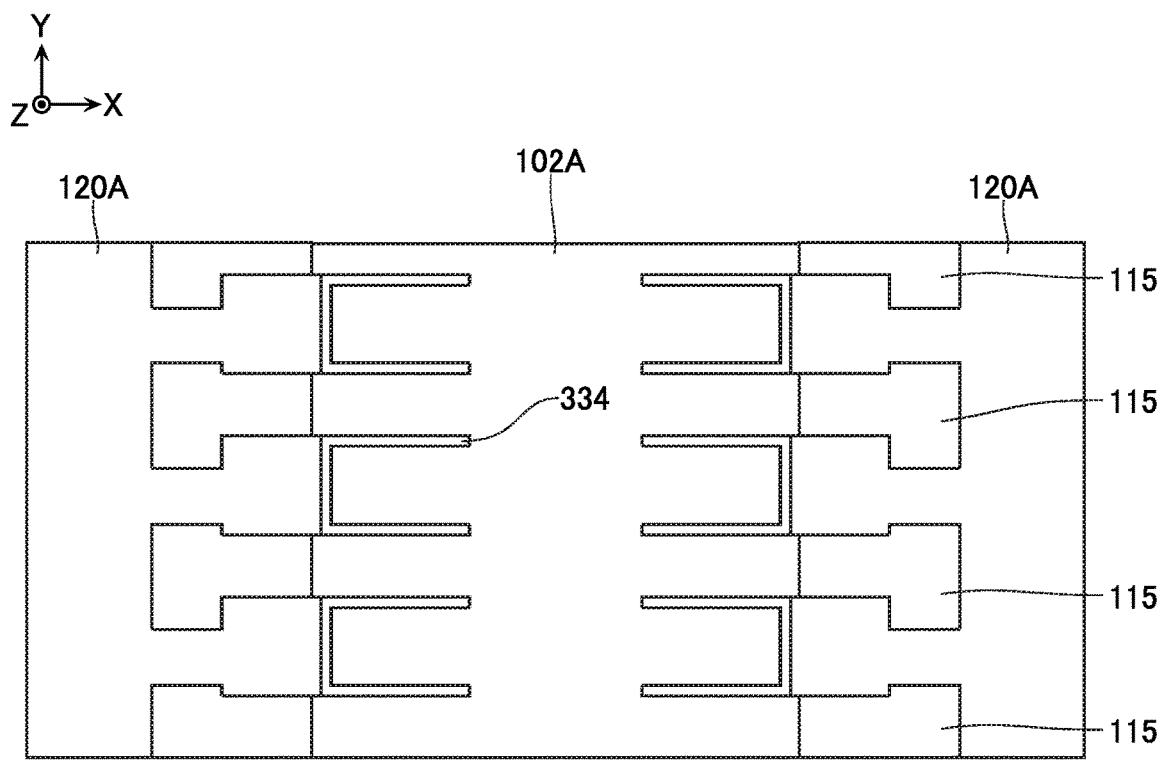
FIG. 79 is a schematic cross-sectional view for explaining same method of manufacturing.

Next, as shown in FIG. 79, the step described with reference to FIGS. 42 and 43 is executed.

Figure 80:
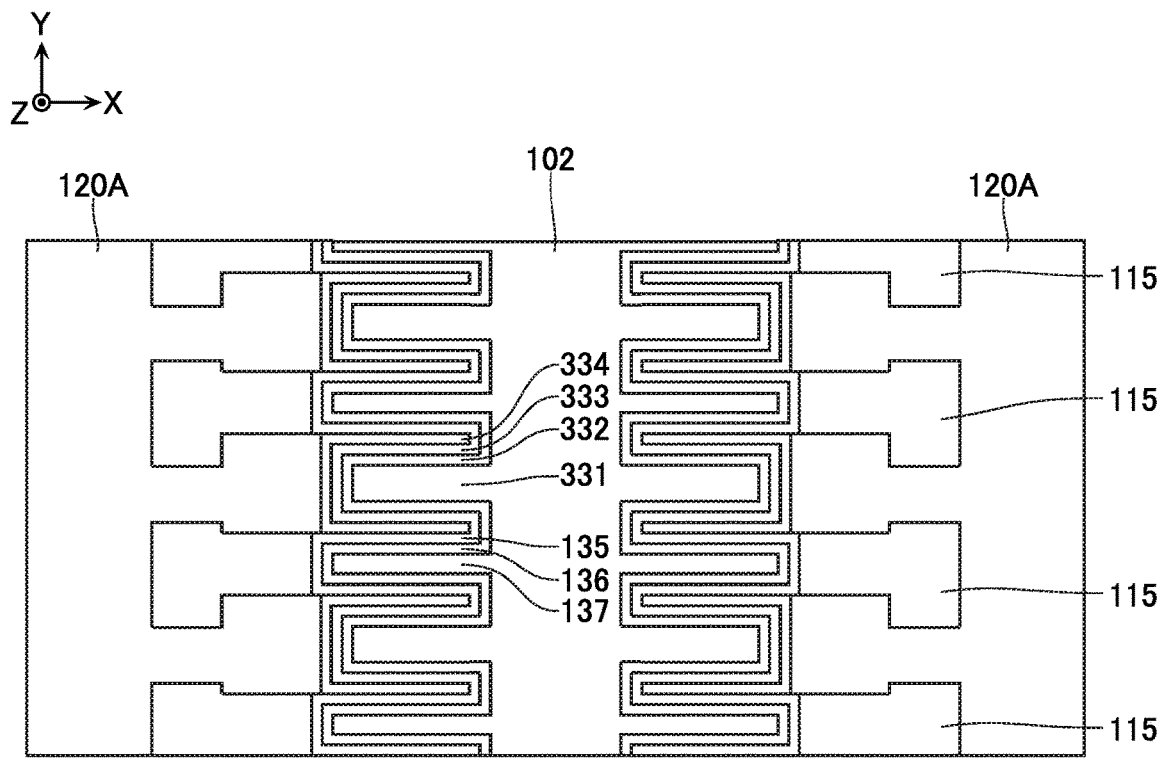
FIG. 80 is a schematic cross-sectional view for explaining same method of manufacturing.

Next, as shown in FIG. 80, the step described with reference to FIGS. 44 and 45 is executed.

Figure 81:
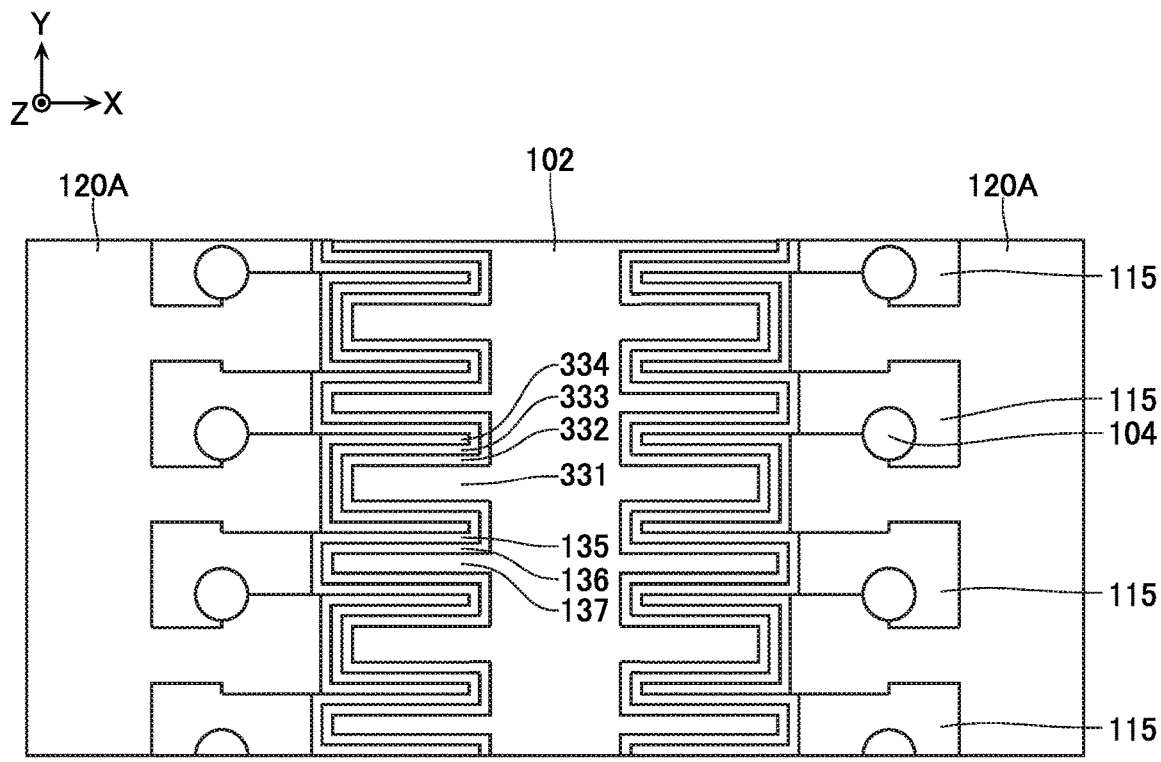
FIG. 81 is a schematic cross-sectional view for explaining same method of manufacturing.

Next, as shown in FIG. 81, the step described with reference to FIGS. 24 and 25 is executed.

Figure 82:
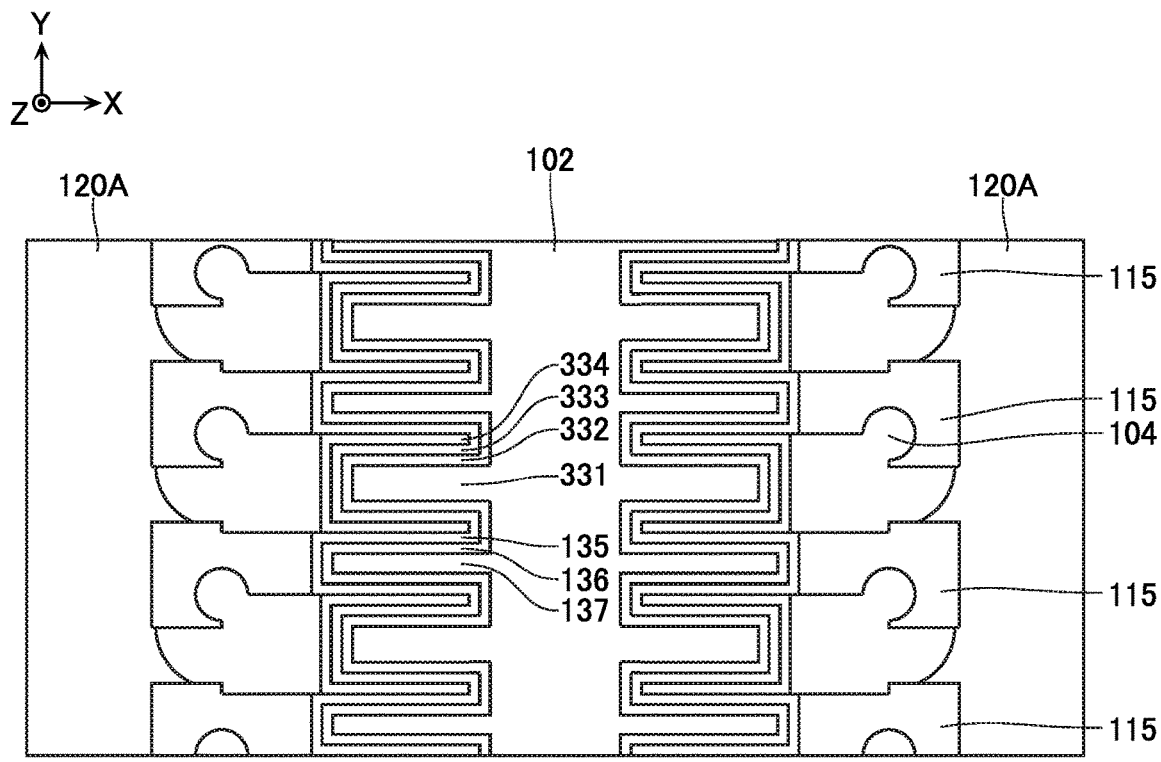
FIG. 82 is a schematic cross-sectional view for explaining same method of manufacturing.

Next, as shown in FIG. 82, the step described with reference to FIGS. 26 and 27 is executed. In this step, side surfaces in the X direction of configurations corresponding to the conductive layers 134 (conductive layers 334) are exposed inside the openings 104A.

Subsequently, the steps described with reference to FIGS. 47 to 58 are executed, whereby a structure of the kind shown in FIG. 83 is formed.

When the semiconductor memory device is manufactured by this kind of method, in the step described with reference to FIG. 77, the plurality of sacrifice layers 120A arranged in the Z direction have their sacrifice layer 120A removed over the same level of range. This makes it possible for the above-mentioned kind of variation in electrostatic capacitance of the capacitors CpC to be suppressed.

Note that when the semiconductor memory device is manufactured by this kind of method, in the step described with reference to FIG. 82, the side surfaces of the conductive layers 334 in the X direction are exposed inside the openings 104A. In such a case, sometimes, as shown in FIG. 84, in the final structure, the more upwardly the transistor TrC corresponding to the transistor structure 110 is provided, the larger its channel length will become, and the more downwardly the transistor TrC corresponding to the transistor structure 110 is provided, the smaller its channel length will become.

Note that the semiconductor memory device according to the third embodiment is basically configured similarly to the semiconductor memory device according to the first embodiment.

However, a transistor structure 310 according to the third embodiment comprises a conductive layer 312, an insulating layer 313, and a semiconductor layer 314, instead of the conductive layer 112, the insulating layer 113, and the semiconductor layer 114. The conductive layer 312, insulating layer 313, and semiconductor layer 314 are basically configured similarly to the conductive layer 112, insulating layer 113, and semiconductor layer 114. However, as has been described with reference to FIGS. 11 and 12, a surface in contact with or surface facing the conductive layer 134, of the conductive layer 112, insulating layer 113, and semiconductor layer 114 comprises a curved side surface formed along the circle c1. On the other hand, as shown in FIG. 83, a surface in contact with or surface facing the conductive layer 334, of the conductive layer 312, insulating layer 313, and semiconductor layer 314 extends in the Y direction.

Moreover, a capacitor structure 330 according to the third embodiment comprises conductive layers 331, 332, an insulating layer 333, and the conductive layer 334, instead of the conductive layers 131, 132, the insulating layer 133, and the conductive layer 134. The conductive layers 331, 332, insulating layer 333, and conductive layer 334 are basically configured similarly to the conductive layers 131, 132, insulating layer 133, and conductive layer 134. However, as has been described with reference to FIGS. 11 and 12, a surface in contact with or surface facing the semiconductor layer 114, of the conductive layers 131, 132, insulating layer 133, and conductive layer 134 comprises a curved side surface formed along the circle c1. On the other hand, as shown in FIG. 83, a surface in contact with or surface facing the semiconductor layer 314, of the conductive layers 331, 332, insulating layer 333, and conductive layer 334 extends in the Y direction.

Note that the semiconductor memory device according to the third embodiment may comprise the insulating layer 215 (FIG. 74), instead of the insulating layer 115, similarly to the semiconductor memory device according to the second embodiment. This may make it possible for the sacrifice layer 112A to be suitably removed in the step described with reference to FIG. 55, and for the conductive layer 112 and insulating layer 113 to be suitably formed in the step described with reference to FIGS. 56 and 57.

Fourth Embodiment

The transistor structure 140 according to the first embodiment comprises the insulating layer 141, the conductive layer 142, the insulating layer 143, and the semiconductor layer 144 that surround the outer peripheral surface of the conductive layer 106 over its entire periphery, as shown in FIG. 12, for example. However, configurations in the transistor structure 140, too, similarly to configurations in the transistor structure 110, may be in contact with only a part of the outer peripheral surface of the conductive layer 106 in an XY cross section, or face only a part of the outer peripheral surface of the conductive layer 106 in an XY cross section.

Such a configuration will be exemplified below.

Figure 85:
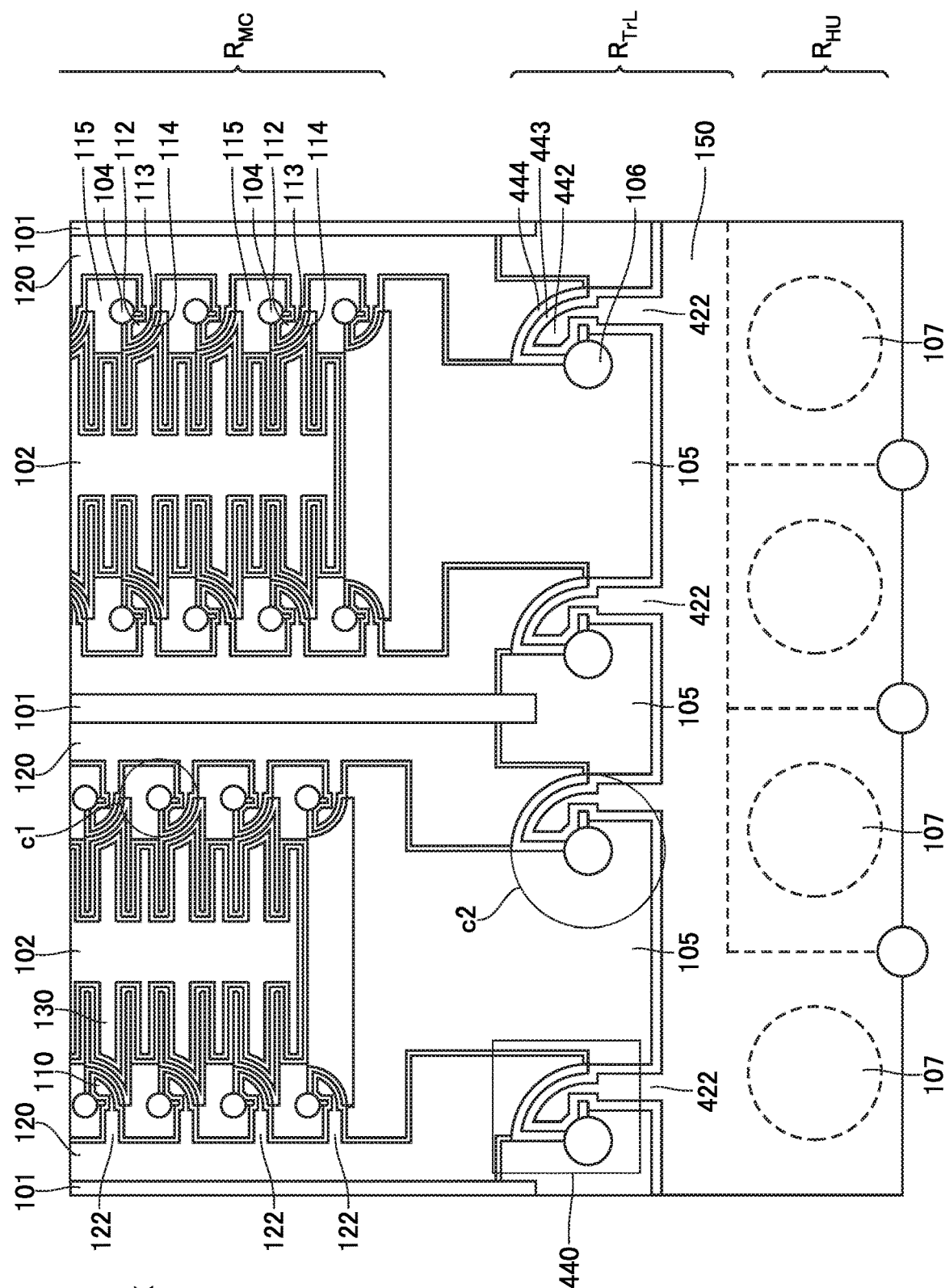
FIG. 85 is a schematic XY cross-sectional view showing some of configurations of a semiconductor memory device according to a fourth embodiment.

FIG. 85 is a schematic XY cross-sectional view showing some of configurations of a semiconductor memory device according to a fourth embodiment. In the following description, configurations similar to in the first embodiment will be assigned with the same symbols as in the first embodiment, and descriptions thereof omitted.

The semiconductor memory device according to the fourth embodiment is basically configured similarly to the semiconductor memory device according to the first embodiment. However, the semiconductor memory device according to the fourth embodiment comprises a transistor structure 440, instead of the transistor structure 140.

The transistor structure 440 comprises: a conductive layer 442; an insulating layer 443 provided on an upper surface, a lower surface, and side surfaces of the conductive layer 442; and a semiconductor layer 444 provided on an upper surface, a lower surface, and side surfaces of the insulating layer 443. The conductive layer 442, insulating layer 443, and semiconductor layer 444 comprise a substantially circular-sector shape that comprises: an arc-like side surface extending along the outer peripheral surface of the conductive layer 106; a side surface in the X direction extending in the Y direction along a boundary in the X direction with the insulating layer 105; and an arc-like side surface extending along a circle c2.

The conductive layer 442 functions as the gate electrode of the transistor TrL (FIG. 1), for example. The conductive layer 442 includes the likes of a laminated structure of titanium nitride (TiN) and tungsten (W), for example. In the cross section shown in FIG. 85, the outer peripheral surface of the conductive layer 106 includes a portion in contact with the transistor structure 440 and at least a part of this portion faces the conductive layer 442, while the other portion of the outer peripheral surface of the conductive layer 106 does not face the conductive layer 442. A plurality of the conductive layers 442 arranged in the X direction are respectively continuous with conductive layers 422 extending in the Y direction, and, via the conductive layers 422, are continuous with the conductive layer 150 extending in the X direction.

The insulating layer 443 functions as a gate insulating film of the transistor TrL (FIG. 1), for example. The insulating layer 443 includes the likes of silicon oxide ($SiO_2$), for example. In the cross section shown in FIG. 85, the outer peripheral surface of the conductive layer 106 includes a portion in contact with the transistor structure 440 and this portion is in contact with the insulating layer 443 or the semiconductor layer 444, and the other portion is in contact with the insulating layer 105.

The semiconductor layer 444 functions as a channel region of the transistor TrL (FIG. 1), for example. The semiconductor layer 444 may be, for example, a semiconductor including: indium (In); zinc (Zn); oxygen (O); and at least one of gallium (Ga) or aluminum (Al), or may be, for example, another oxide semiconductor. Although illustration is omitted, in a cross section of a height position corresponding to FIG. 11, the outer peripheral surface of the conductive layer 106 includes a portion in contact with the transistor structure 440 and this portion is in contact with the semiconductor layer 444, and the other portion is in contact with the insulating layer 105. A plurality of the semiconductor layers 444 arranged in the Z direction are commonly connected to the conductive layer 106 extending in the Z direction.

Other Embodiments

That concludes description of the semiconductor memory devices according to the first through fourth embodiments. However, the semiconductor memory devices according to these embodiments are merely exemplifications, and their specific configurations, operation, and so on, may be appropriately adjusted.

For example, in the semiconductor memory devices according to the first through fourth embodiments, the global bit line GBL was provided below the memory layers ML0-ML2. However, such a configuration is merely an exemplification, and specific configuration may be appropriately adjusted. For example, the global bit line GBL may be provided above the memory layers ML0-ML2.

Moreover, the semiconductor memory devices according to the first through fourth embodiments are assumed to be structured so as to be formed by having their memory cell array MCA and their peripheral circuit, such as, sense amplifier unit SAU, which is connected to the memory cell array MCA, manufactured on separate wafers, and by having these wafers bonded. However, it is possible too for the semiconductor memory devices according to the first through fourth embodiments to be manufactured on a single wafer.

Moreover, in the semiconductor memory devices according to the first through fourth embodiments, the conductive layer 104 functioning as the bit line includes a conductive oxide such as indium tin oxide (ITO). However, such a conductive oxide may be included in the transistor structure 110, not in the conductive layer 104 extending in the Z direction. Moreover, the conductive layer 104 and transistor structure 110 may include another material, and so on.

Moreover, in the semiconductor memory devices according to the first through fourth embodiments, the semiconductor layers 114 functioning as the channel regions of the transistors TrC, TrB and the semiconductor layers 144 functioning as the channel regions of the transistors TrL, TrT face each of the upper surface and the lower surface of the gate electrodes of these transistors. However, the semiconductor layers 114, 144 are not limited to this configuration, and may be provided facing either the upper surfaces or a lower surfaces of the gate electrode of these transistors.

Moreover, in the above description, there was described an example where the capacitor CpC is adopted as the memory portion connected to the transistor structure 110. However, the memory portion need not be the capacitor CpC. For example, the memory portion may be one that includes a ferroelectric material, ferromagnetic material, chalcogen material of the likes of GeSbTe, or other material, and that utilizes characteristics of these materials to store data. For example, any of these materials may be included in an insulating layer between the electrodes forming the capacitor CpC, in any of the structures described above.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate;
    a plurality of memory layers arranged in a first direction, the first direction intersecting a surface of the substrate; and
    a first wiring extending in the first direction,
    the plurality of memory layers each comprising:
    a memory portion;
    a first transistor which is electrically connected to the memory portion and the first wiring; and
    a second wiring which extends in a second direction intersecting the first direction, and is electrically connected to the first transistor,
    the first transistor comprising:
    a first semiconductor layer which is electrically connected between the memory portion and the first wiring;
    a first gate electrode which faces the first semiconductor layer and is electrically connected to the second wiring; and
    a first gate insulating film which is provided between the first semiconductor layer and the first gate electrode,
    the first semiconductor layer facing surfaces of the first gate electrode on one side and the other side in the first direction, and
    in a cross section which is perpendicular to the first direction and which includes a part of the first transistor corresponding to one of the plurality of memory layers, the first wiring comprising: a first surface which is in contact with the first transistor; and a second surface which is not in contact with the first transistor.

2. The semiconductor memory device according to claim 1, wherein
    in a first cross section which is perpendicular to the first direction and which includes the first gate electrode and the first gate insulating film corresponding to one of the plurality of memory layers,
    the first surface is in contact with the first gate insulating film, and
    the second surface is not in contact with the first gate insulating film.

3. The semiconductor memory device according to claim 1, wherein
    in a second cross section which is perpendicular to the first direction and which includes a part of a portion of the first semiconductor layer corresponding to one of the plurality of memory layers, the portion facing a surface of the first gate electrode on one side or the other side in the first direction,
    the first surface is in contact with the first semiconductor layer, and
    the second surface is not in contact with the first semiconductor layer.

4. The semiconductor memory device according to claim 1, wherein
    the first semiconductor layer comprises:
    a first portion which faces a surface of the first gate electrode on one side in the first direction;

a second portion which faces a surface of the first gate electrode on the other side in the first direction; and
a third portion which is provided between the first portion and the second portion, and is continuous with the first portion and the second portion,
a contact portion with the first wiring of the first portion and a contact portion with the first wiring of the second portion are separated in the first direction, and
a contact portion with the memory portion of the first portion and a contact portion with the memory portion of the second portion are continuous via the third portion.

5. The semiconductor memory device according to claim 1, wherein
the first gate electrode faces the first surface of the first wiring via the first gate insulating film.

6. The semiconductor memory device according to claim 1, wherein
in the cross section, a surface of the first semiconductor layer on a memory portion side is a curved surface along with a circle centered on a center point of the first wiring.

7. The semiconductor memory device according to claim 1, wherein
in the cross section, a surface of the first semiconductor layer on a memory portion side extends in the second direction.

8. The semiconductor memory device according to claim 1, comprising
a first insulating layer extending in the first direction, wherein
in the cross section, the second surface is in contact with the first insulating layer.

9. The semiconductor memory device according to claim 1, comprising:
a first insulating layer which extends in the first direction and is in contact with the first wiring; and
a second insulating layer which extends in the first direction and is adjacent in the second direction to the first insulating layer, wherein
the plurality of memory layers each comprise a first conductive layer which extends in a third direction intersecting the first direction and the second direction, and is connected to the first gate electrode and the second wiring, and
the first transistor and the first conductive layer are provided between the first insulating layer and the second insulating layer.

10. The semiconductor memory device according to claim 9, wherein
in the cross section, a surface of the second insulating layer on a first insulating layer side comprises:
a third surface which is arranged in the second direction with the first semiconductor layer, and extends in the third direction; and
a fourth surface which is arranged in the second direction with the first conductive layer, and extends in the third direction, and
the fourth surface is provided closer to the first insulating layer side than the third surface is.

11. The semiconductor memory device according to claim 9, wherein
in the cross section, a surface of the second insulating layer on a first insulating layer side comprises:
a third surface which is arranged in the second direction with the first semiconductor layer, and extends in the third direction; and
a fourth surface which is arranged in the second direction with the first conductive layer, and extends in the third direction, and
the fourth surface is continuous with the third surface.

12. The semiconductor memory device according to claim 1, comprising:
a third wiring which extends in a third direction intersecting the first direction and the second direction, and is electrically connected to the first wiring; and
a second transistor which is electrically connected to the third wiring and the first wiring,
wherein the second transistor comprises:
a second semiconductor layer which is electrically connected between the third wiring and the first wiring;
a second gate electrode which faces the second semiconductor layer; and
a second gate insulating film which is provided between the second semiconductor layer and the second gate electrode,
the second semiconductor layer faces at least one of surfaces of the second gate electrode on one side or the other side in the first direction, and
in a cross section which is perpendicular to the first direction and which includes a part of the second transistor, the first wiring comprises: a fifth surface which is in contact with the second transistor; and a sixth surface which is not in contact with the second transistor.

13. The semiconductor memory device according to claim 12, wherein
in a third cross section which is perpendicular to the first direction and which includes the second gate electrode and the second gate insulating film,
the fifth surface is in contact with the second gate insulating film, and
the sixth surface is not in contact with the second gate insulating film.

14. The semiconductor memory device according to claim 12, wherein
in a fourth cross section which is perpendicular to the first direction and which includes a part of a portion of the second semiconductor layer, the portion facing a surface of the second gate electrode on one side or the other side in the first direction,
the fifth surface is in contact with the second semiconductor layer, and
the sixth surface is not in contact with the second semiconductor layer.

15. The semiconductor memory device according to claim 1, comprising
a fourth wiring extending in the first direction, wherein
the plurality of memory layers each comprise a third transistor which is electrically connected to the second wiring and the fourth wiring,
the third transistor comprises:
a third semiconductor layer which is electrically connected between the second wiring and the fourth wiring;
a third gate electrode which faces the third semiconductor layer; and
a third gate insulating film which is provided between the third semiconductor layer and the third gate electrode,
the third semiconductor layer faces at least one of surfaces of the third gate electrode on one side or the other side in the first direction, and
in a cross section which is perpendicular to the first direction and which includes a part of the third transistor, the fourth wiring comprises: a seventh surface which is in contact with the third transistor; and an eighth surface which is not in contact with the third transistor.

16. The semiconductor memory device according to claim 15, wherein
in a fifth cross section which is perpendicular to the first direction and which includes the third gate electrode and the third gate insulating film corresponding to one of the plurality of memory layers,
the seventh surface is in contact with the third gate insulating film, and
the eighth surface is not in contact with the third gate insulating film.

17. The semiconductor memory device according to claim 15, wherein
in a sixth cross section which is perpendicular to the first direction and which includes a part of a portion of the third semiconductor layer corresponding to one of the plurality of memory layers, the portion facing a surface of the third gate electrode on one side or the other side in the first direction,
the seventh surface is in contact with the third semiconductor layer, and
the eighth surface is not in contact with the third semiconductor layer.

18. The semiconductor memory device according to claim 1, wherein
the memory portion is a capacitor.

19. The semiconductor memory device according to claim 1, wherein
the first semiconductor layer includes an oxide semiconductor.

20. The semiconductor memory device according to claim 1, wherein
the first semiconductor layer includes: indium (In); zinc (Zn); oxygen (O); and at least one of gallium (Ga) or aluminum (Al).

21. A semiconductor memory device comprising:
a substrate;
a plurality of memory layers arranged in a first direction, the first direction intersecting a surface of the substrate; and
a first wiring extending in the first direction,
the plurality of memory layers each comprising:
a memory portion;
a first transistor which is electrically connected to the memory portion and the first wiring; and
a second wiring which extends in a second direction intersecting the first direction, and is electrically connected to the first transistor,
the first transistor comprising:
a first semiconductor layer which is electrically connected between the memory portion and the first wiring;
a first gate electrode which faces the first semiconductor layer and is electrically connected to the second wiring; and
a first gate insulating film which is provided between the first semiconductor layer and the first gate electrode,
the first semiconductor layer facing at least one of surfaces of the first gate electrode on one side or the other side in the first direction, a contact area of the first semiconductor layer with the memory portion is larger than a contact area of the first semiconductor layer with an outer peripheral surface of the first wiring, and
in a cross section which is perpendicular to the first direction and which includes a part of the first transistor corresponding to one of the plurality of memory layers, the first wiring comprising: a first surface which is in contact with the first transistor; and a second surface which is not in contact with the first transistor.

22. The semiconductor memory device according to claim 21, wherein
in a first cross section which is perpendicular to the first direction and which includes the first gate electrode and the first gate insulating film corresponding to one of the plurality of memory layers,
the first surface is in contact with the first gate insulating film, and
the second surface is not in contact with the first gate insulating film.

23. The semiconductor memory device according to claim 21, wherein
in a second cross section which is perpendicular to the first direction and which includes a part of a portion of the first semiconductor layer corresponding to one of the plurality of memory layers, the portion facing a surface of the first gate electrode on one side or the other side in the first direction,
the first surface is in contact with the first semiconductor layer, and
the second surface is not in contact with the first semiconductor layer.

24. The semiconductor memory device according to claim 21, wherein
the first semiconductor layer comprises:
a first portion which faces a surface of the first gate electrode on one side in the first direction;
a second portion which faces a surface of the first gate electrode on the other side in the first direction; and
a third portion which is provided between the first portion and the second portion, and is continuous with the first portion and the second portion,
a contact portion with the first wiring of the first portion and a contact portion with the first wiring of the second portion are separated in the first direction, and
a contact portion with the memory portion of the first portion and a contact portion with the memory portion of the second portion are continuous via the third portion.

25. The semiconductor memory device according to claim 21, wherein
the first gate electrode faces the first surface of the first wiring via the first gate insulating film.

26. The semiconductor memory device according to claim 21, wherein
in the cross section, a surface of the first semiconductor layer on a memory portion side is a curved surface along with a circle centered on a center point of the first wiring.

27. The semiconductor memory device according to claim 21, wherein
in the cross section, a surface of the first semiconductor layer on a memory portion side extends in the second direction.

* * * * *